US009269707B2

(12) United States Patent
Taya et al.

(10) Patent No.: US 9,269,707 B2
(45) Date of Patent: Feb. 23, 2016

(54) SEMICONDUCTOR INTEGRATED CIRCUIT DEVICE

(71) Applicant: Synaptics Display Devices GK, Tokyo (JP)

(72) Inventors: Masatoshi Taya, Tokyo (JP); Kunihiko Kato, Tokyo (JP)

(73) Assignee: Synaptics Display Devices GK, Tokyo (JP)

( * ) Notice: Subject to any disclaimer, the term of this patent is extended or adjusted under 35 U.S.C. 154(b) by 0 days.

(21) Appl. No.: 14/560,869

(22) Filed: Dec. 4, 2014

(65) Prior Publication Data

US 2015/0162323 A1    Jun. 11, 2015

(30) Foreign Application Priority Data

Dec. 10, 2013    (JP) ................................. 2013-254868

(51) Int. Cl.
| | |
|---|---|
| *H01L 27/12* | (2006.01) |
| *H01L 27/01* | (2006.01) |
| *H01L 27/06* | (2006.01) |
| *H01L 29/16* | (2006.01) |
| *H01L 29/94* | (2006.01) |

(52) U.S. Cl.
CPC ............ *H01L 27/0629* (2013.01); *H01L 29/16* (2013.01); *H01L 29/94* (2013.01)

(58) Field of Classification Search
CPC ................................. H01L 27/12; H01L 27/01
USPC .......................................................... 257/296
See application file for complete search history.

(56) References Cited

U.S. PATENT DOCUMENTS

| | | | |
|---|---|---|---|
| 6,999,296 B2 | 2/2006 | Kurosawa et al. | |
| 7,211,875 B2 | 5/2007 | Kurosawa et al. | |
| 8,067,807 B2 | 11/2011 | Taya | |
| 2003/0022434 A1* | 1/2003 | Taniguchi et al. | ............ 438/240 |
| 2007/0262382 A1* | 11/2007 | Ishii et al. | .................... 257/350 |
| 2009/0080257 A1* | 3/2009 | Oka et al. | ................ 365/185.13 |
| 2012/0037965 A1 | 2/2012 | Terada et al. | |

FOREIGN PATENT DOCUMENTS

| | | | |
|---|---|---|---|
| JP | 2005210005 A | 8/2005 | |
| JP | 2008283090 A | 11/2008 | |

* cited by examiner

*Primary Examiner* — Marc Armand
(74) *Attorney, Agent, or Firm* — Patterson + Sheridan, LLP

(57) ABSTRACT

In IC chips for display device driving, an operational amplifier is widely used in input and output circuits, and a capacitor in a medium withstanding voltage chip is used as a compensation capacitor. As for this product area, cost competitiveness is very important. Therefore, a MIS capacitor with good area efficiency is widely used. However, unlike a so-called varactor widely used in a VCO circuit, a characteristic of as small a voltage dependence of the capacitor as possible is used. Therefore, an additional process is added to reduce the voltage dependence of the capacitor, but there is a problem of an increase in process cost. A semiconductor substrate side capacitor electrode in a MIS capacitor within a first conduction type medium withstanding voltage chip used in an I/O circuit or the like on a semiconductor integrated circuit device is formed in a first conduction type low withstanding voltage well region.

20 Claims, 32 Drawing Sheets

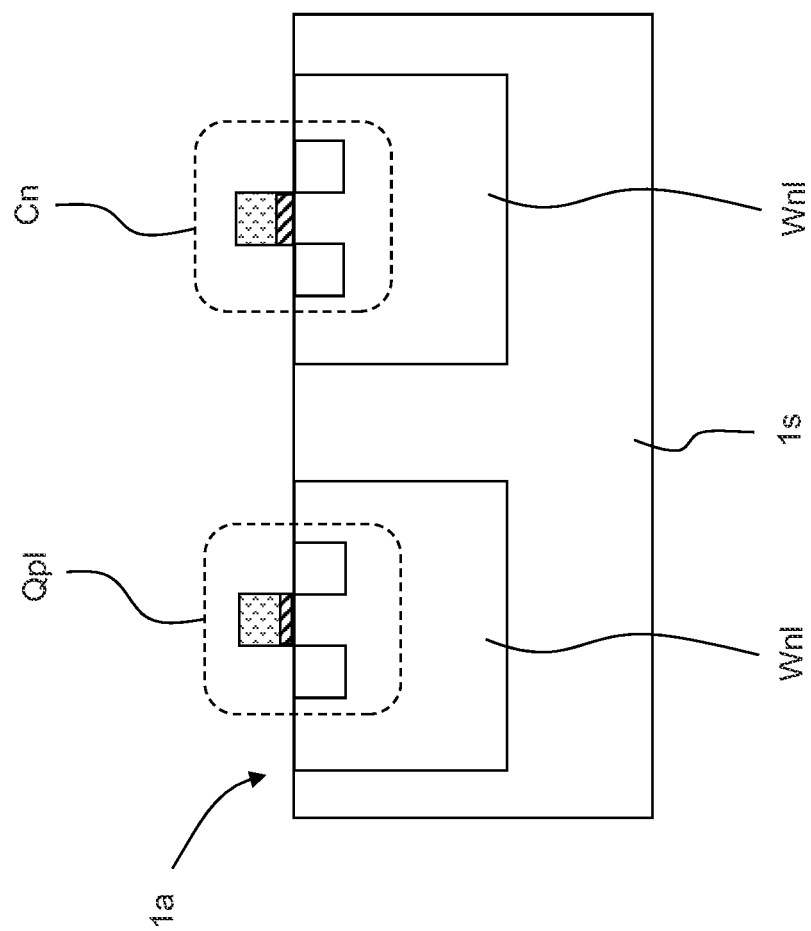

SEMICONDUCTOR INTEGRATED CIRCUIT DEVICE

CROSS-REFERENCE TO RELATED APPLICATIONS

The present application claims priority from Japanese application JP 2013-254868 filed on Dec. 10, 2013, the contents of which are hereby incorporated by reference into this application.

BACKGROUND

This application relates to a device structure of a semiconductor integrated circuit device (or a semiconductor device) and a method of manufacturing a semiconductor integrated circuit device (or a semiconductor device). For example, this application relates to a device structure of a semiconductor integrated circuit device (or a semiconductor device) and a method of manufacturing a semiconductor integrated circuit device (or a semiconductor device) that can be applied to a device in which a complementary metal insulator semiconductor field effect transistor (MISFET) is integrated.

JP-A-2010-62182 or U.S. Pat. No. 8,067,807 corresponding thereto relates to a liquid crystal display (LCD) driver integrated circuit device (IC). JP-A-2010-62182 or U.S. Pat. No. 8,067,807 corresponding thereto discloses an LCD driver chip which has an impurity doped region structure having well regions of various depths including a P-type well region and an N-type well region and in which a low withstanding voltage metal oxide semiconductor field effect transistor (MOSFET) and a high withstanding voltage MOSFET are mixed.

JP-A-2005-210005 relates to a varactor having a large variable capacitance range. JP-A-2005-210005 discloses a technique of providing a P-type counter doped layer under a gate electrode (opposite capacitor electrode) on the surface of an N well.

JP-A-2004-235577 or U.S. Pat. No. 6,999,296 corresponding thereto relates to a varactor (voltage-controlled variable capacitor element). JP-A-2004-235577 or U.S. Pat. No. 6,999,296 corresponding thereto discloses a varactor element having an N well on the surface of a P-type semiconductor substrate and a polysilicon gate electrode as a capacitor electrode.

JP-A-2004-311752 or U.S. Pat. No. 7,211,875 corresponding thereto relates to a voltage-controlled capacitor element with excellent ability to follow a capacitance change according to a change in the voltage between terminals. JP-A-2004-311752 or U.S. Pat. No. 7,211,875 corresponding thereto discloses a device structure in which, in a voltage-controlled capacitor element having an N well and a gate electrode as two electrodes, $P^+$-type impurity doped regions are provided on the surface of the N well on both sides of the gate electrode and these are connected to the ground potential.

JP-A-2008-283090 relates to an LCD driver chip having resistive elements disposed in an array. JP-A-2008-283090 discloses an impurity doped region structure having well regions of various depths including a P-type well region and an N-type well region.

JP-A-2009-21546 or U.S. Patent Application Publication No. 2012-37965 corresponding thereto relates to an LCD driver chip having a high withstanding voltage MISFET. JP-A-2009-21546 or U.S. Patent Application Publication No. 2012-37965 corresponding thereto discloses a technique of mixing a low withstanding voltage metal oxide semiconductor field effect transistor (MOSFET) and a high withstanding voltage MOSFET as an LCD driver IC chip.

SUMMARY

One example disclosed herein includes a semiconductor integrated circuit device. The semiconductor integrated circuit device includes a semiconductor substrate having a first main surface. The semiconductor integrated circuit device also includes a first N-type low withstanding voltage well region formed on the first main surface of the semiconductor substrate. The semiconductor integrated circuit device further includes a P-channel type low withstanding voltage metal insulator semiconductor field effect transistor (MISFET) formed in a surface region of the first N-type low withstanding voltage well region. The semiconductor integrated circuit device also includes a second N-type low withstanding voltage well region formed on the first main surface of the semiconductor substrate simultaneously with the first N-type low withstanding voltage well region. The semiconductor integrated circuit device further includes an N-type medium withstanding voltage metal insulator semiconductor (MIS) capacitor that is provided in a surface region of the second N-type low withstanding voltage well region, has a higher withstanding voltage than the P-channel type low withstanding voltage MISFET, and has the second N-type low withstanding voltage well region as one capacitor electrode.

Another example disclosed herein includes a semiconductor integrated circuit device. The semiconductor integrated circuit device includes a semiconductor substrate having a first main surface. The semiconductor integrated circuit device also includes a first P-type low withstanding voltage well region formed on the first main surface of the semiconductor substrate. The semiconductor integrated circuit device further includes an N-channel type low withstanding voltage metal insulator semiconductor field effect transistor (MISFET) formed in a surface region of the first P-type low withstanding voltage well region. The semiconductor integrated circuit device also includes a second P-type low withstanding voltage well region formed on the first main surface of the semiconductor substrate simultaneously with the first P-type low withstanding voltage well region. The semiconductor integrated circuit device further includes a P-type medium withstanding voltage metal insulator semiconductor (MIS) capacitor that is provided in a surface region of the second P-type low withstanding voltage well region, has a higher withstanding voltage than the N-channel type low withstanding voltage MISFET, and has the second P-type low withstanding voltage well region as one capacitor electrode.

BRIEF DESCRIPTION OF THE DRAWINGS

FIG. 32 is a schematic device cross-sectional view for explaining the outline of the semiconductor integrated circuit device according to an embodiment.

DETAILED DESCRIPTION

[Introduction]

Figure 1:
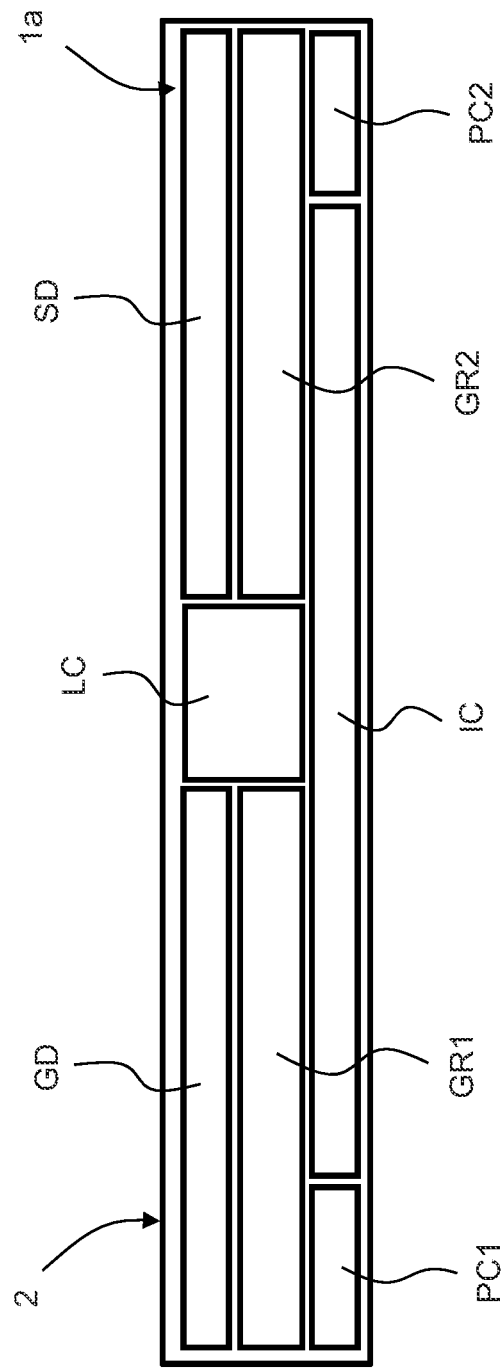
FIG. 1 is a chip top surface overall view for illustrating the layout of an LCD driver chip that is an example of the chip layout in a semiconductor integrated circuit device according to an embodiment of this application.

In IC chips for display device driving, such as an LCD driver IC chip, an operational amplifier (OP amp) circuit is widely used in input and output circuits, and a capacitor in a medium withstanding voltage chip is used as a compensation capacitor.

As for this product area, cost competitiveness is very important. Therefore, a MIS capacitor with good area efficiency is widely used. However, unlike a so-called varactor that is widely used in a voltage-controlled oscillator (VCO) circuit and the like, a characteristic of as small a voltage dependence of the capacitor as possible is used.

For this reason, an additional process is added to reduce the voltage dependence of the capacitor, but there is a problem of an increase in process cost.

Means for solving such a problem and the like will be described below, and other problems and novel features will become apparent from the description of this specification and the accompanying diagrams.

The outline of typical ones of the embodiments disclosed in this application will be briefly described as follows.

That is, the outline of an embodiment of this application is that a semiconductor substrate side capacitor electrode in a MIS capacitor within a first conduction type medium withstanding voltage chip used in an I/O circuit or the like on a semiconductor integrated circuit device is formed in a first conduction type low withstanding voltage well region.

The effects obtained by typical ones of the embodiments disclosed in this application are briefly described as follows.

That is, according to an embodiment of this application, it is possible to reduce process cost.

Summary of the Embodiments

First, summary of representative embodiments of this application disclosed in the application will be described.

According to item 1, there is provided a semiconductor integrated circuit device including: (a) a semiconductor substrate having a first main surface; (b) a first N-type low withstanding voltage well region formed on the first main surface of the semiconductor substrate; (c) a P-channel type low withstanding voltage MISFET formed in a surface region of the first N-type low withstanding voltage well region; (d) a second N-type low withstanding voltage well region formed on the first main surface of the semiconductor substrate simultaneously with the first N-type low withstanding voltage well region; and (e) an N-type medium withstanding voltage MIS capacitor that is provided in a surface region of the second N-type low withstanding voltage well region, has a higher withstanding voltage than the P-channel type low withstanding voltage MISFET, and has the second N-type low withstanding voltage well region as one capacitor electrode.

According to item 2, in the semiconductor integrated circuit device according to item 1, the other capacitor electrode of the N-type medium withstanding voltage MIS capacitor is an N-type polysilicon electrode.

According to item 3, in the semiconductor integrated circuit device according to item 1 or 2, the semiconductor substrate is a P-type silicon single-crystal substrate.

According to item 4, the semiconductor integrated circuit device according to any one of items 1 to 3 further includes: (f) a first P-type low withstanding voltage well region formed on the first main surface of the semiconductor substrate; (g) an N-channel type low withstanding voltage MISFET formed in a surface region of the first P-type low withstanding voltage well region; (h) a second P-type low withstanding voltage well region formed on the first main surface of the semiconductor substrate simultaneously with the first P-type low withstanding voltage well region; and (i) a P-type medium withstanding voltage MIS capacitor that is provided in a surface region of the second P-type low withstanding voltage well region, has a higher withstanding voltage than the N-channel type low withstanding voltage MISFET, and has the second P-type low withstanding voltage well region as one capacitor electrode.

According to item 5, in the semiconductor integrated circuit device according to any one of items 1 to 4, the semiconductor integrated circuit device is for display device driving.

According to item 6, in the semiconductor integrated circuit device according to any one of items 1 to 4, the semiconductor integrated circuit device is for liquid crystal display device driving.

According to item 7, the semiconductor integrated circuit device according to any one of items 4 to 6 further includes: (j) a first N-type high withstanding voltage well region that is formed on the first main surface of the semiconductor substrate so as to include the first P-type low withstanding voltage well region in a planar manner and is deeper than the first P-type low withstanding voltage well region; and (k) a second N-type high withstanding voltage well region that is formed on the first main surface of the semiconductor substrate so as to include the second P-type low withstanding voltage well region in a planar manner, is deeper than the second P-type low withstanding voltage well region, and is formed simultaneously with the first N-type high withstanding voltage well region.

According to item 8, the semiconductor integrated circuit device according to any one of items 2 to 7 further includes: (l) an N-type doped region for threshold voltage adjustment formed in a channel region of the first N-type low withstanding voltage well region; and (m) a capacitor N-type doped region that is formed in a region near a surface of the second N-type low withstanding voltage well region, which is located opposite the other capacitor electrode, simultaneously with the N-type doped region for threshold voltage adjustment.

According to item 9, the semiconductor integrated circuit device according to any one of items 1 to 8 further includes: (n) a third N-type high withstanding voltage well region that is formed on the first main surface of the semiconductor substrate simultaneously with the first N-type high withstanding voltage well region so as to be deeper than the second P-type low withstanding voltage well region; (o) a first N-type medium withstanding voltage well region formed on the first main surface of the semiconductor substrate so as to be included in the third N-type high withstanding voltage well region in a planar manner; (p) a P-channel type medium withstanding voltage MISFET formed in a surface region of the first N-type medium withstanding voltage well region; (q) the second P-type low withstanding voltage well region formed on the first main surface of the semiconductor substrate so as to be included in the third N-type high withstanding voltage well region in a planar manner; and (r) a P-type medium withstanding voltage MIS capacitor that is provided in a surface region of the second P-type low withstanding voltage well region, has a higher withstanding voltage than the P-channel type low withstanding voltage MISFET, and has the second P-type low withstanding voltage well region as one capacitor electrode.

According to item 10, the semiconductor integrated circuit device according to item 9 further includes: (s) a first P-type medium withstanding voltage well region that is provided on the first main surface of the semiconductor substrate and is provided between the first N-type medium withstanding voltage well region and the second P-type low withstanding voltage well region so as to be in contact with the first N-type medium withstanding voltage well region and the second P-type low withstanding voltage well region.

According to item 11, there is provided a semiconductor integrated circuit device including: (a) a semiconductor substrate having a first main surface; (b) a first P-type low withstanding voltage well region formed on the first main surface of the semiconductor substrate; (c) an N-channel type low withstanding voltage MISFET formed in a surface region of the first P-type low withstanding voltage well region; (d) a second P-type low withstanding voltage well region formed on the first main surface of the semiconductor substrate simultaneously with the first P-type low withstanding voltage well region; and (e) a P-type medium withstanding voltage MIS capacitor that is provided in a surface region of the second P-type low withstanding voltage well region, has a higher withstanding voltage than the N-channel type low withstanding voltage MISFET, and has the second P-type low withstanding voltage well region as one capacitor electrode.

According to item 12, in the semiconductor integrated circuit device according to item 11, the other capacitor electrode of the P-type medium withstanding voltage MIS capacitor is a P-type polysilicon electrode.

According to item 13, in the semiconductor integrated circuit device according to item 11 or 12, the semiconductor substrate is a P-type silicon single-crystal substrate.

According to item 14, the semiconductor integrated circuit device according to any one of items 11 to 13 further includes: (f) a first N-type low withstanding voltage well region formed on the first main surface of the semiconductor substrate; (g) a P-channel type low withstanding voltage MISFET formed in a surface region of the first N-type low withstanding voltage well region; (h) a second N-type low withstanding voltage well region formed on the first main surface of the semiconductor substrate simultaneously with the first N-type low withstanding voltage well region; and (i) an N-type medium withstanding voltage MIS capacitor that is provided in a surface region of the second N-type low withstanding voltage well region, has a higher withstanding voltage than the P-channel type low withstanding voltage MISFET, and has the second N-type low withstanding voltage well region as one capacitor electrode.

According to item 15, in the semiconductor integrated circuit device according to any one of items 11 to 14, the semiconductor integrated circuit device is for display device driving.

According to item 16, in the semiconductor integrated circuit device according to any one of items 11 to 14, the semiconductor integrated circuit device is for liquid crystal display device driving.

According to item 17, the semiconductor integrated circuit device according to any one of items 14 to 16 further includes: (j) a first N-type high withstanding voltage well region that is formed on the first main surface of the semiconductor substrate so as to include the first P-type low withstanding voltage well region in a planar manner and is deeper than the first P-type low withstanding voltage well region; and (k) a second N-type high withstanding voltage well region that is formed on the first main surface of the semiconductor substrate so as to include the second P-type low withstanding voltage well region in a planar manner, is deeper than the second P-type low withstanding voltage well region, and is formed simultaneously with the first N-type high withstanding voltage well region.

According to item 18, the semiconductor integrated circuit device according to any one of items 12 to 17 further includes: (l) a P-type doped region for threshold voltage adjustment formed in a channel region of the first P-type low withstanding voltage well region; and (m) a capacitor P-type doped region that is formed in a region near a surface of the second P-type low withstanding voltage well region, which is located opposite the other capacitor electrode, simultaneously with the P-type doped region for threshold voltage adjustment.

According to item 19, the semiconductor integrated circuit device according to any one of items 11 to 18 further includes: (n) a third N-type high withstanding voltage well region that is formed on the first main surface of the semiconductor substrate simultaneously with the first N-type high withstanding voltage well region so as to be deeper than the second P-type low withstanding voltage well region; (o) a first N-type medium withstanding voltage well region formed on the first main surface of the semiconductor substrate so as to be included in the third N-type high withstanding voltage well region in a planar manner; (p) a P-channel type medium withstanding voltage MISFET formed in a surface region of the first N-type medium withstanding voltage well region; (q) the second P-type low withstanding voltage well region formed on the first main surface of the semiconductor substrate so as to be included in the third N-type high withstanding voltage well region in a planar manner; and (r) a P-type medium withstanding voltage MIS capacitor that is provided in a surface region of the second P-type low withstanding voltage well region, has a higher withstanding voltage than the P-channel type low withstanding voltage MISFET, and has the second P-type low withstanding voltage well region as one capacitor electrode.

According to item 20, the semiconductor integrated circuit device according to item 19 further includes: (s) a first P-type medium withstanding voltage well region that is provided on the first main surface of the semiconductor substrate and is provided between the first N-type medium withstanding voltage well region and the second P-type low withstanding voltage well region so as to be in contact with the first N-type medium withstanding voltage well region and the second P-type low withstanding voltage well region.

[Explanation of Description Form, Basic Terms, and Use Thereof in this Application]

In this application, if necessary for the sake of convenience, the description of the embodiments will be divided into a plurality of sections. However, the plurality of sections are not independent from each other unless otherwise specified and are respective portions of a single example, or one of the plurality of sections is the details of another section or modifications of some or all sections. In addition, the same portion is not repeated in principle. Each element in the embodiment may be optionally included unless otherwise specified, unless the number of elements is theoretically limited to a specific number, and unless it is obvious from the context.

In this application, the term "semiconductor device" or "semiconductor integrated circuit device" mainly refers to various transistors (active elements) alone, a device obtained by integrating not only transistors but also resistors, capacitors, and the like on a semiconductor chip (for example, a single-crystal silicon substrate), and a device obtained by packaging a semiconductor chip and the like. As a typical example of various transistors, a metal insulator semiconductor field effect transistor (MISFET) represented by a metal oxide semiconductor field effect transistor (MOSFET) can be mentioned. In this case, as a typical example of the integrated circuit configuration, a complementary metal insulator semiconductor (CMIS) type integrated circuit represented by a complementary metal oxide semiconductor (CMOS) type integrated circuit in which an N-channel type MISFET and a P-channel type MISFET are combined can be mentioned.

The wafer process of today's semiconductor integrated circuit device, that is, the wafer process of large scale integration (LSI), can usually be divided into two parts. That is, the first part is a front end of line (FEOL) process from the introduction of the silicon wafer as a raw material to the pre-metal process (process including the formation of an interlayer insulating film between the lower end of the M1 wiring layer and the gate electrode structure, the formation of a contact hole and a tungsten plug, embedding, and the like). The second part is a back end of line (BEOL) process from the formation of the M1 wiring layer to the formation of a pad opening to a final passivation film on an aluminum based pad electrode (in a wafer-level package process, the process is also included).

Similarly, when the phrase "X formed of A" is used in association with a material, a composition, or the like in the description of the embodiment and the like, it does not exclude cases where an element other than A is one of the main elements unless otherwise specified and unless it is obvious from the context. For example, in association with a component, the phrase means "X containing A as a main component". For example, "silicon member" is not limited to pure silicon, and includes an SiGe alloy, a multi-element alloy containing silicon as a main component, and a member containing other additives.

Similarly, "silicon oxide film", "silicon oxide based insulating film", and the like include not only relatively pure undoped silicon oxide but also an insulating film containing the silicon oxide as a main component. For example, a silicon oxide based insulating film obtained by doping impurities, such as TEOS based silicon oxide, phosphorus silicate glass (PSG), and borophosphosilicate glass (BPSG), is also the silicon oxide film. In addition, besides a thermally oxidized film and a CVD oxide film, an application based film, such as spin on glass (SOG) or nano-clustering silica (NSC), is also the silicon oxide film or the silicon oxide based insulating film. Similarly, a Low-k insulating film, such as fluorosilicate glass (FSG), silicon oxicarbide (SiOC), carbon-doped silicon oxide, or organosilicate glass (OSG), is also the silicon oxide film or the silicon oxide based insulating film. In addition, a silica based Low-k insulating film (porous insulating film; the term "porous" includes molecular porous) obtained by introducing pores into the same member as mentioned above is also the silicon oxide film or the silicon oxide based insulating film.

Silicon based insulating films commonly used in the field of semiconductor devices include a silicon nitride based insulating film as well as the silicon oxide based insulating film. Materials of such insulating films include SiN, SiCN, SiNH, and SiCNH. The term "silicon nitride" means both SiN and SiNH unless otherwise specified. Similarly, the term "SiCN" means both SiCN and SiCNH unless otherwise specified.

In addition, SiC has properties similar to SiN, but SiON should be classified as a silicon oxide based insulating film in many cases. When SiON is used for an etch-stop film, SiON is close to SiC, SiN, or the like.

The silicon nitride film is used not only as an etch-stop film in a self-aligned contact (SAC) technique, that is, as a contact etch-stop layer (CESL) in many cases, but also as a stress applying film in a stress memorization technique (SMT).

For a silicide film or the like, in the following embodiment, detailed explanation will be given using mainly cobalt silicide as an example. For the silicide film, nickel silicide (including nickel-based silicide), titanium silicide, and tungsten silicide, and the like may be used without being limited to cobalt silicide. As for nickel silicide or the like, the term "nickel silicide" generally refers to nickel monosilicide. However, not only relatively pure nickel silicide but also an alloy, mixed crystal, and the like containing nickel monosilicide as a main element are included. As metal films for forming nickel silicide, not only Ni (nickel) film but also nickel alloy films, such as an Ni—Pt alloy film (alloy film of Ni and Pt), an Ni—V alloy film (alloy film of Ni and V), an Ni—Pd alloy film (alloy film of Ni and Pd), an Ni—Yb alloy film (alloy film of Ni and Yb), and an Ni—Er alloy film (alloy film of Ni and Er) can be used. These silicides containing nickel as a main metal element are referred to collectively as "nickel based silicide".

The term "wafer" generally refers to a single-crystal silicon wafer on which a semiconductor integrated circuit device (or a semiconductor device or an electronic device) is formed. However, the "wafer" also includes an epitaxial wafer, a composite wafer including an insulating substrate, such as an SOI substrate or an LCD glass substrate, and a semiconductor layer.

Graphics, positions, attributes, and the like are appropriately exemplified, but these items are not limited to the examples unless otherwise specified and unless it is obvious from the context. Therefore, for example, the term "square" includes an almost square, the term "orthogonal" includes an almost orthogonal case, and the term "match" includes a case of almost matching. This is the same for the terms "parallel" and "perpendicular". Accordingly, for example, a deviation of about 10° from the complete parallel belongs to parallel.

In a certain region, the terms "entire", "general", and "whole region" include "almost entire", "almost general", and "almost whole region", respectively. For example, 80% or more of a certain region can be defined as "entire", "general", or "whole region". This is the same for "entire circumference", "full length", and the like.

In addition, when the shape of a certain object is expressed as a "rectangle", "almost rectangle" is included. For example, if the area of a portion that does not belong to the rectangle is less than about 20% of the entire area, the shape can be said to be a rectangle. This is the same for "circle" and the like. In this case, if a circular body is in a divided state, a portion in which its divided element portion is interpolated or extrapolated is a part of the circular body.

Also for periodicity, the term "periodic" includes almost periodic. For example, if a period shift is about less than 20% for each element, each element can be said to be "periodic". If, for example, about 20% or less of all elements targeted for the periodicity deviates from the range, "periodic" can be applied as a whole.

The definitions of this section are general. When there are definitions different in the following individual descriptions, priority is given to the individual description for each part herein. However, as for portions having no definitions or the like in the corresponding individual descriptions, the definition, provisions, and the like of the present section are still effective unless clearly denied.

In addition, even if a specific value and a specific amount are mentioned, a value exceeding the specific value may be used or a value less than the specific value may be used unless otherwise specified, unless theoretically limited to the value and unless it is obvious from the context.

In this application, "MIS capacitor" or "MIS capacitor element" refers to a capacitor element that is formed of a conductive layer corresponding to the gate electrode of the MISFET, an insulating layer corresponding to the gate insulating film, a semiconductor region of a semiconductor substrate (including an impurity doped region of a part of the substrate), and the like. In this case, for the sake of convenience, the conductive layer corresponding to the gate electrode may be referred to as a "capacitor gate electrode" of a capacitor element, the insulating layer corresponding to the gate insulating film may be referred to as a "gate insulating film", and a portion opposite the capacitor gate electrode of the surface of the semiconductor substrate may be referred to as a "substrate capacitor electrode" or a "substrate capacitor electrode impurity doped region".

In this application, a MIS capacitor having an N-type substrate capacitor electrode impurity doped region is referred to as an "N-type MIS capacitor" or the like, and a MIS capacitor having a P-type substrate capacitor electrode impurity doped region is referred to as a "P-type MIS capacitor" or the like.

In this application, a capacitor gate electrode that is formed of polysilicon or the like and is doped with N-type impurities is referred to as an "N-type capacitor gate electrode", and such a MIS capacitor is referred to as an "N-gate MIS capacitor". On the contrary, a capacitor gate electrode that is doped with P-type impurities is referred to as a "P-type capacitor gate electrode", and such a MIS capacitor is referred to as a "P-gate MIS capacitor".

In this application, a MIS capacitor in which the capacitor gate electrode and the substrate capacitor electrode impurity doped region are of the same conduction type is referred to as a "same conduction type MIS capacitor". Corresponding to this, a MIS capacitor in which both the capacitor gate electrode and the substrate capacitor electrode impurity doped region are of an N type is referred to as a "both-N-type MIS capacitor", and a MIS capacitor in which both the capacitor gate electrode and the substrate capacitor electrode impurity doped region are of a P type is referred to as a "both-P-type MIS capacitor".

In this application, elements (a MISFET, a MIS capacitor, and the like) belonging to a plurality of element groups of different withstanding voltages will be referred to as a "low withstanding voltage element", a "medium withstanding voltage element", a "high withstanding voltage element", and the like for the purpose of distinction. That is, the withstanding voltage of the medium withstanding voltage element is higher than the withstanding voltage of the low withstanding voltage element, and the withstanding voltage of the high withstanding voltage element is higher than the withstanding voltage of the medium withstanding voltage element. For example, the withstanding voltage of the medium withstanding voltage MIS capacitor is higher than the withstanding voltage of the low withstanding voltage MISFET, and the withstanding voltage of the high withstanding voltage MISFET is higher than the withstanding voltage of the medium withstanding voltage MISFET. That is, instead of comparing the withstanding voltages with each other, these conditions are just included in the name. For example, "low withstanding voltage - - - , medium withstanding voltage - - - " is not referred to based on the premise "high withstanding voltage - - - ". Here, the "withstanding voltage of the element" is set to be slightly higher than the operating voltage in order to ensure operation at a normal operating voltage. Specifically, for the MISFET, the withstanding voltage is a guaranteed upper limit of the gate-source voltage, for example. For the MIS capacitor, the withstanding voltage is a guaranteed upper limit of the voltage between both terminals, for example. In addition, undoubtedly, the withstanding voltages of individual elements are not completely the same between elements belonging to the element group having the same withstanding voltage, but are usually distributed over a certain range according to element characteristics (differences in type) and process variations.

In this application, a "well region" refers to both an impurity doped region (original well region) in which at least one MISFET is formed (it means that the semiconductor region portion of the MISFET is formed) and an impurity doped region formed simultaneously with the impurity doped region (simultaneously formed well region). As used in this application, the term "simultaneously" means within the same process step.

In this application, in order to distinguish a plurality of kinds of well regions having different attributes, for example, a "low withstanding voltage P-type (N-type) well region", a "medium withstanding voltage P-type (N-type) well region", and a "high withstanding voltage P-type (N-type) well region" are set by adding the withstanding voltage of the MISFET formed in the original well region. In the following examples, the concentration relationship of P-type substrate<high withstanding voltage P-type (N-type) well region<medium withstanding voltage P-type (N-type) well region<low withstanding voltage P-type (N-type) well region is satisfied. On the other hand, for the depth, the relationship of medium withstanding voltage P-type (N-type) well region<high withstanding voltage P-type (N-type) well region and low withstanding voltage P-type (N-type) well region<high withstanding voltage P-type (N-type) well region is satisfied. For the depth relationship between the low withstanding voltage P-type (N-type) well region and the medium withstanding voltage P-type (N-type) well region, in this example, the depths of the low withstanding voltage P-type (N-type) well region and the medium withstanding voltage P-type (N-type) well region are almost the same or the depth relationship of low withstanding voltage P-type (N-type) well region<medium withstanding voltage P-type (N-type) well region is satisfied, although optional. In principle, the comparison of the impurity concentration is based on peak concentration between P-type targets in the case of P type (between N-type targets in the case of N type).

In the following embodiments, even if detailed explanation is not given, it is assumed that well regions, which are of the same conduction type and have the same withstanding voltage, are formed simultaneously.

For the relationship between well regions, "included in a planar manner" does not mean "included in a three-dimensional manner" but means "included inside when a target is orthogonally projected to a plane parallel to the main surface". Undoubtedly, the case of "included in a three-dimensional manner" includes the case of "included in a planar manner". For example, a case is included in which a deep well region more deeply located than a shallow well region extends beyond the shallow well region in a planar manner. That is, a case is included in which a shallow P-type well region is separated from a P-type substrate by an N-type well region, which is more deeply located than the shallow P-type well region, and an N-type impurity region that surrounds the periphery so as to be connected to the N-type well region, instead of including a shallow P-type well region in a deep N-type well region in a three-dimensional manner.

Figure 5:
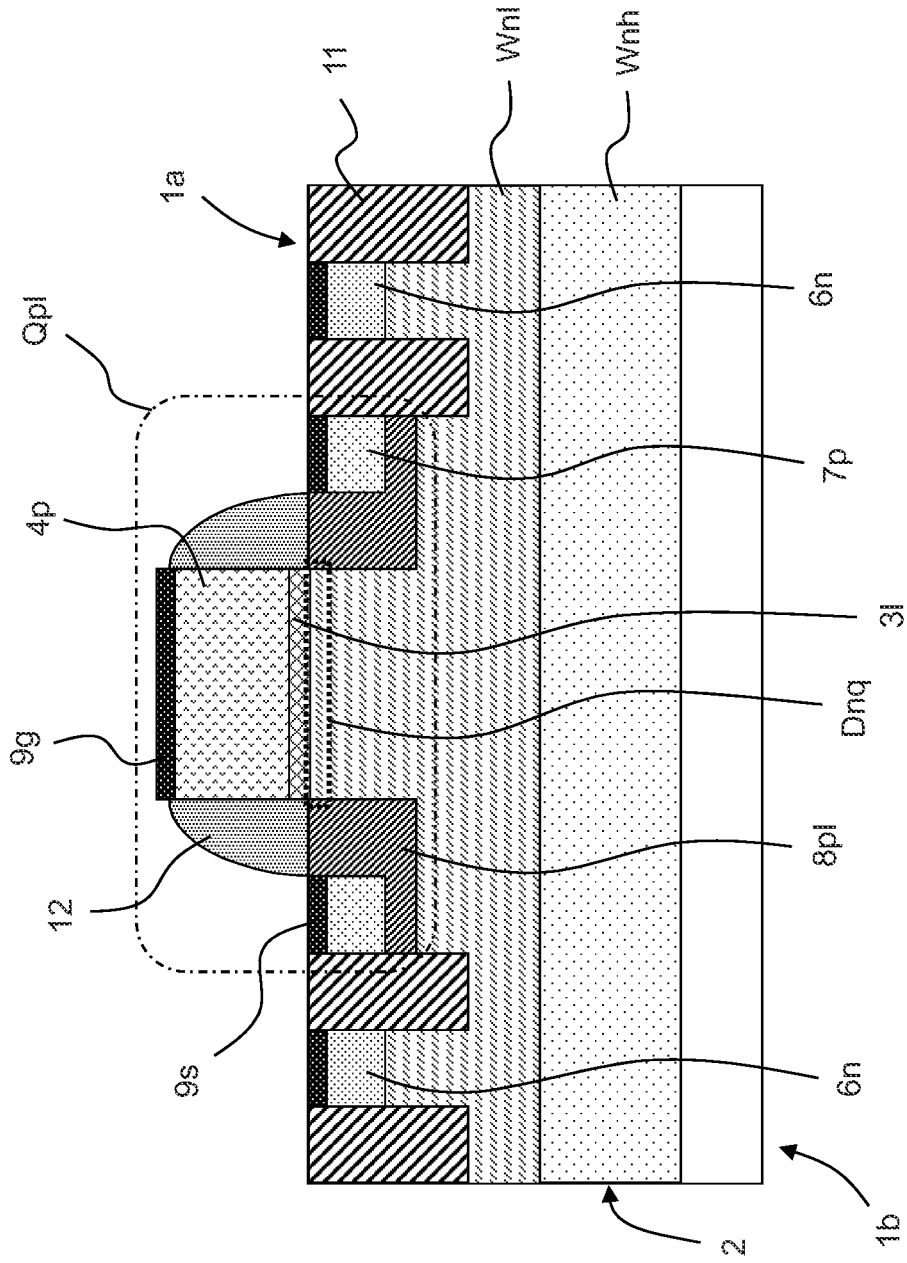
FIG. 5 is a more specific device cross-sectional view of a P-channel type low withstanding voltage MISFET and the periphery shown in FIG. 2.
Figure 6:
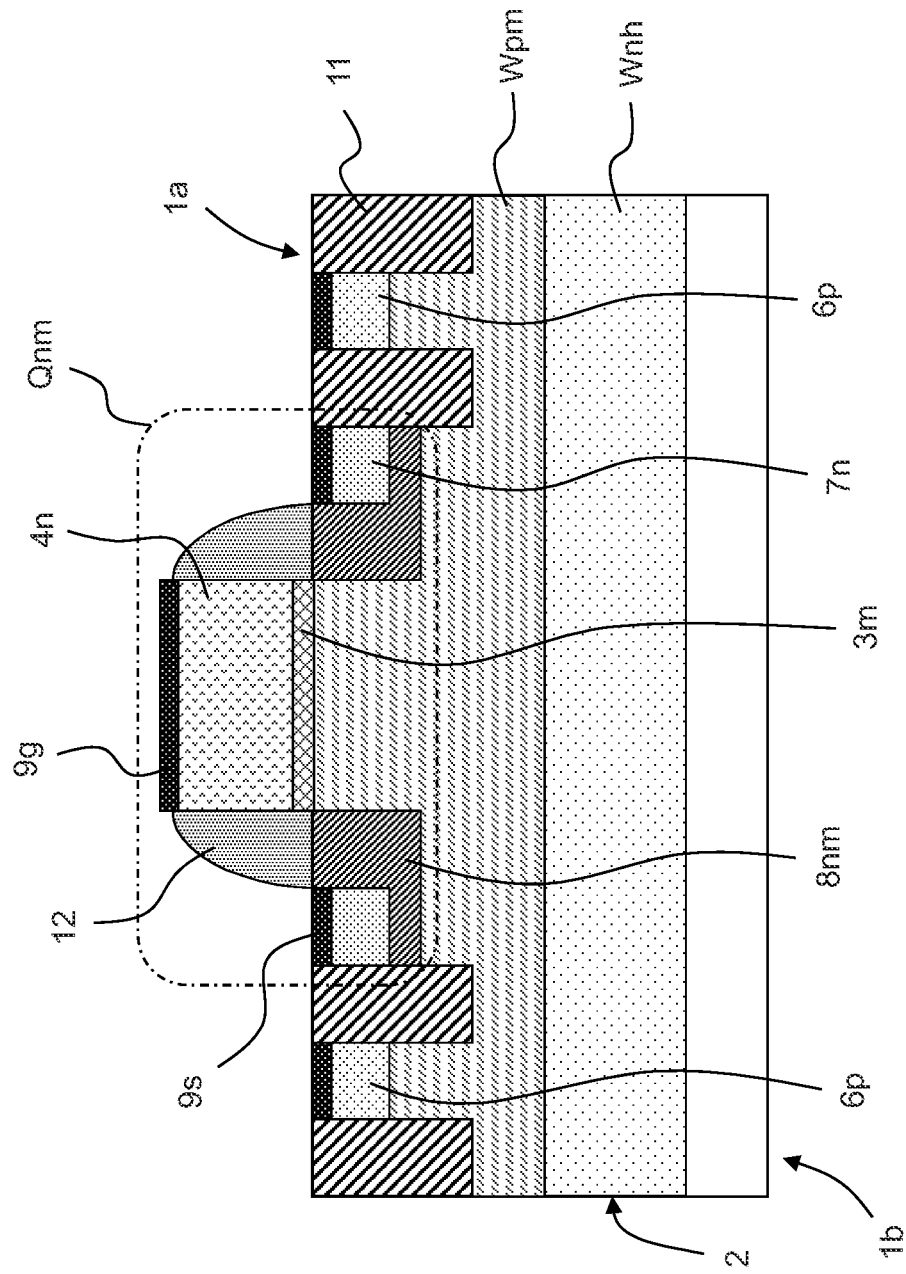
FIG. 6 is a more specific device cross-sectional view of an N-channel type medium withstanding voltage MISFET and the periphery shown in FIG. 3.
Figure 7:
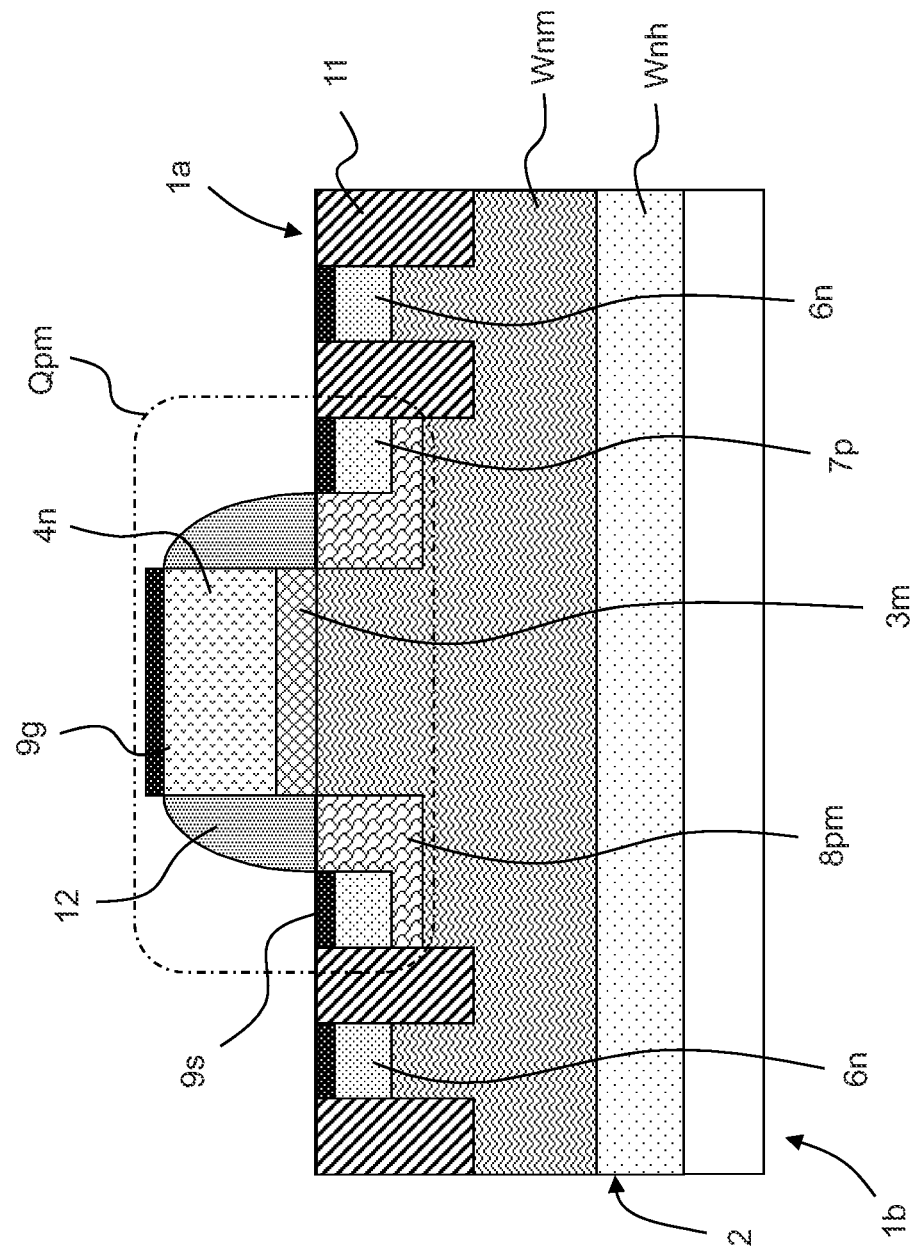
FIG. 7 is a more specific device cross-sectional view of a P-channel type medium withstanding voltage MISFET and the periphery shown in FIG. 3.
Figure 8:
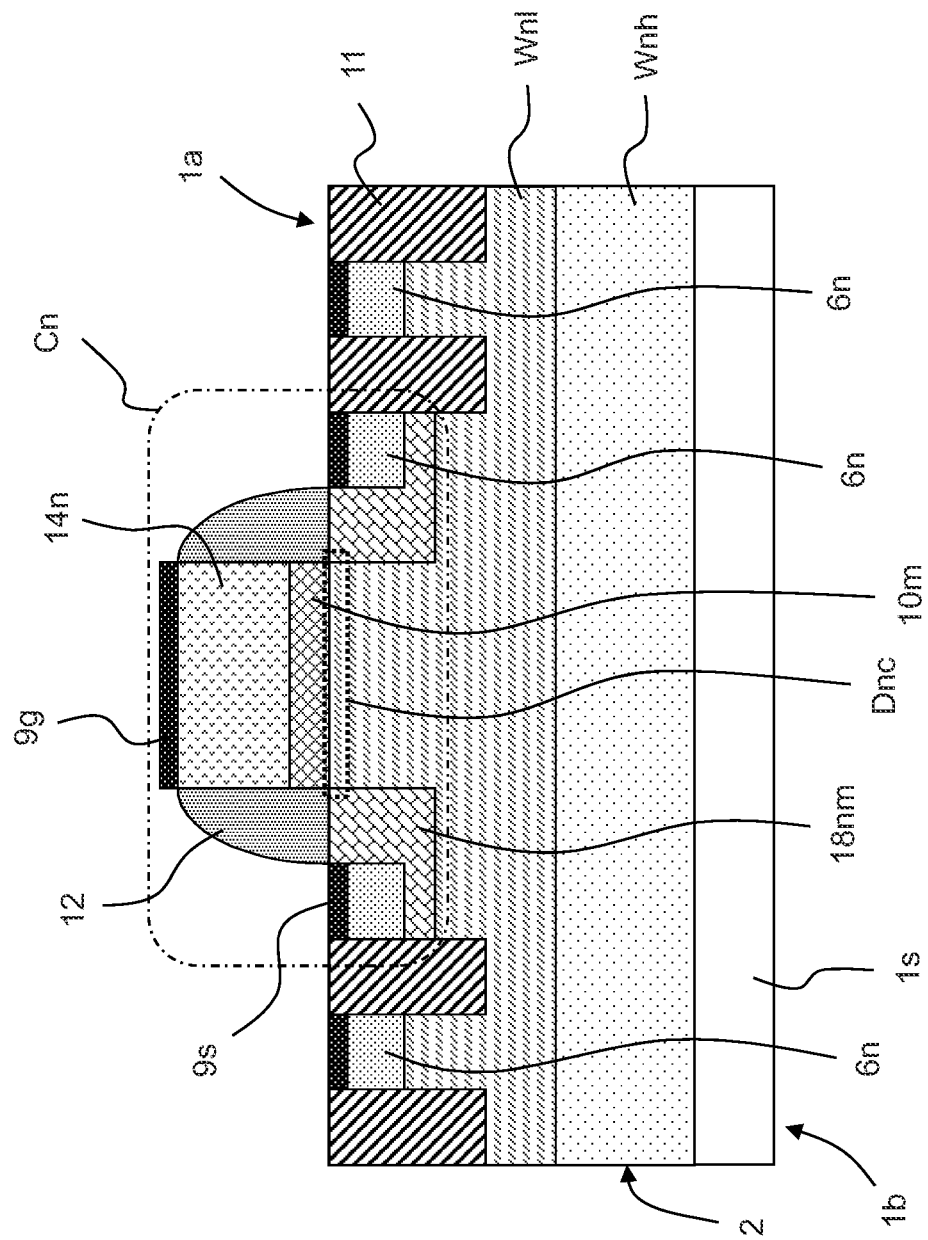
FIG. 8 is a more specific device cross-sectional view of an N-type medium withstanding voltage MIS capacitor and the periphery shown in FIG. 3.
Figure 10:
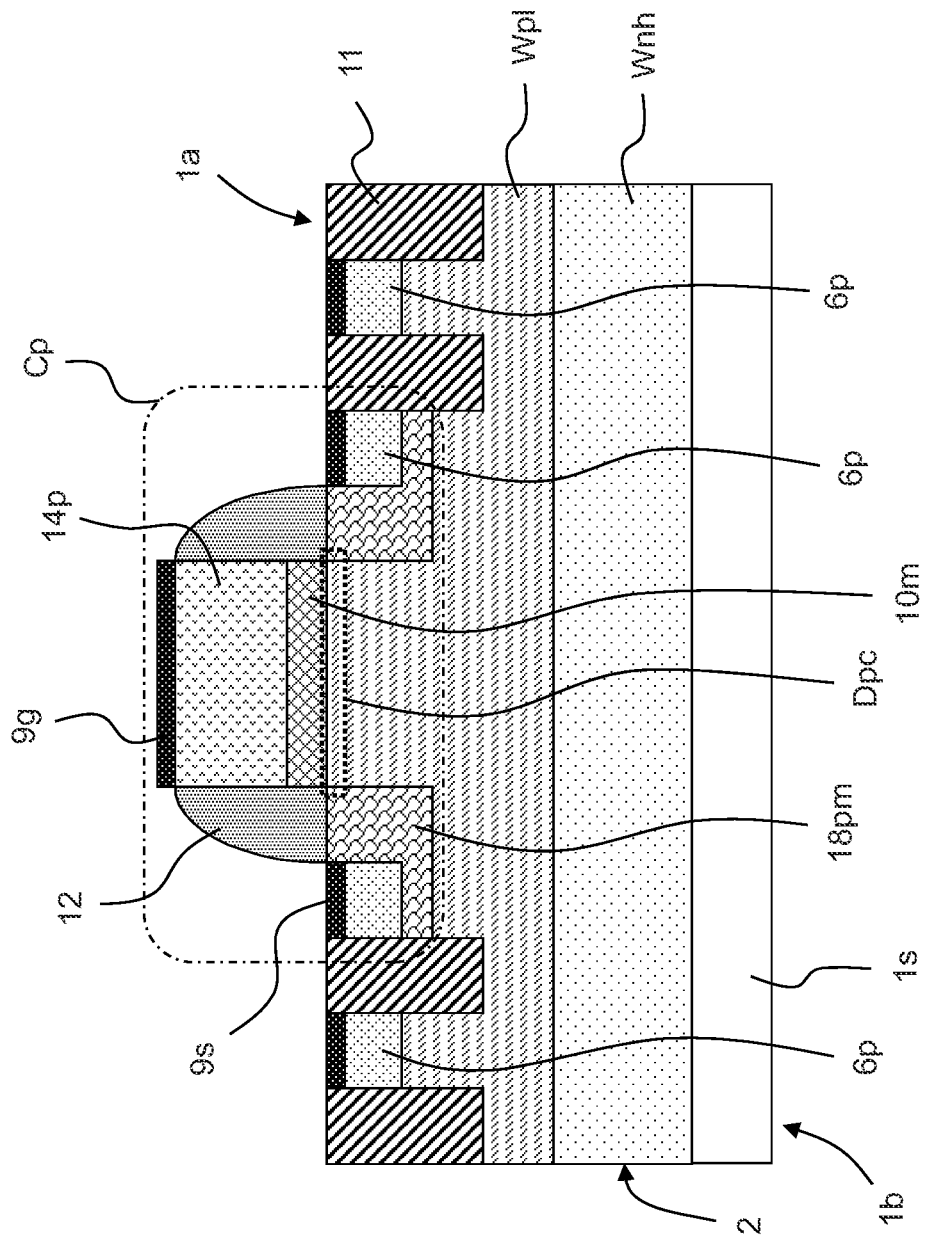
FIG. 10 is a more specific device cross-sectional view of a P-type medium withstanding voltage MIS capacitor and the periphery shown in FIG. 3.

Similarly, for the MISFET and the MIS type capacitor, even if detailed explanation is not given, it is assumed that corresponding regions (including regions common to a plurality of withstanding voltages), which are of the same conduction type and have the same withstanding voltage, are formed simultaneously. For example, referring to FIGS. 6 and 8, an N-type medium withstanding voltage source drain extension region 8 nm and an N-type doped region around a capacitor electrode extraction portion 18 nm, an N⁺-type contact region 6n and an N⁺-type source drain region 7n, and the like are formed simultaneously. Referring to FIGS. 5 and 8, an N-type doped region for threshold voltage adjustment Dnq and a capacitor N-type doped region Dnc are formed simultaneously. Referring to FIGS. 5 and 6, a P⁺-type contact region 6p and a P⁺-type source drain region 7p are formed simultaneously. Referring to FIGS. 7 and 10, a P-type medium withstanding voltage source drain extension region 8pm and a P-type doped region around a capacitor electrode extraction portion 18pm are formed simultaneously.

Further Detailed Description of the Embodiments

Embodiments will be described in more detail. In the individual diagrams, the same or like portions are designated by the same or similar symbols or reference numerals, and the explanation thereof will not be repeated in principle.

In the accompanying diagrams, when the diagram becomes complicated or when distinction from space is clear, hatching or the like may be omitted even in the case of a cross section. In relation to this, when it is clear from the description or the like, the outline of the background may be omitted even in the case of a hole closed in a planar manner. In addition, in order to clearly show that a corresponding portion is not a space, hatching may be given to the portion even if the portion is not a cross section.

In addition, when one is referred to "first" and the other is referred to "second" for the designation of the alternative case, there is a case in which they are illustrated so as to match each other along a representative embodiment. However, even if "first" is referred to, the "first" is not limited to the corresponding selection illustrated.

1. Explanation of a CMIS integrated circuit device that is an example of the chip layout and an example of the main portion device structure in a semiconductor integrated circuit device according to an embodiment of this application (mainly FIGS. 1 to 11).

Hereinafter, as a specific example of the semiconductor integrated circuit device according to the embodiments of this application, a so-called LCD driver chip will be described in detail. However, this application can be widely applied to an analog & digital mixture including a capacitor element in a chip, a CPU, an MPU, and other LSIs, without being limited to the display device driver chip.

The LCD driver chip may include, for example, a control unit of a projection type capacitive touch sensor panel (resistive type, surface acoustic wave type, infrared type, electromagnetic induction type, and the like can also be applied).

In addition, although the following explanation will be given in detail using a 90 nanometer technology node as an example, this application can be applied to both a device of a technology node finer than the 90 nanometer technology node and a device of a technology node thicker than the 90 nanometer technology node.

In a device structure below, for convenience of explanation, a polysilicon gate structure based on the gate first method will be described. However, as the gate structure, not only the polysilicon gate structure but also a polycide gate structure, a silicide gate structure, a poly-metal gate structure, a metal gate structure, and the like can be used. In addition, as the gate process, not only the gate first method but also a gate last method or an intermediate method therebetween can be used. In addition, detailed explanation regarding the gate insulating film will be focused on a silicon oxide based insulating film as an example. However, a high dielectric insulating film can also be used undoubtedly.

In this application, an "LCD driver chip" including these is referred to unless otherwise specified.

Figure 2:
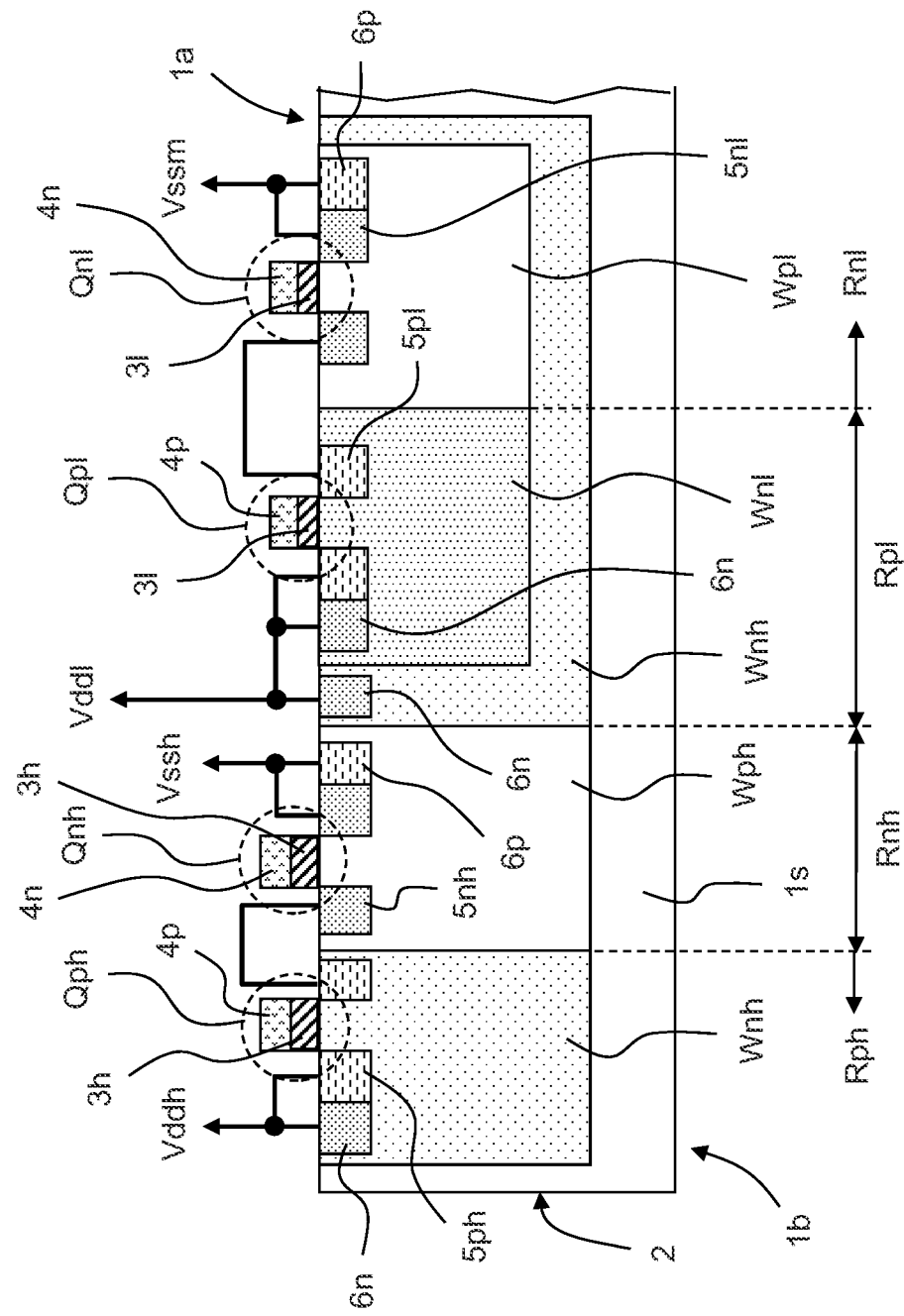
FIG. 2 is a schematic device cross-sectional view (low withstanding voltage MISFET and high withstanding voltage MISFET) for explaining the structure of the main portion cross section of FIG. 1 focusing on the potential relationship.
Figure 3:
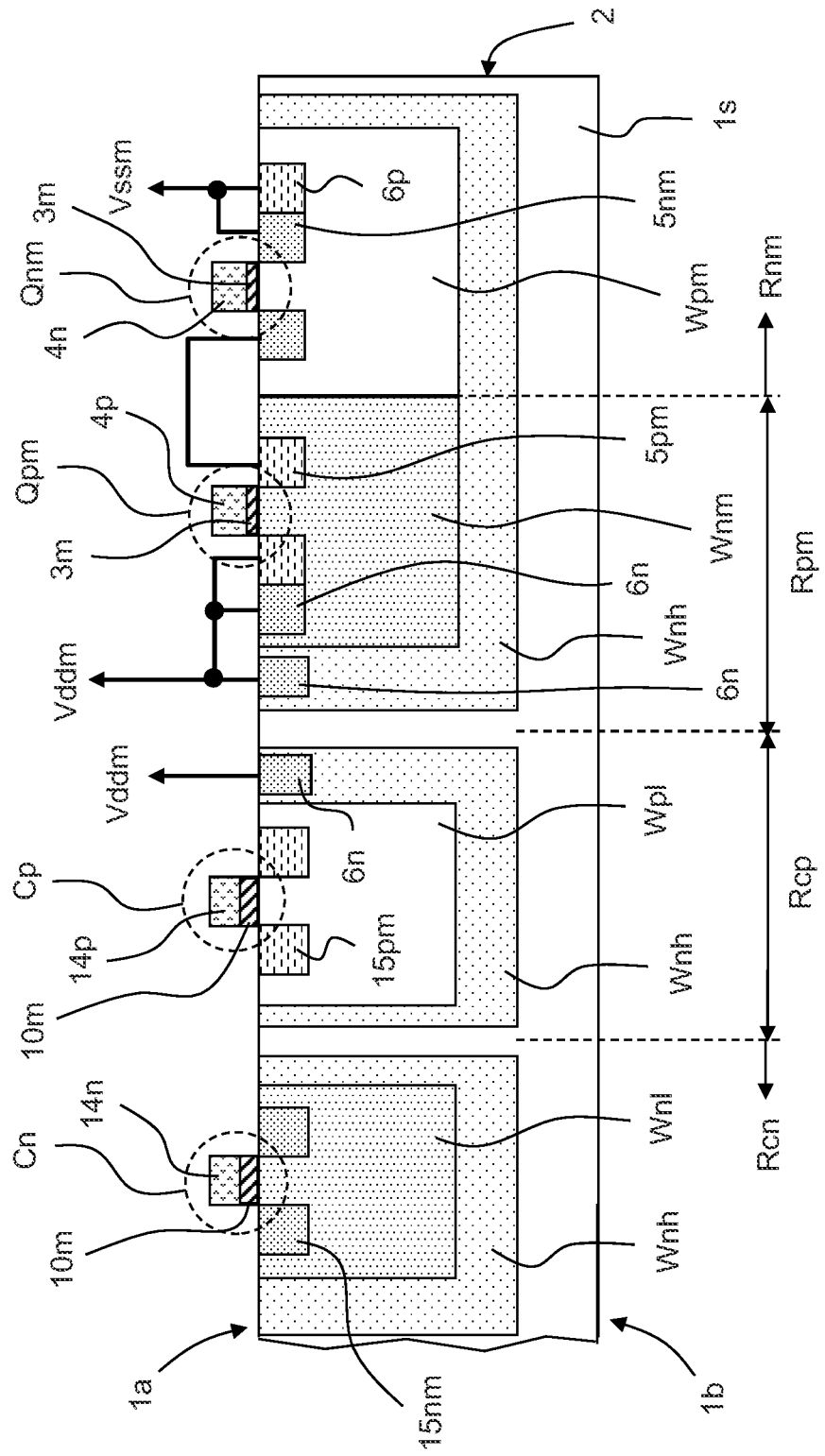
FIG. 3 is a schematic device cross-sectional view (medium withstanding voltage MISFET and medium withstanding voltage capacitor element) for explaining the structure of the main portion cross section of FIG. 1 focusing on the potential relationship.
Figure 4:
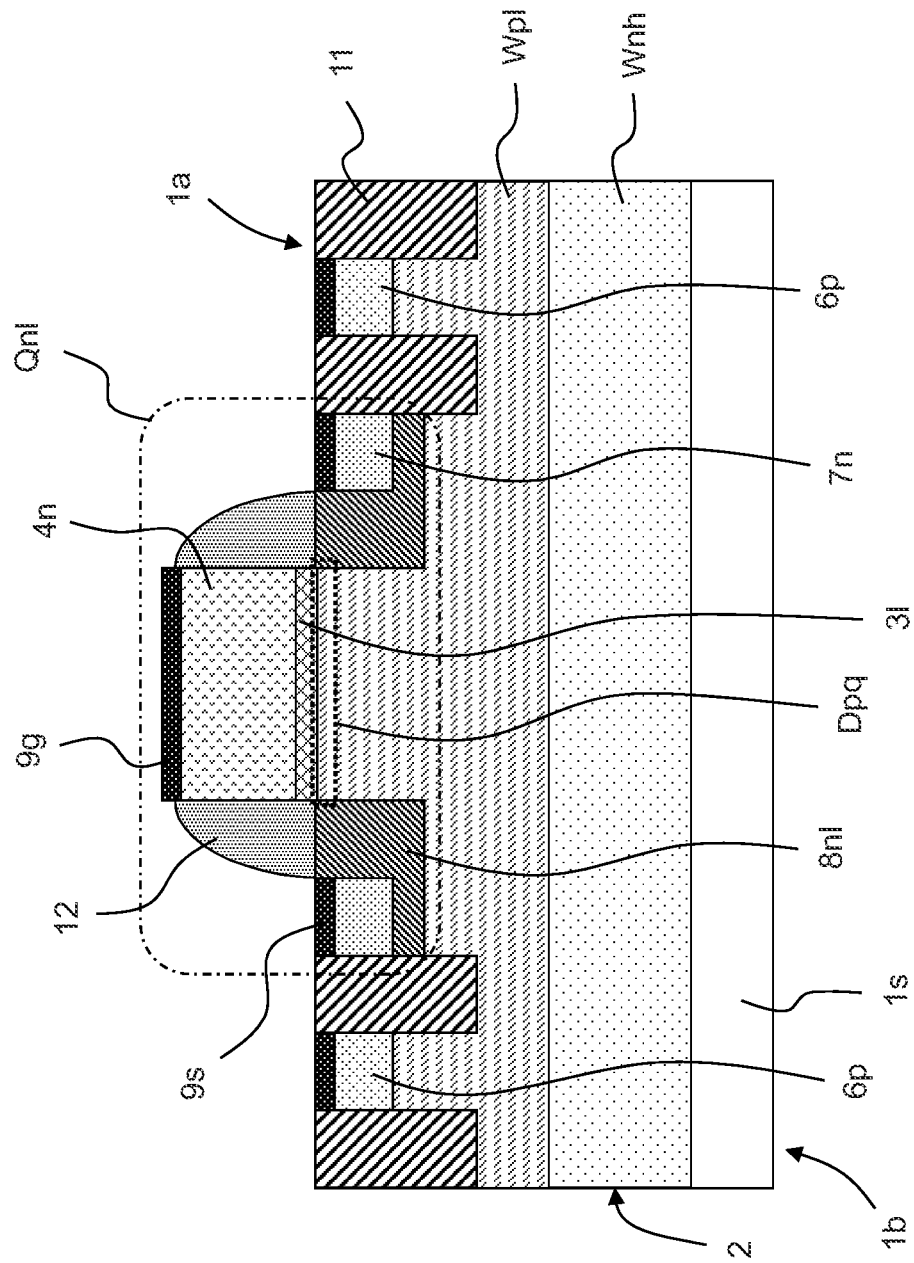
FIG. 4 is a more specific device cross-sectional view of an N-channel type low withstanding voltage MISFET and the periphery shown in FIG. 2.
Figure 9:
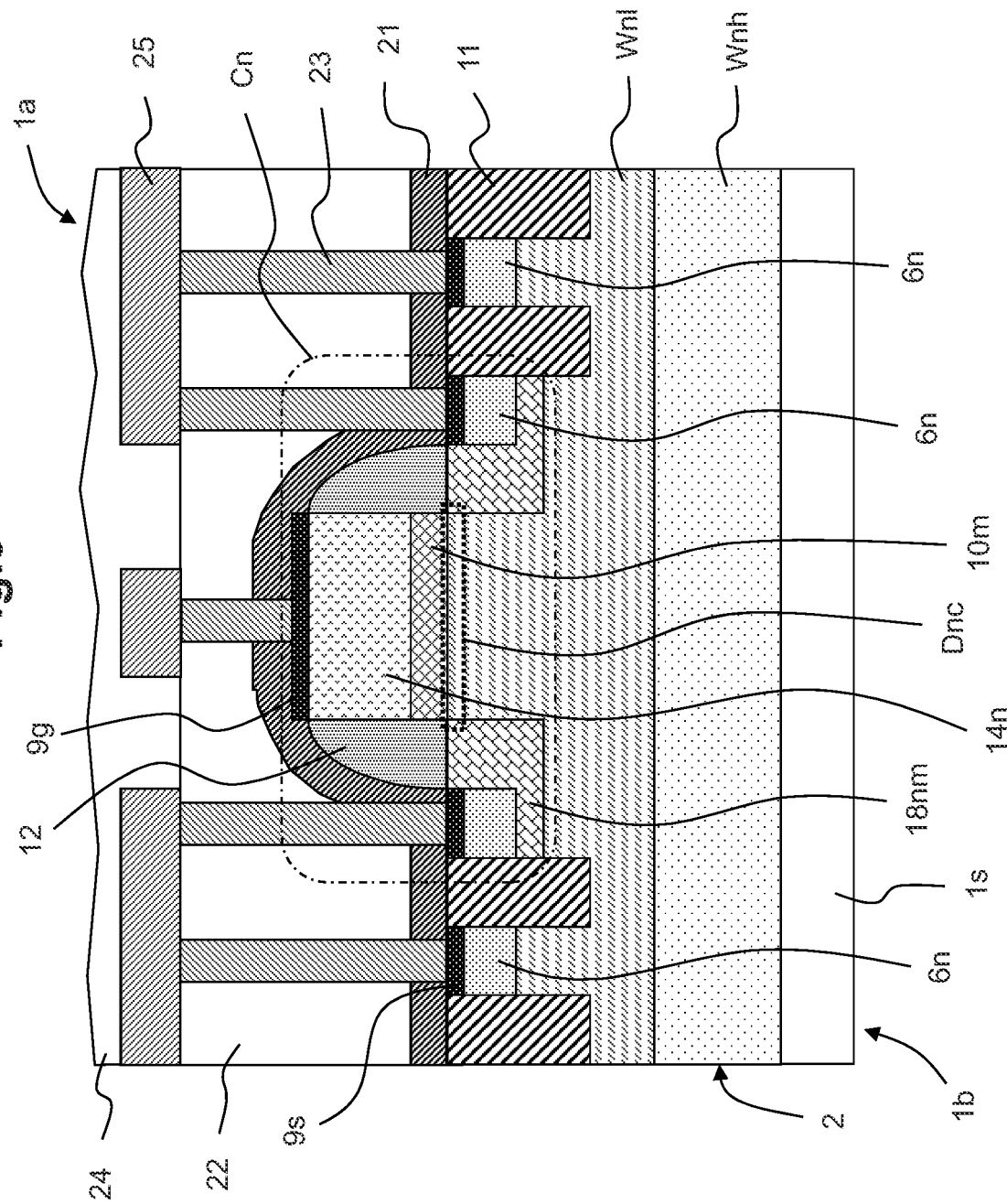
FIG. 9 is a device cross-sectional view showing a structure after forming up to a first-layer metal wiring in a portion of FIG. 8.
Figure 11:
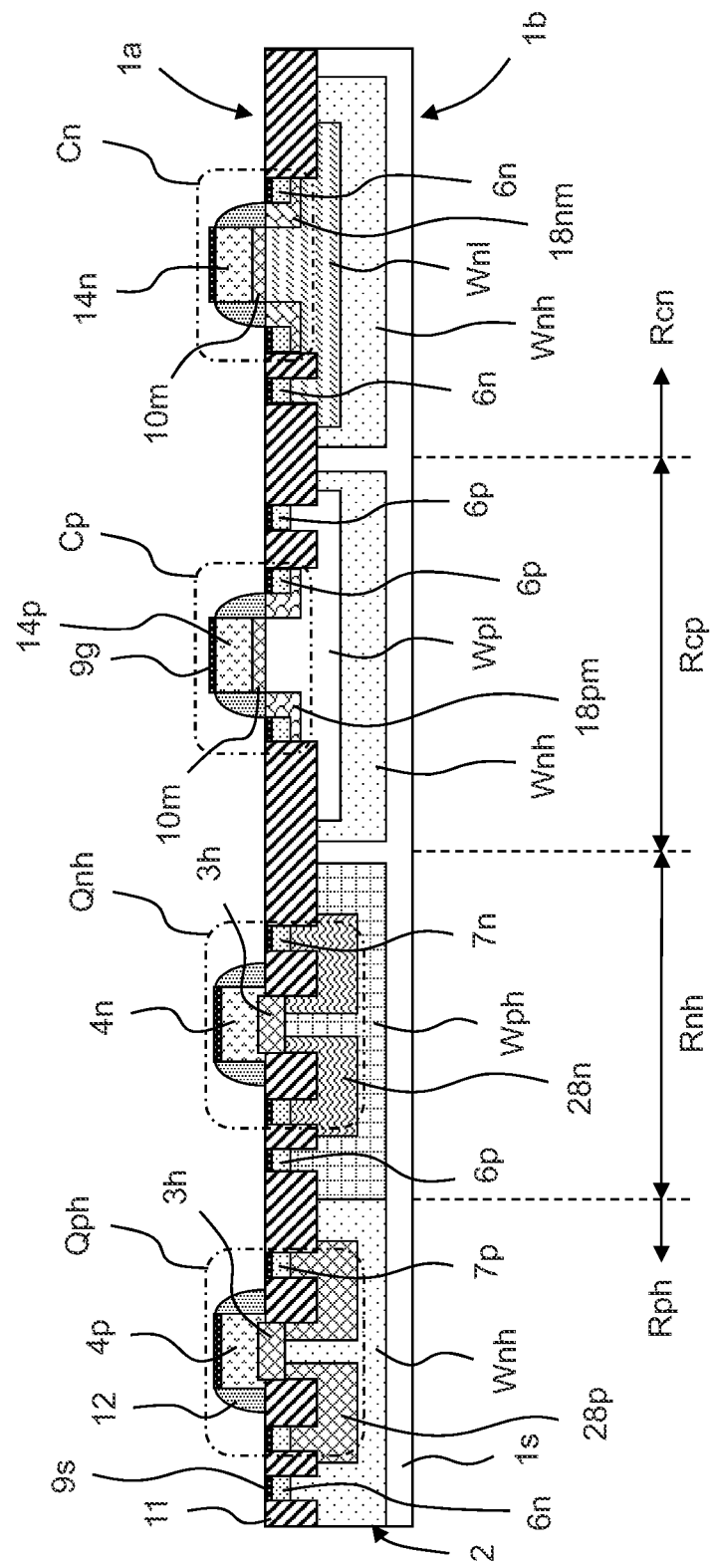
FIG. 11 is a broad device cross-sectional view showing the specific structure around the high withstanding voltage MISFET and the medium withstanding voltage MIS capacitor shown in FIGS. 2 and 3.

FIG. 1 is a chip top surface overall view for illustrating the layout of an LCD driver chip that is an example of the chip layout in a semiconductor integrated circuit device according to an embodiment of this application. FIG. 2 is a schematic device cross-sectional view (low withstanding voltage MISFET and high withstanding voltage MISFET) for explaining the structure of the main portion cross section of FIG. 1 focusing on the potential relationship. FIG. 3 is a schematic device cross-sectional view (medium withstanding voltage MISFET and medium withstanding voltage capacitor element) for explaining the structure of the main portion cross section of FIG. 1 focusing on the potential relationship. FIG. 4 is a more specific device cross-sectional view of an N-channel type low withstanding voltage MISFET and the periphery shown in FIG. 2. FIG. 5 is a more specific device cross-sectional view of a P-channel type low withstanding voltage MISFET and the periphery shown in FIG. 2. FIG. 6 is a more specific device cross-sectional view of an N-channel type medium withstanding voltage MISFET and the periphery shown in FIG. 3. FIG. 7 is a more specific device cross-sectional view of a P-channel type medium withstanding voltage MISFET and the periphery shown in FIG. 3. FIG. 8 is a more specific device cross-sectional view of an N-type medium withstanding voltage MIS capacitor and the periphery shown in FIG. 3. FIG. 9 is a device cross-sectional view showing a structure after forming up to a first-layer metal wiring in a portion of FIG. 8. FIG. 10 is a more specific device cross-sectional view of a P-type medium withstanding voltage MIS capacitor and the periphery shown in FIG. 3. FIG. 11 is a broad device cross-sectional view showing the specific structure around the high withstanding voltage MISFET and the medium withstanding voltage MIS capacitor shown in FIGS. 2 and 3. With reference to these diagrams, a CMIS integrated circuit device and the like that are an example of the chip layout and an example of the main portion device structure in the semiconductor integrated circuit device according to the embodiments of this application will be described.

First, an example of the layout of an integrated circuit chip will be described with reference to FIG. 1. Here, an example of an LCD driver chip will be described as a specific example. As shown in FIG. 1, for example, power supply circuits PC1 and PC2, such as a high voltage generating circuit, are provided on the top surface 1a (first main surface) of a semiconductor chip 2. From the power supply circuits PC1 and PC2, a power supply voltage and a reference voltage (for example, about 15 V, about 5 V, about 3 V, about 1 V, and about −15 V) that are used for other target circuits are supplied. The power supply circuit referred to herein includes a circuit that generates all desired potentials from a single power supply voltage (for example, about 3 V) and a circuit that supplies several potentials from the outside. On the top surface 1a of the semiconductor chip 2, an input circuit IC for inputting a display data signal of an image, a character, a figure, and the like is provided. These data pieces are transmitted to graphic RAM circuits GR1 and GR2 through a logic circuit LC, for example. The data of the graphic RAM circuits GR1 and GR2 is transmitted to a gate driver circuit GD (output circuit 1) or a source driver circuit SD (output circuit 2) as desired. Here, examples of the voltage range to be treated are as follows. That is, the voltage range of the power supply circuits PC1 and PC2 is, for example, about −15 V to about +15 V. The voltage range of the logic circuit LC is, for example, about 0 V to about 1.2 V (for example, corresponding to a low withstanding voltage circuit region, such as low withstanding voltage MISFET forming regions Rnl and Rpl shown in FIG. 2). The voltage range of the input circuit IC and the source driver circuit SD is, for example, about 0 V to about 6 V (or about 3.5 V) (for example, corresponding to a medium voltage circuit region, such as medium withstanding voltage MISFET forming regions Rnm and Rpm, and medium withstanding voltage MIS capacitor forming regions Rcn and Rcp shown in FIG. 3). On the other hand, the voltage range of the gate driver circuit GD is, for example, about −15 V to about +15 V (for example, corresponding to a high voltage circuit region, such as high withstanding voltage MISFET forming regions Rnh and Rph shown in FIG. 2). These are examples, and the type, value, range, and the like of the power supply voltage can be variously changed according to the generation of the product, external device (display device), and the like.

Next, the schematic sectional structure of portions, which form various circuits in a chip 2 shown in FIG. 1, will be described with reference to FIGS. 2 and 3. In order to prevent a situation where the diagrams become excessively horizontally long and accordingly the visibility is lowered, explanation will be given by dividing the cross section of one chip into two parts. That is, FIG. 2 shows a high voltage circuit region corresponding to, for example, the gate driver circuit GD and a low voltage circuit region corresponding to, for example, the logic circuit LC, and FIG. 3 shows a medium voltage circuit region corresponding to, for example, the source driver circuit SD and the input circuit IC.

As shown in FIG. 2, in the P-channel type high withstanding voltage MISFET forming region Rph, an N-type high withstanding voltage well region Wnh for forming a P-channel type high withstanding voltage MISFET (Qph) is provided on the top surface 1a (on a semiconductor surface located on the opposite side to a bottom surface 1b) of a P-type silicon single-crystal substrate 1s (semiconductor substrate portion). Since the N-type high withstanding voltage well region Wnh is an N type, the effect of electrical isolation from the P-type substrate is obtained. A P-type high withstanding voltage source drain region 5ph of the P-channel type high withstanding voltage MISFET (Qph) is provided in a surface region of the N-type high withstanding voltage well region Wnh. In addition, an $N^+$-type contact region 6n for contact between the N-type high withstanding voltage well region Wnh and a high withstanding voltage power supply Vddh (for example, about 15 V) is provided in the surface region of the N-type high withstanding voltage well region Wnh. On the top surface 1a of a semiconductor substrate 2 between the P-type high withstanding voltage source drain regions 5ph, a gate electrode film, such as a P-type poly-Si gate electrode 4p, is provided with a high withstanding voltage gate insulating film 3h interposed therebetween, for example.

Similarly, as shown in FIG. 2, in the N-channel type high withstanding voltage MISFET forming region Rnh, a P-type high withstanding voltage well region Wph for forming an N-channel type high withstanding voltage MISFET (Qnh) is provided on the top surface 1a (on the semiconductor surface located on the opposite side to the bottom surface 1b) of the P-type silicon single-crystal substrate 1s (semiconductor substrate portion). Since the P-type high withstanding voltage well region Wph is the same conduction type as the substrate, the P-type high withstanding voltage well region Wph can be omitted when other characteristics are allowed. However, when the P-type high withstanding voltage well region Wph is present, the degree of freedom of control of the characteristics of the N-channel type high withstanding voltage MISFET, process selection, and the like is improved. An N-type high withstanding voltage source drain region 5nh of the N-channel type high withstanding voltage MISFET (Qnh) is provided in a surface region of the P-type high withstanding voltage well region Wph. In addition, a $P^+$-type contact region 6p for contact between the P-type high withstanding voltage well region Wph and a high withstanding voltage power supply Vssh (for example, about −15 V) is provided in the surface region of the P-type high withstanding voltage well region Wph. On the top surface 1a of the semiconductor substrate 2 between the N-type high withstanding voltage source drain regions 5nh, a gate electrode film, such as an N-type poly-Si gate electrode 4n, is provided with the high withstanding voltage gate insulating film 3h interposed therebetween, for example. Here, the impurity concentration of the P-type high withstanding voltage well region Wph is higher than the impurity concentration of the semiconductor substrate portion 1s.

As shown in FIG. 2, in the P-channel type low withstanding voltage MISFET forming region Rpl and an N-channel type low withstanding voltage MISFET forming region Rnl, in this example, in both the regions on the top surface 1a of the semiconductor substrate 2, the N-type high withstanding voltage well region Wnh is provided. In addition, the $N^+$-type contact region 6n for contact between the N-type high withstanding voltage well region Wnh and a low withstanding voltage power supply Vddl (for example, about 1 V) is provided in the surface region of the N-type high withstanding voltage well region Wnh.

In addition, as shown in FIG. 2, in the P-channel type low withstanding voltage MISFET forming region Rpl, an N-type low withstanding voltage well region Wnl that is provided to form a P-channel type low withstanding voltage MISFET (Qpl) and has a higher impurity concentration than the N-type high withstanding voltage well region Wnh is provided on the top surface 1a of the semiconductor substrate 2. In this example, the depth of the N-type low withstanding voltage well region Wnl is smaller than the depth of the N-type high withstanding voltage well region Wnh. A P-type low withstanding voltage source drain region 5pl of the P-channel type low withstanding voltage MISFET (Qpl) is provided in a surface region of the N-type low withstanding voltage well region Wnl. In addition, the $N^+$-type contact region 6n for contact between the N-type low withstanding voltage well region Wnl and the low withstanding voltage power supply Vddl (for example, about 1 V) is provided in the surface region of the N-type low withstanding voltage well region Wnl. On the top surface 1a of the semiconductor substrate 2 between the P-type low withstanding voltage source drain regions 5pl, a gate electrode film, such as the P-type poly-Si gate electrode 4p, is provided with a low withstanding voltage gate insulating film 3l interposed therebetween, for example.

Similarly, as shown in FIG. 2, in the N-channel type low withstanding voltage MISFET forming region Rnl, a P-type low withstanding voltage well region Wpl that is provided to form an N-channel type low withstanding voltage MISFET (Qnl) and has a higher impurity concentration than the P-type high withstanding voltage well region Wph is provided on the top surface 1a of the semiconductor substrate 2. In this example, the depth of the P-type low withstanding voltage well region Wpl is smaller than the depths of the P-type high withstanding voltage well region Wph and the N-type high withstanding voltage well region Wnh. An N-type low withstanding voltage source drain region 5nl of the N-channel type low withstanding voltage MISFET (Qnl) is provided in a surface region of the P-type low withstanding voltage well region Wpl. In addition, the P⁺-type contact region 6p for contact between the P-type low withstanding voltage well region Wpl and a medium-withstanding voltage reference voltage Vssm (that is, a low withstanding voltage reference voltage; for example, 0 V) is provided in the surface region of the P-type low withstanding voltage well region Wpl. That is, in this example, the reference voltage of the low withstanding voltage circuit and the reference voltage of the medium withstanding voltage circuit are the same electric potential. On the top surface 1a of the semiconductor substrate 2 between the N-type low withstanding voltage source drain regions 5nl, a gate electrode film, such as the N-type poly-Si gate electrode 4n, is provided with the low withstanding voltage gate insulating film 31 interposed therebetween, for example.

As shown in FIG. 3, in the P-channel type medium withstanding voltage MISFET forming region Rpm and an N-channel type medium withstanding voltage MISFET forming region Rnm, in this example, in both the regions on the top surface 1a of the semiconductor substrate 2, the N-type high withstanding voltage well region Wnh is provided. In addition, the N⁺-type contact region 6n for contact between the N-type high withstanding voltage well region Wnh and a medium withstanding voltage power supply Vddm (for example, about 5 V) is provided in the surface region of the N-type high withstanding voltage well region Wnh.

In addition, as shown in FIG. 3, in the P-channel type medium withstanding voltage MISFET forming region Rpm, an N-type medium withstanding voltage well region Wnm that is provided to form a P-channel type medium withstanding voltage MISFET (Qpm) and has a higher impurity concentration than the N-type high withstanding voltage well region Wnh is provided on the top surface 1a of the semiconductor substrate 2. In this example, the depth of the N-type medium withstanding voltage well region Wnm is smaller than the depth of the N-type high withstanding voltage well region Wnh. A P-type medium withstanding voltage source drain region 5pm of the P-channel type medium withstanding voltage MISFET (Qpm) is provided in a surface region of the N-type medium withstanding voltage well region Wnm. In addition, the N⁺-type contact region 6n for contact between the N-type medium withstanding voltage well region Wnm and a medium withstanding voltage power supply Vddm (for example, about 5 V) is provided in the surface region of the N-type medium withstanding voltage well region Wnm. On the top surface 1a of the semiconductor substrate 2 between the P-type medium withstanding voltage source drain regions 5pm, a gate electrode film, such as a P-type poly-Si gate electrode 4p, is provided with a medium withstanding voltage gate insulating film 3m interposed therebetween, for example.

Similarly, as shown in FIG. 3, in the N-channel type medium withstanding voltage MISFET forming region Rnm, a P-type medium withstanding voltage well region Wpm that is provided to form an N-channel type medium withstanding voltage MISFET (Qnm) and has a higher impurity concentration than the P-type high withstanding voltage well region Wph is provided on the top surface 1a of the semiconductor substrate 2. In this example, the depth of the P-type medium withstanding voltage well region Wpm is smaller than the depth of the P-type high withstanding voltage well region Wph. An N-type medium withstanding voltage source drain region 5nm of the N-channel type medium withstanding voltage MISFET (Qnm) is provided in a surface region of the P-type medium withstanding voltage well region Wpm. In addition, the P⁺-type contact region 6p for contact between the P-type medium withstanding voltage well region Wpm and the medium-withstanding voltage reference voltage Vssm (for example, about 0 V) is provided in the surface region of the P-type medium withstanding voltage well region Wpm. On the top surface 1a of the semiconductor substrate 2 between the N-type medium withstanding voltage source drain regions 5nm, a gate electrode film, such as the N-type poly-Si gate electrode 4n, is provided with the medium withstanding voltage gate insulating film 3m interposed therebetween, for example.

In addition, as shown in FIG. 3, in the N-type medium withstanding voltage MIS capacitor forming region Rcn, an N-type high withstanding voltage well region Wnh for forming an N-type medium withstanding voltage MIS capacitor Cn is provided on the top surface 1a of the semiconductor substrate 2. An N-type low withstanding voltage well region Wnl for forming the N-type medium withstanding voltage MIS capacitor Cn is further provided in a surface region of the N-type high withstanding voltage well region Wnh. An N-type capacitor electrode extraction region 15nm of the N-type medium withstanding voltage MIS capacitor Cn is provided in a surface region of the N-type low withstanding voltage well region Wnl. On the top surface 1a of the semiconductor substrate 2 between the N-type capacitor electrode extraction regions 15nm, an off-board capacitor electrode, such as an N-type poly-Si capacitor electrode 14n, is provided with a medium withstanding voltage capacitor insulating film 10m (capacitor insulating film using a medium withstanding voltage gate insulating film) interposed therebetween, for example. Thus, since the well region is formed of the N-type low withstanding voltage well region Wnl having a high impurity concentration instead of the N-type medium withstanding voltage well region Wnm, it is possible to secure the characteristic of less voltage dependence by the good accumulation mode over a wide range. In addition, since the poly-Si capacitor electrode is formed of the N-type poly-Si capacitor electrode 14n, it is possible to obtain the same effect. In addition, since both terminals of the capacitor element are not fixed to the power supply potential or the ground potential, not only can application as a bypass capacitor be made, but also other applications (for example, a compensation capacitor of the negative feedback circuit and a coupling capacitor of the multi-stage amplifier circuit) are possible. This is because the N-type high withstanding voltage well region Wnh (N-type low withstanding voltage well region Wnl) of the N-type medium withstanding voltage MIS capacitor forming region Rcn and the other N-type high withstanding voltage well region Wnh (for example, the N-type high withstanding voltage well region Wnh of the P-type medium withstanding voltage MIS capacitor forming region Rcp) are geometrically (electrically and potentially) separated from each other. When there is no such need, they may be formed in the common N-type high withstanding voltage well region Wnh.

Similarly, as shown in FIG. 3, in the P-type medium withstanding voltage MIS capacitor forming region Rcp, an N-type high withstanding voltage well region Wnh for forming a P-type medium withstanding voltage MIS capacitor Cp is provided on the top surface 1a of the semiconductor substrate 2. A P-type low withstanding voltage well region Wpl for forming the P-type medium withstanding voltage MIS capacitor Cp is further provided in a surface region of the N-type high withstanding voltage well region Wnh. Here, the N-type high withstanding voltage well region Wnh also serves to electrically separate the P-type low withstanding voltage well region Wpl from the semiconductor substrate portion 1s, and the N⁺-type contact region 6n for contact with the medium withstanding voltage power supply Vddm is provided in a surface region of the N-type high withstanding voltage well region Wnh. A P-type capacitor electrode extraction region 15*pm* of the P-type medium withstanding voltage MIS capacitor Cp is provided in a surface region of the P-type low withstanding voltage well region Wpl. On the top surface 1*a* of the semiconductor substrate 2 between the P-type capacitor electrode extraction regions 15*pm*, an off-board capacitor electrode, such as a P-type poly-Si capacitor electrode 14*p*, is provided with the medium withstanding voltage capacitor insulating film 10*m* (capacitor insulating film using a medium withstanding voltage gate insulating film) interposed therebetween, for example. Thus, since the well region is formed of the P-type low withstanding voltage well region Wpl having a high impurity concentration instead of the P-type medium withstanding voltage well region Wpm, it is possible to secure the characteristic of less voltage dependence by the good accumulation mode over a wide range. In addition, since the poly-Si capacitor electrode is formed of the P-type poly-Si capacitor electrode 14*p*, it is possible to obtain the same effect. In the same manner as described above, since both terminals of the capacitor element are not fixed to the power supply potential or the ground potential, not only can application as a bypass capacitor be made, but also other applications (for example, a compensation capacitor of the negative feedback circuit and a coupling capacitor of the multi-stage amplifier circuit) are possible.

Next, the details of the peripheral cross section (N-channel type low withstanding voltage MISFET forming region Rnl) of the N-channel type low withstanding voltage MISFET (Qnl) in FIG. 2 are illustrated in FIG. 4 for the sake of explanation. Hereinafter, those described in FIG. 2 will not be repeated in principle (the same hereinbelow). As shown in FIG. 4, the surface region of the P-type low withstanding voltage well region Wpl of the top surface 1*a* of the semiconductor substrate 2 is divided into a plurality of regions by an STI region 11 (element isolation insulating film). The plurality of regions includes the $P^+$-type contact region 6*p* for contact of the P-type low withstanding voltage well region Wpl, and an N-type low withstanding voltage source drain extension region 8*nl* of the N-channel type low withstanding voltage MISFET (Qnl) is provided in the other regions. An $N^+$-type source drain region 7*n* is provided in a surface region of the N-type low withstanding voltage source drain extension region 8*nl*. In this example, the N-type low withstanding voltage source drain region 5*nl* shown in FIG. 2 is formed by the N-type low withstanding voltage source drain extension region 8*nl*, the $N^+$-type source drain region 7*n*, and the like.

On the top surface 1*a* of the semiconductor substrate 2 between the N-type low withstanding voltage source drain extension regions 8*nl*, the N-type poly-Si gate electrode 4*n* is provided with the low withstanding voltage gate insulating film 31 interposed therebetween, for example. On the top surface 1*a* of the semiconductor substrate 2 around the N-type poly-Si gate electrode 4*n*, for example, a sidewall spacer insulating film 12 is provided. In a channel region below the low withstanding voltage gate insulating film 31 (P-type semiconductor region below the vicinity of the low withstanding voltage gate insulating film 31), a P-type doped region for threshold voltage adjustment Dpq is provided as desired. The impurity concentration of the P-type doped region for threshold voltage adjustment Dpq is higher than the impurity concentration of a P-type semiconductor region (P-type low withstanding voltage well region Wpl) near the P-type doped region for threshold voltage adjustment Dpq. In addition, on the upper surface of the N-type poly-Si gate electrode 4*n*, a silicide film on a gate 9*g* (for example, a cobalt silicide film) is provided as desired. On the upper surfaces of the $N^+$-type source drain region 7*n*, the $P^+$-type contact region 6*p*, and the like, a silicide film on a substrate 9*s* is provided.

Next, the details of the peripheral cross section (P-channel type low withstanding voltage MISFET forming region Rpl) of the P-channel type low withstanding voltage MISFET (Qpl) in FIG. 2 are illustrated in FIG. 5 for the sake of explanation. As shown in FIG. 5, the surface region of the N-type low withstanding voltage well region Wnl of the top surface 1*a* of the semiconductor substrate 2 is divided into a plurality of regions by the STI region 11 (element isolation insulating film). The plurality of regions includes the $N^+$-type contact region 6*n* for contact of the N-type low withstanding voltage well region Wnl, and a P-type low withstanding voltage source drain extension region 8*pl* of the P-channel type low withstanding voltage MISFET (Qpl) is provided in the other regions. A $P^+$-type source drain region 7*p* is provided in a surface region of the P-type low withstanding voltage source drain extension region 8*pl*. In this example, the P-type low withstanding voltage source drain region 5*pl* shown in FIG. 2 is formed by the P-type low withstanding voltage source drain extension region 8*pl*, the $P^+$-type source drain region 7*p*, and the like.

On the top surface 1*a* of the semiconductor substrate 2 between the P-type low withstanding voltage source drain extension regions 8*pl*, the P-type poly-Si gate electrode 4*p* is provided with the low withstanding voltage gate insulating film 31 interposed therebetween, for example. On the top surface 1*a* of the semiconductor substrate 2 around the P-type poly-Si gate electrode 4*p*, for example, the sidewall spacer insulating film 12 is provided. In a channel region below the low withstanding voltage gate insulating film 31 (N-type semiconductor region below the vicinity of the low withstanding voltage gate insulating film 31), an N-type doped region for threshold voltage adjustment Dnq is provided as desired. The impurity concentration of the N-type doped region for threshold voltage adjustment Dnq is higher than the impurity concentration of an N-type semiconductor region (N-type low withstanding voltage well region Wnl) near the N-type doped region for threshold voltage adjustment Dnq. In addition, on the upper surface of the P-type poly-Si gate electrode 4*p*, the silicide film on a gate 9*g* (for example, a cobalt silicide film) is provided as desired. On the upper surfaces of the $P^+$-type source drain region 7*p*, the $N^+$-type contact region 6*n*, and the like, a silicide film on a substrate 9*s* is provided.

Next, the details of the peripheral cross section (N-channel type medium withstanding voltage MISFET forming region Rnm) of the N-channel type medium withstanding voltage MISFET (Qnm) in FIG. 3 are illustrated in FIG. 6 for the sake of explanation. As shown in FIG. 6, the surface region of the P-type medium withstanding voltage well region Wpm of the top surface 1*a* of the semiconductor substrate 2 is divided into a plurality of regions by the STI region 11 (element isolation insulating film). The plurality of regions includes the $P^+$-type contact region 6*p* for contact of the P-type medium withstanding voltage well region Wpm, and an N-type medium withstanding voltage source drain extension region 8*nm* of the N-channel type medium withstanding voltage MISFET (Qnm) is provided in the other regions. An $N^+$-type source drain region 7*n* is provided in a surface region of the N-type medium withstanding voltage source drain extension region 8*nm*. In this example, the N-type medium withstanding voltage source drain region 5*nm* shown in FIG. 3 is formed by the N-type medium withstanding voltage source drain extension region 8*nm*, the $N^+$-type source drain region 7*n*, and the like.

On the top surface 1*a* of the semiconductor substrate 2 between the N-type medium withstanding voltage source drain extension regions 8nm, the N-type poly-Si gate electrode 4n is provided with the medium withstanding voltage gate insulating film 3m interposed therebetween, for example. On the top surface 1a of the semiconductor substrate 2 around the N-type poly-Si gate electrode 4n, for example, the sidewall spacer insulating film 12 is provided. In addition, on the upper surface of the N-type poly-Si gate electrode 4n, the silicide film on a gate 9g (for example, a cobalt silicide film) is provided as desired. On the upper surfaces of the N$^+$-type source drain region 7n, the P$^+$-type contact region 6p, and the like, a silicide film on a substrate 9s is provided.

Next, the details of the peripheral cross section (P-channel type medium withstanding voltage MISFET forming region Rpm) of the P-channel type medium withstanding voltage MISFET (Qpm) in FIG. 3 are illustrated in FIG. 7 for the sake of explanation. As shown in FIG. 7, the surface region of the N-type medium withstanding voltage well region Wnm of the top surface 1a of the semiconductor substrate 2 is divided into a plurality of regions by the STI region 11 (element isolation insulating film). The plurality of regions includes the N$^+$-type contact region 6n for contact of the N-type medium withstanding voltage well region Wnm, and a P-type medium withstanding voltage source drain extension region 8pm of the P-channel type medium withstanding voltage MISFET (Qpm) is provided in the other regions. A P$^+$-type source drain region 7p is provided in a surface region of the P-type medium withstanding voltage source drain extension region 8pm. In this example, the P-type medium withstanding voltage source drain region 5pm shown in FIG. 3 is formed by the P-type medium withstanding voltage source drain extension region 8pm, the P$^+$-type source drain region 7p, and the like.

On the top surface 1a of the semiconductor substrate 2 between the P-type medium withstanding voltage source drain extension regions 8pm, the P-type poly-Si gate electrode 4p is provided with the medium withstanding voltage gate insulating film 3m interposed therebetween, for example. On the top surface 1a of the semiconductor substrate 2 around the P-type poly-Si gate electrode 4p, for example, the sidewall spacer insulating film 12 is provided. In addition, on the upper surface of the P-type poly-Si gate electrode 4p, the silicide film on a gate 9g (for example, a cobalt silicide film) is provided as desired. On the upper surfaces of the P$^+$-type source drain region 7p, the N$^+$-type contact region 6n, and the like, a silicide film on a substrate 9s is provided.

Next, the details of the peripheral cross section (N-type medium withstanding voltage MIS capacitor forming region Rcn) of the N-type medium withstanding voltage MIS capacitor Cn in FIG. 3 are illustrated in FIG. 8 for the sake of explanation. As shown in FIG. 8, the surface region of the N-type low withstanding voltage well region Wnl of the top surface 1a of the semiconductor substrate 2 is divided into a plurality of regions by the STI region 11 (element isolation insulating film). The plurality of regions includes the N$^+$-type contact region 6n (which also serves as an extraction region of the capacitor) for contact of the N-type low withstanding voltage well region Wnl, and an N-type doped region around a capacitor electrode extraction portion 18nm of the N-type medium withstanding voltage MIS capacitor Cn is provided in the other regions. The N$^+$-type contact region 6n (which also serves as an extraction region of the capacitor) is provided in the surface region of the N-type doped region around a capacitor electrode extraction portion 18nm. In this example, the N-type capacitor electrode extraction region 15nm shown in FIG. 3 is formed by the N-type doped region around a capacitor electrode extraction portion 18nm, the N$^+$-type contact region 6n, and the like.

On the top surface 1a of the semiconductor substrate 2 between the N-type doped regions around a capacitor electrode extraction portion 18nm, an N-type poly-Si capacitor electrode 14n (off-board capacitor electrode) is provided with the medium withstanding voltage capacitor insulating film 10m (capacitor insulating film using a medium withstanding voltage gate insulating film) interposed therebetween, for example. On the top surface 1a of the semiconductor substrate 2 around the N-type poly-Si capacitor electrode 14n, for example, the sidewall spacer insulating film 12 is provided. In addition, on the upper surface of the N-type poly-Si capacitor electrode 14n, the silicide film on a gate 9g (for example, a cobalt silicide film) is provided as desired. On the upper surfaces of the N$^+$-type contact region 6n, a silicide film on a substrate 9s is provided. In a channel region below the medium withstanding voltage capacitor insulating film 10m (N-type semiconductor region below the vicinity of the medium withstanding voltage capacitor insulating film 10m, one electrode of the capacitor), a capacitor N-type doped region Dnc is provided as desired. The impurity concentration of the capacitor N-type doped region Dnc is higher than an N-type semiconductor region (N-type low withstanding voltage well region Wnl) near the capacitor N-type doped region Dnc. In this example, the capacitor N-type doped region Dnc is formed simultaneously with the N-type doped region for threshold voltage adjustment Dnq. Thus, since the capacitor N-type doped region Dnc is provided, it is possible to secure the characteristic of less voltage dependence by the good accumulation mode over a wide range.

Next, in order to illustrate the outline of the upper structure from the semiconductor substrate shown in FIGS. 4 to 8 and 10 (the same for FIG. 30), the outline of the cross-sectional structure including the upper part of the semiconductor substrate in FIG. 8 is shown in FIG. 9 as a representation. As shown in FIG. 9, on the top surface 1a of the semiconductor substrate 2, for example, a silicon nitride based etch-stop insulating film 21 (part of the pre-metal insulating film) is formed so as to cover the gate structure. On the silicon nitride based etch-stop insulating film 21, a silicon oxide based pre-metal insulating film 22 that is thicker than the silicon nitride based etch-stop insulating film 21 is formed. A large number of tungsten plugs 23 are embedded in the pre-metal insulating films. On the pre-metal insulating film, for example, a metal first-layer wiring, such as an aluminum based metal first-layer wiring 25 (non-embedded wiring), is formed. On the pre-metal insulating film, the first-layer wiring interlayer insulating film 24 is further formed so as to cover the aluminum based metal first-layer wiring 25. On these layers, a multilayer wiring (for example, an aluminum based pad layer wiring is included), a gold bump electrode formed on an aluminum based pad with the under bump metal (UBM) interposed therebetween, or the like is formed as desired.

Next, the details of the peripheral cross section (P-type medium withstanding voltage MIS capacitor forming region Rcp) of the P-type medium withstanding voltage MIS capacitor Cp in FIG. 3 are illustrated in FIG. 10 for the sake of explanation. As shown in FIG. 10, the surface region of the P-type low withstanding voltage well region Wpl of the top surface 1a of the semiconductor substrate 2 is divided into a plurality of regions by an STI region 11 (element isolation insulating film). The plurality of regions includes the P$^+$-type contact region 6p (which also serves as an extraction region of the capacitor) for contact of the P-type low withstanding voltage well region Wpl, and a P-type doped region around a capacitor electrode extraction portion 18pm of the P-type medium withstanding voltage MIS capacitor Cp is provided in the other regions. The P⁺-type contact region 6p (which also serves as an extraction region of the capacitor) is provided in the surface region of the P-type doped region around a capacitor electrode extraction portion 18pm. In this example, the P-type capacitor electrode extraction region 15pm shown in FIG. 3 is formed by the P-type doped region around a capacitor electrode extraction portion 18pm, the P⁺-type contact region 6p, and the like.

On the top surface 1a of the semiconductor substrate 2 between the P-type doped regions around a capacitor electrode extraction portion 18pm, a P-type poly-Si capacitor electrode 14p (off-board capacitor electrode) is provided with the medium withstanding voltage capacitor insulating film 10m (capacitor insulating film using a medium withstanding voltage gate insulating film) interposed therebetween, for example. On the top surface 1a of the semiconductor substrate 2 around the P-type poly-Si capacitor electrode 14p, for example, the sidewall spacer insulating film 12 is provided. In addition, on the upper surface of the P-type poly-Si capacitor electrode 14p, the silicide film on a gate 9g (for example, a cobalt silicide film) is provided as desired. On the upper surfaces of the P⁺-type contact region 6p, a silicide film on a substrate 9s is provided. In a channel region below the medium withstanding voltage capacitor insulating film 10m (P-type semiconductor region below the vicinity of the medium withstanding voltage capacitor insulating film 10m, one electrode of the capacitor), a capacitor P-type doped region Dpc is provided as desired. The impurity concentration of the capacitor P-type doped region Dpc is higher than the impurity concentration of a P-type semiconductor region (P-type low withstanding voltage well region Wpl) near the capacitor P-type doped region Dpc. In this example, the capacitor P-type doped region Dpc is formed simultaneously with the P-type doped region for threshold voltage adjustment Dpq. Thus, since the capacitor P-type doped region Dpc is provided, it is possible to secure the characteristic of less voltage dependence by the good accumulation mode over a wide range.

Next, corresponding to FIGS. 2 and 3, a device cross section embodied in the same manner as FIGS. 4 to 8 and 10 is shown in FIG. 11. Here, due to the width in the horizontal direction, only a high withstanding voltage FET (corresponding to a part of FIG. 2) and a medium withstanding voltage capacitor (corresponding to a part of FIG. 3) are shown, and the detailed structure of a part is simplified (detailed structure has been described in FIGS. 4 to 8 and 10). In the same manner as described above, those described already in FIGS. 2 to 8 and 10 and the like will not be repeated in principle. As shown in FIG. 11, in the P-channel type high withstanding voltage MISFET forming region Rph, the N-type high withstanding voltage well region Wnh for forming the P-channel type high withstanding voltage MISFET (Qph) is provided on the top surface 1a of the P-type silicon single-crystal substrate 1s. A P-type high withstanding voltage source drain extension region 28p of the P-channel type high withstanding voltage MISFET (Qph) is provided in a surface region of the N-type high withstanding voltage well region Wnh. A P⁺-type source drain region 7p is provided on the top surface side of the P-type high withstanding voltage source drain extension region 28p. In addition, an N⁺-type contact region 6n for contact between the N-type high withstanding voltage well region Wnh and the high withstanding voltage power supply Vddh (for example, about 15 V) is provided in the surface region of the N-type high withstanding voltage well region Wnh. On the top surface 1a of the semiconductor substrate 2 between the P-type high withstanding voltage source drain extension regions 28p, a gate electrode film, such as the P-type poly-Si gate electrode 4p, is provided with the high withstanding voltage gate insulating film 3h interposed therebetween, for example. Although optional, in this example, the P-type high withstanding voltage source drain extension region 28p is formed simultaneously with the P-type medium withstanding voltage well region Wpm in FIG. 6 and the like in terms of process efficiency.

Similarly, as shown in FIG. 11, in the N-channel type high withstanding voltage MISFET forming region Rnh, the P-type high withstanding voltage well region Wph for forming the N-channel type high withstanding voltage MISFET (Qnh) is provided on the top surface 1a of the P-type silicon single-crystal substrate 1s. An N-type high withstanding voltage source drain extension region 28n of the N-channel type high withstanding voltage MISFET (Qnh) is provided in a surface region of the P-type high withstanding voltage well region Wph. An N⁺-type source drain region 7n is provided on the top surface side of the N-type high withstanding voltage source drain extension region 28n. In addition, a P⁺-type contact region 6p for contact between the P-type high withstanding voltage well region Wph and the high withstanding voltage power supply Vssh (for example, about −15 V) is provided in the surface region of the P-type high withstanding voltage well region Wph. On the top surface 1a of the semiconductor substrate 2 between the N-type high withstanding voltage source drain extension regions 28n, a gate electrode film, such as an N-type poly-Si gate electrode 4n, is provided with the high withstanding voltage gate insulating film 3h interposed therebetween, for example. Here, the impurity concentration of the P-type high withstanding voltage well region Wph is higher than the impurity concentration of the semiconductor substrate portion 1s. Although optional, in this example, the N-type high withstanding voltage source drain extension regions 28n are formed simultaneously with the N-type medium withstanding voltage well region Wnm in FIG. 7 and the like in terms of process efficiency.

In addition, as shown in FIG. 11, in the N-type medium withstanding voltage MIS capacitor forming region Rcn, an N-type high withstanding voltage well region Wnh for forming an N-type medium withstanding voltage MIS capacitor Cn is provided on the top surface 1a of the semiconductor substrate 2. An N-type low withstanding voltage well region Wnl for forming the N-type medium withstanding voltage MIS capacitor Cn is further provided in a surface region of the N-type high withstanding voltage well region Wnh. An N-type doped region around a capacitor electrode extraction portion 18nm of the N-type medium withstanding voltage MIS capacitor Cn is provided in a surface region of the N-type low withstanding voltage well region Wnl. The N⁺-type contact region 6n is provided on the top surface side of the N-type doped region around a capacitor electrode extraction portion 18nm and the N-type low withstanding voltage well region Wnl. On the top surface 1a of the semiconductor substrate 2 between the N-type doped regions around a capacitor electrode extraction portion 18nm, an off-board capacitor electrode, such as the N-type poly-Si capacitor electrode 14n, is provided with the medium withstanding voltage capacitor insulating film 10m (capacitor insulating film using a medium withstanding voltage gate insulating film) interposed therebetween, for example. On the top surface 1a of the semiconductor substrate 2 around the N-type poly-Si capacitor electrode 14n, for example, the sidewall spacer insulating film 12 is provided. In addition, on the upper surface of the N-type poly-Si capacitor electrode 14n, the silicide film on a gate 9g (for example, a cobalt silicide film) is provided as desired. On the upper surfaces of the N$^+$-type contact region 6n, a silicide film on a substrate 9s is provided.

Similarly, as shown in FIG. 11, in the P-type medium withstanding voltage MIS capacitor forming region Rcp, an N-type high withstanding voltage well region Wnh for forming a P-type medium withstanding voltage MIS capacitor Cp is provided on the top surface 1a of the semiconductor substrate 2. A P-type low withstanding voltage well region Wpl for forming the P-type medium withstanding voltage MIS capacitor Cp is further provided in a surface region of the N-type high withstanding voltage well region Wnh. A P-type doped region around a capacitor electrode extraction portion 18pm of the P-type medium withstanding voltage MIS capacitor Cp is provided in a surface region of the P-type low withstanding voltage well region Wpl. The P$^+$-type contact region 6p is provided on the top surface side of the P-type doped region around a capacitor electrode extraction portion 18pm and the P-type low withstanding voltage well region Wpl. On the top surface 1a of the semiconductor substrate 2 between the P-type doped regions around a capacitor electrode extraction portion 18pm, an off-board capacitor electrode, such as the P-type poly-Si capacitor electrode 14p, is provided with the medium withstanding voltage capacitor insulating film 10m (capacitor insulating film using a medium withstanding voltage gate insulating film) interposed therebetween, for example. On the top surface 1a of the semiconductor substrate 2 around the P-type poly-Si capacitor electrode 14p, for example, the sidewall spacer insulating film 12 is provided. In addition, on the upper surface of the P-type poly-Si capacitor electrode 14p, the silicide film on a gate 9g (for example, a cobalt silicide film) is provided as desired. On the upper surfaces of the P$^+$-type contact region 6p, a silicide film on a substrate 9s is provided.

2. Explanation of an example of the main process in a method of manufacturing the semiconductor integrated circuit device of the embodiment of this application (refer mainly to FIGS. 12 to 27 together with FIGS. 9 and 11 and the like).

In this section, an example of a method of manufacturing the device structure (as an example) described in section 1 will be described. Therefore, the following manufacturing methods can be applied not only to the device structure of section 1 but also to device structures of modifications and the like almost as it is. Accordingly, in modifications and the like, only different parts will be described in principle without repeating the explanation of this section. The process shown herein is just an example, and process elements, the order, and the like can be changed in various ways.

In the following sections, an example of forming a device on a P-type single-crystal silicon substrate will be specifically described. However, a device can also be formed on an N-type single-crystal silicon substrate, an insulating substrate, and other semiconductor substrates. Similarly, in the following sections, an example will be specifically described in which a deep well region is provided on the top surface of the P-type single-crystal silicon substrate (non-epitaxial substrate), and a shallow well region for forming a MISFET is provided in the deep well region. However, on the P-type single-crystal silicon substrate, for example, using an epitaxial substrate having a P-type epitaxial layer, a shallow well region for forming a MISFET or the like can also be provided in the P-type epitaxial layer. However, the use of a non-epitaxial substrate is advantageous in terms of cost.

Hereinafter, for convenience of explanation, six important regions are extracted from the same chip region of the same wafer (for example, a single-crystal silicon wafer).

Figure 12:
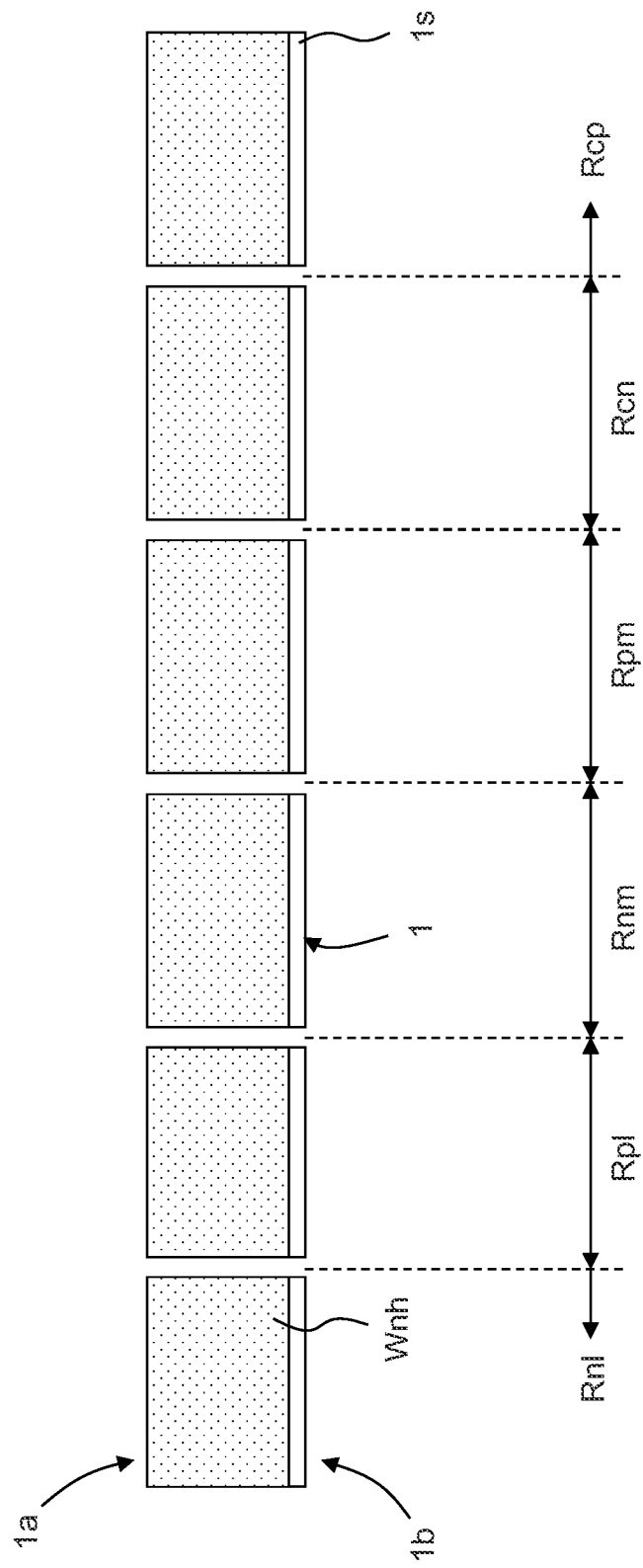
FIG. 12 is a cross-sectional view of each main portion device in a manufacturing process (N-type high withstanding voltage well region introduction step) for explaining an example of the main process in a method of manufacturing the semiconductor integrated circuit device according to an embodiment of this application.
Figure 13:
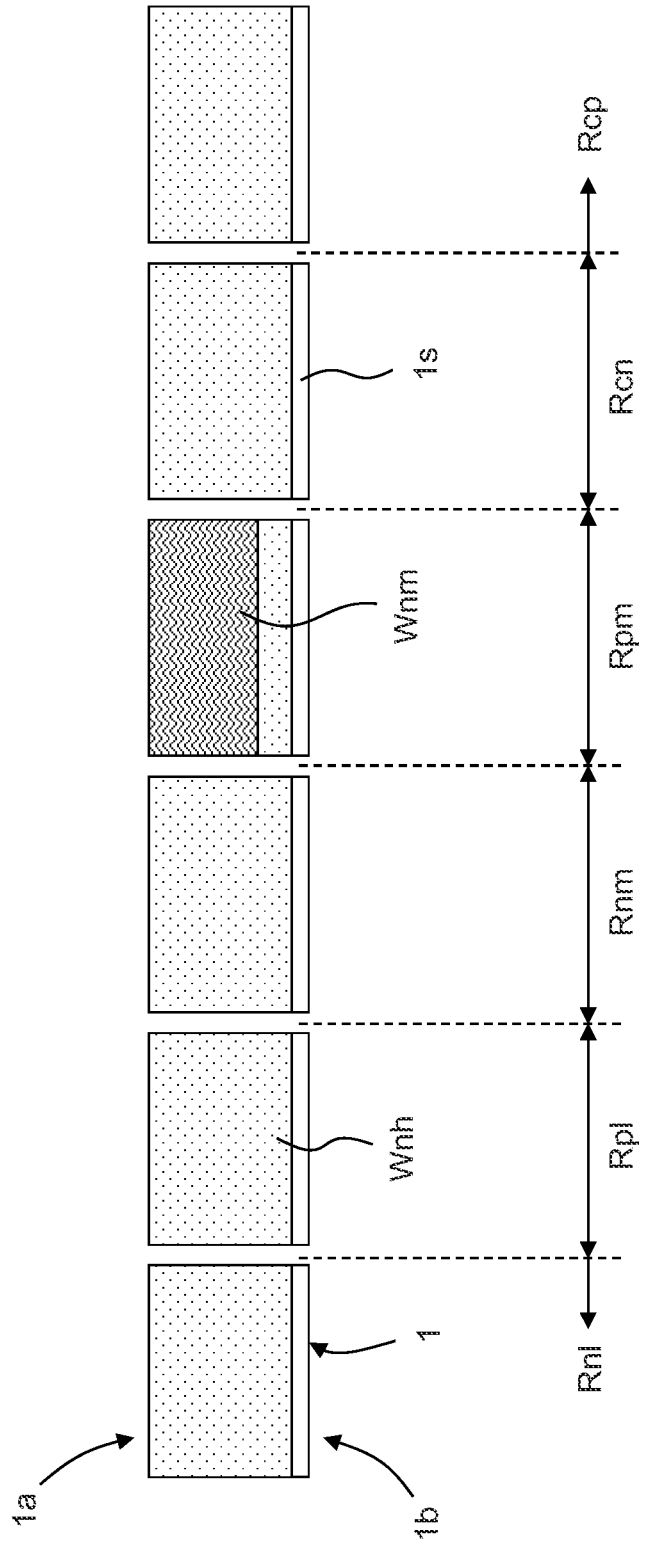
FIG. 13 is a cross-sectional view of each main portion device in a manufacturing process (N-type medium withstanding voltage well region introduction step) for explaining an example of the main process in the method of manufacturing the semiconductor integrated circuit device according to an embodiment of this application.
Figure 14:
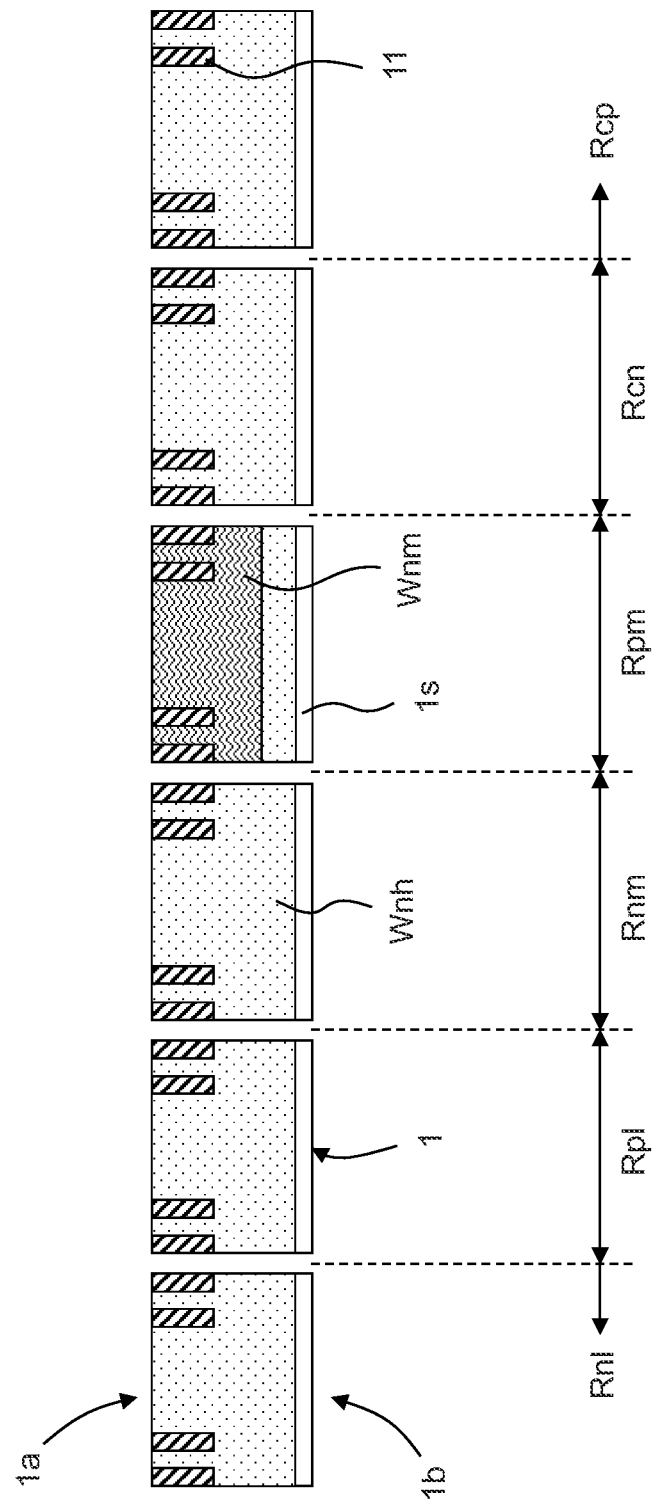
FIG. 14 is a cross-sectional view of each main portion device in a manufacturing process (element isolation region forming step) for explaining an example of the main process in the method of manufacturing the semiconductor integrated circuit device according to an embodiment of this application.
Figure 15:
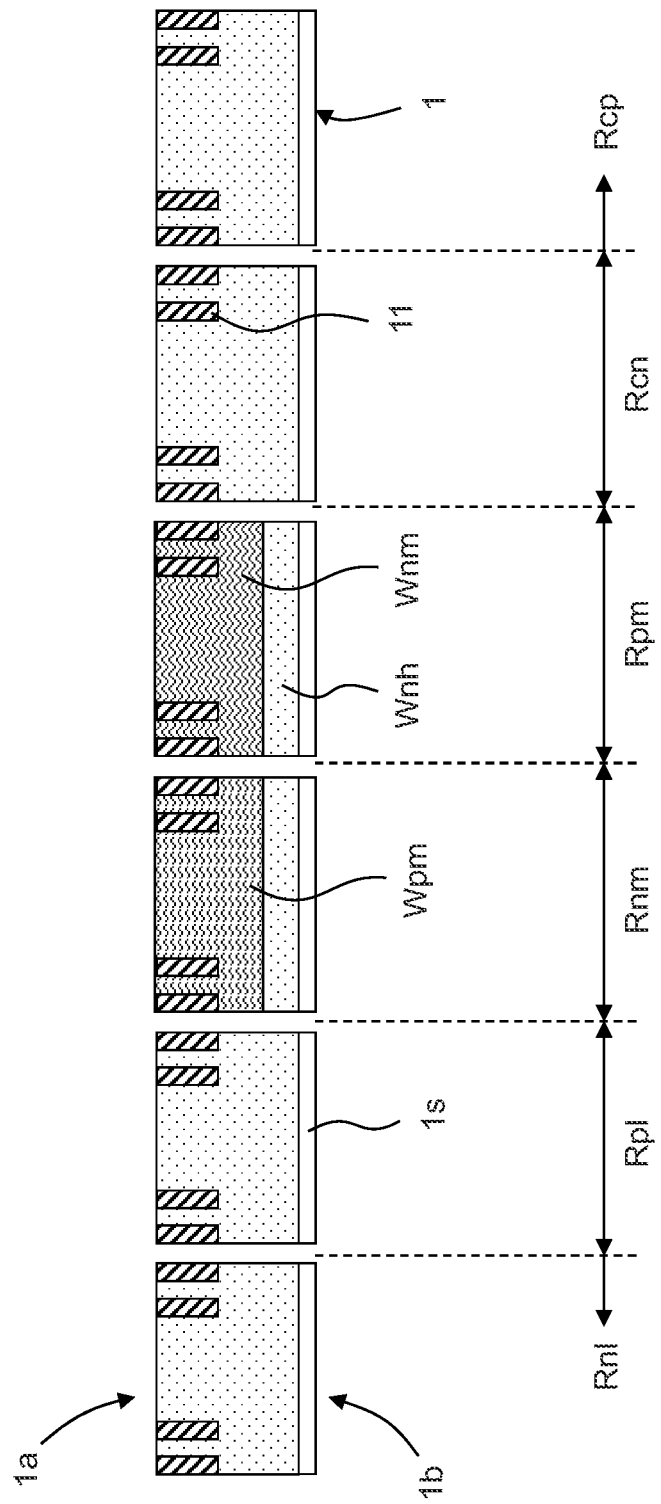
FIG. 15 is a cross-sectional view of each main portion device in a manufacturing process (P-type medium withstanding voltage well region introduction step) for explaining an example of the main process in the method of manufacturing the semiconductor integrated circuit device according to an embodiment of this application.
Figure 16:
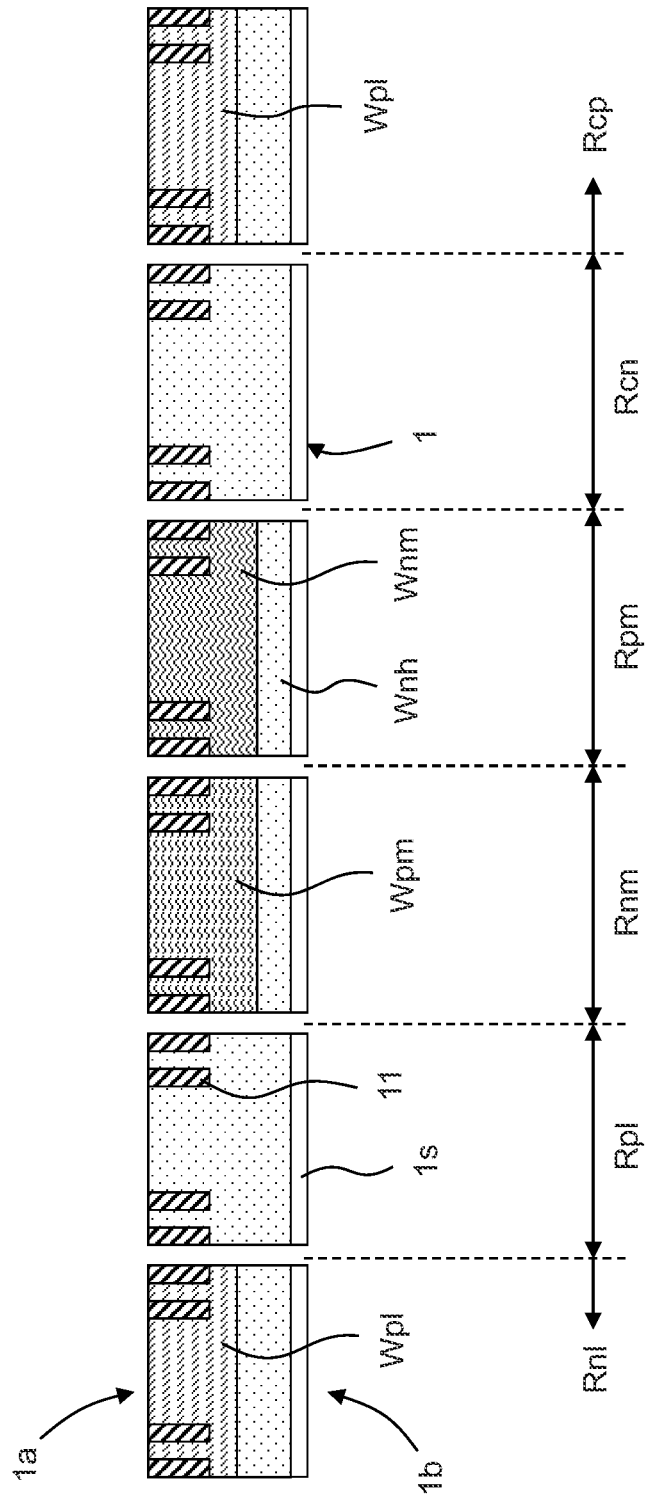
FIG. 16 is a cross-sectional view of each main portion device in a manufacturing process (P-type low withstanding voltage well region introduction step) for explaining an example of the main process in the method of manufacturing the semiconductor integrated circuit device according to an embodiment of this application.
Figure 17:
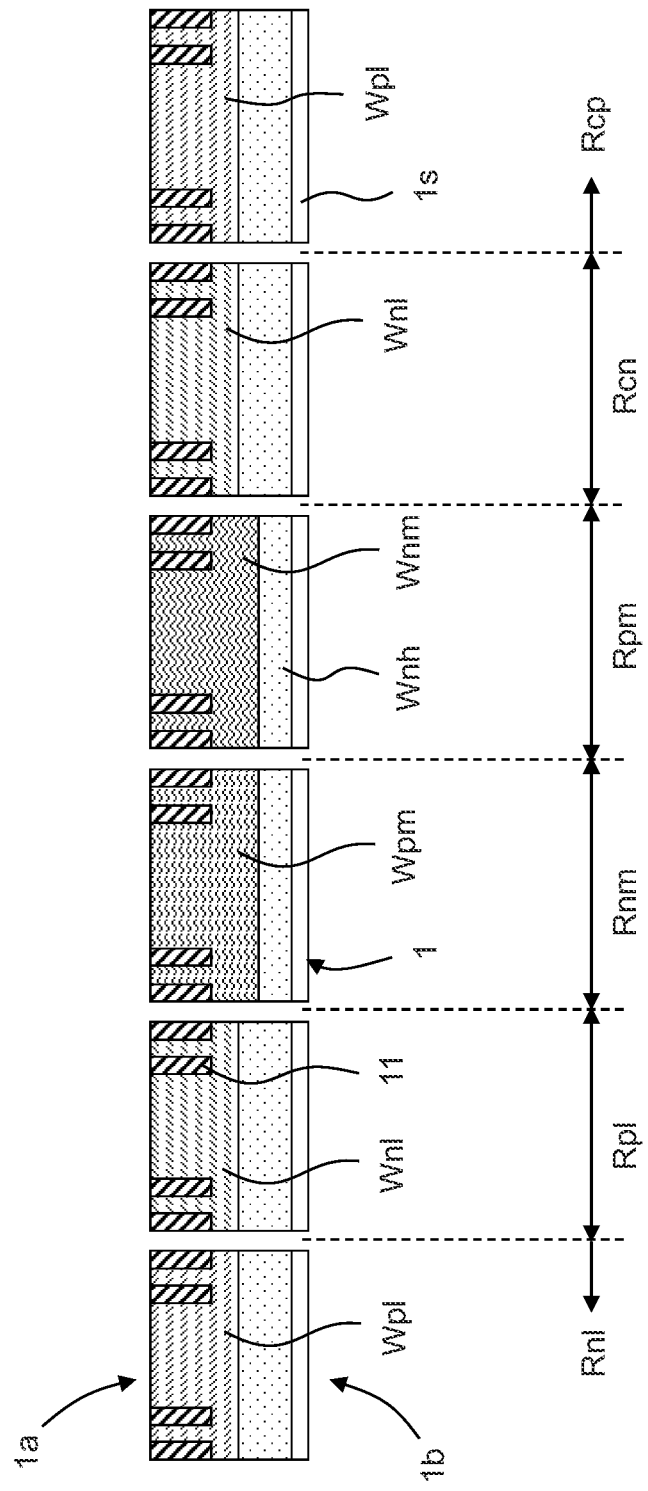
FIG. 17 is a cross-sectional view of each main portion device in a manufacturing process (N-type low withstanding voltage well region introduction step) for explaining an example of the main process in the method of manufacturing the semiconductor integrated circuit device according to an embodiment of this application.
Figure 18:
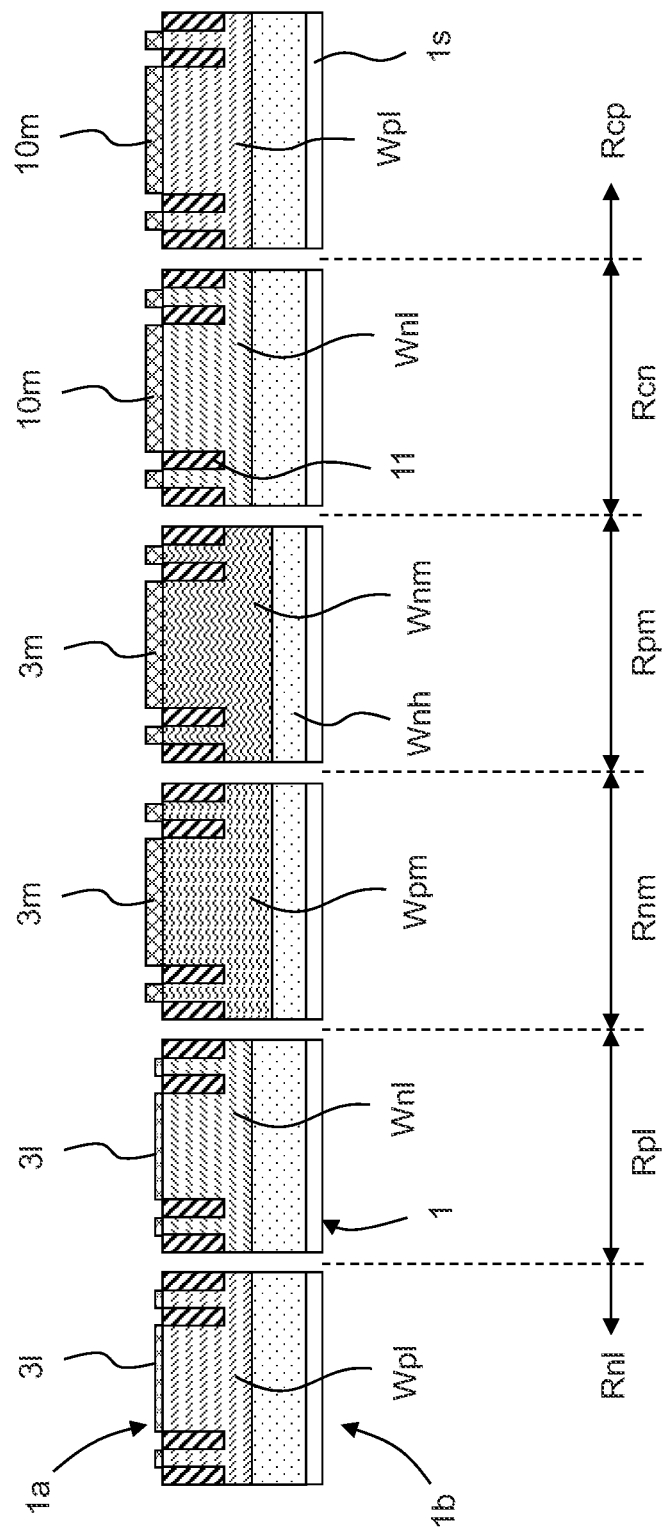
FIG. 18 is a cross-sectional view of each main portion device in a manufacturing process (gate insulating film forming step) for explaining an example of the main process in the method of manufacturing the semiconductor integrated circuit device according to an embodiment of this application.
Figure 19:
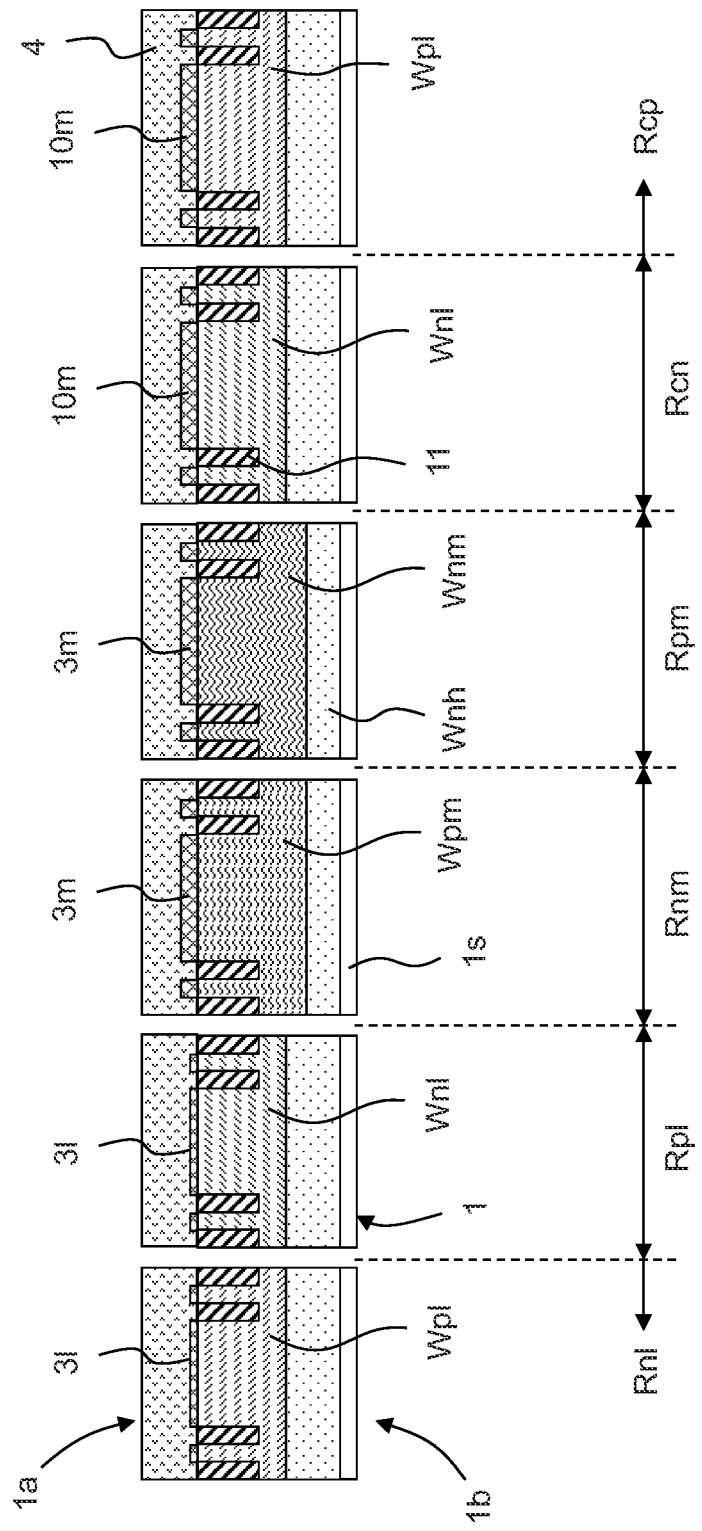
FIG. 19 is a cross-sectional view of each main portion device in a manufacturing process (polysilicon film forming step) for explaining an example of the main process in the method of manufacturing the semiconductor integrated circuit device according to an embodiment of this application.
Figure 20:
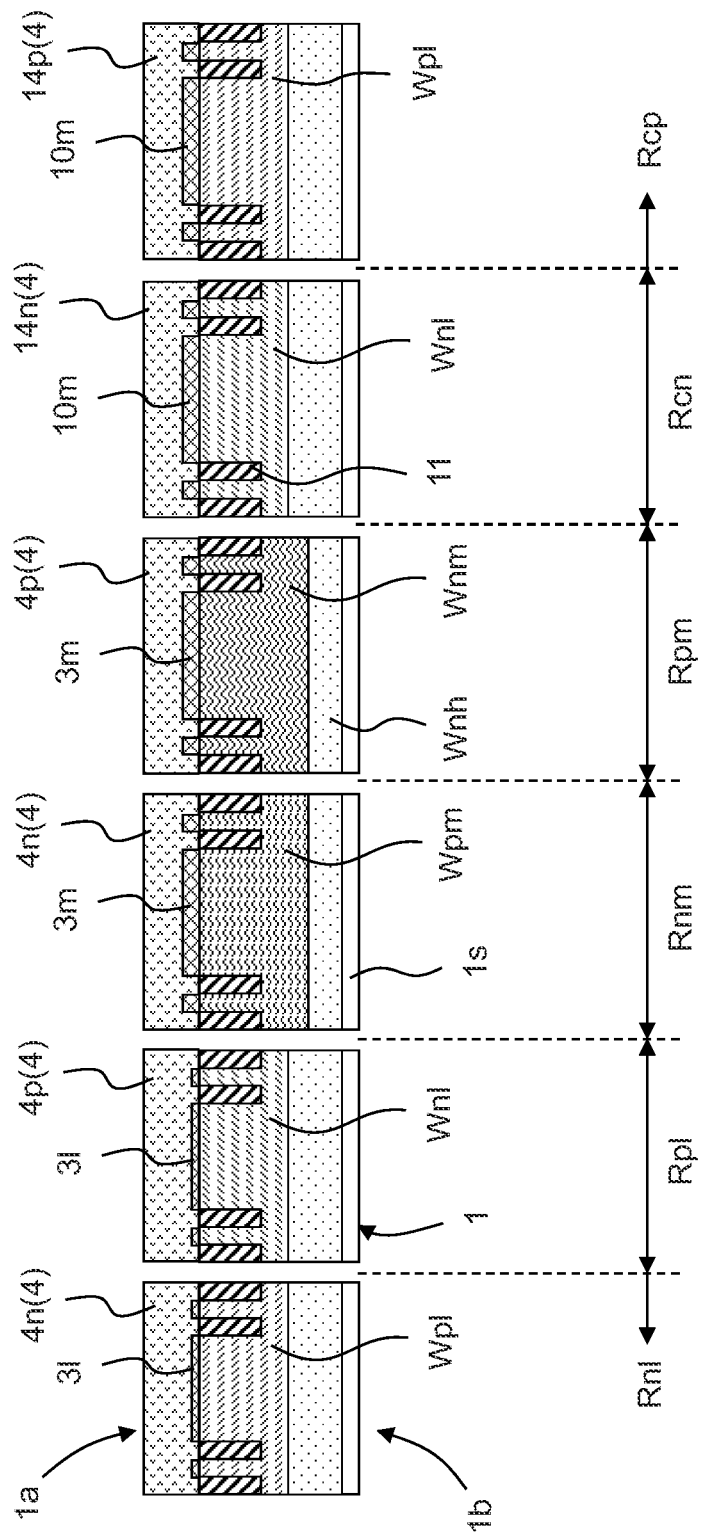
FIG. 20 is a cross-sectional view of each main portion device in a manufacturing process (polysilicon film doping step) for explaining an example of the main process in the method of manufacturing the semiconductor integrated circuit device according to an embodiment of this application.
Figure 21:
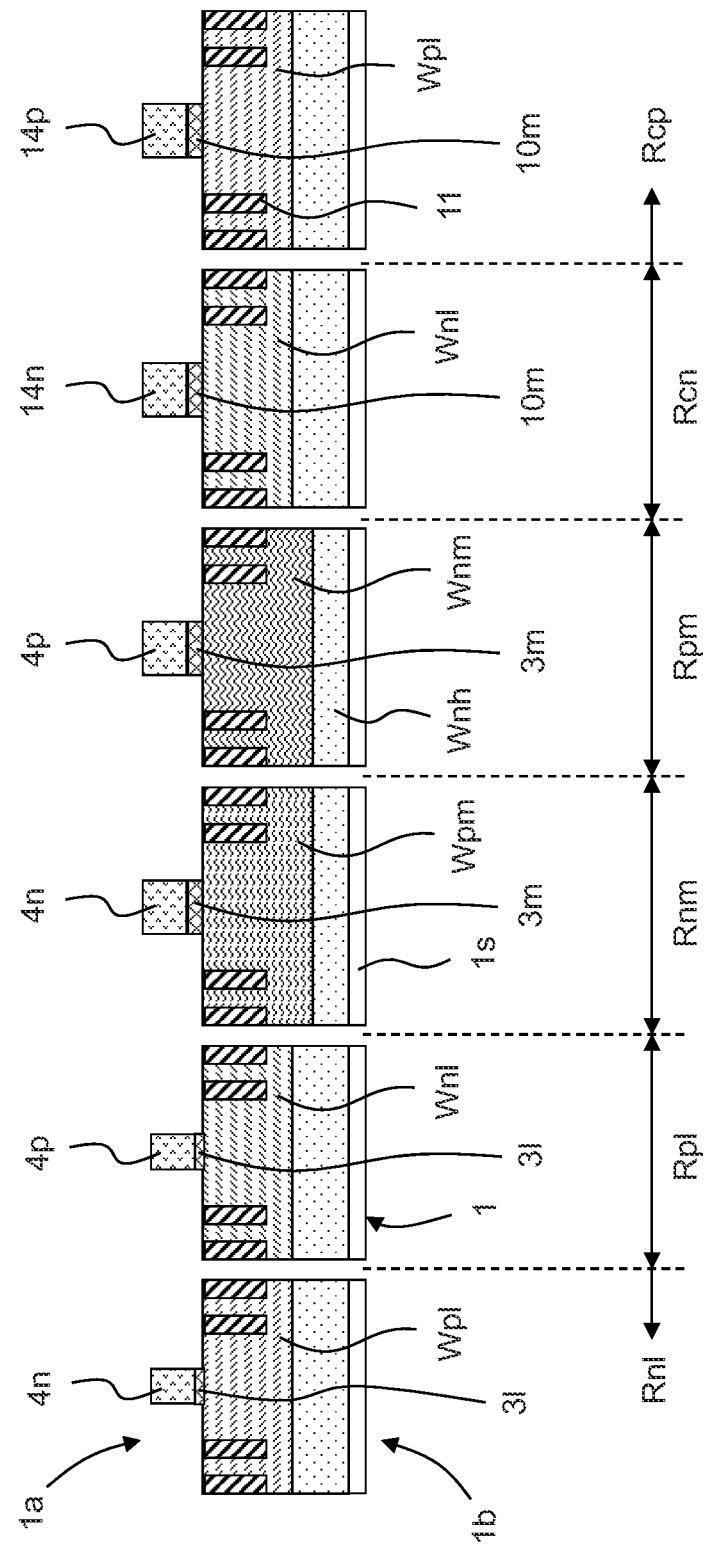
FIG. 21 is a cross-sectional view of each main portion device in a manufacturing process (gate electrode processing step) for explaining an example of the main process in the method of manufacturing the semiconductor integrated circuit device according to an embodiment of this application.
Figure 22:
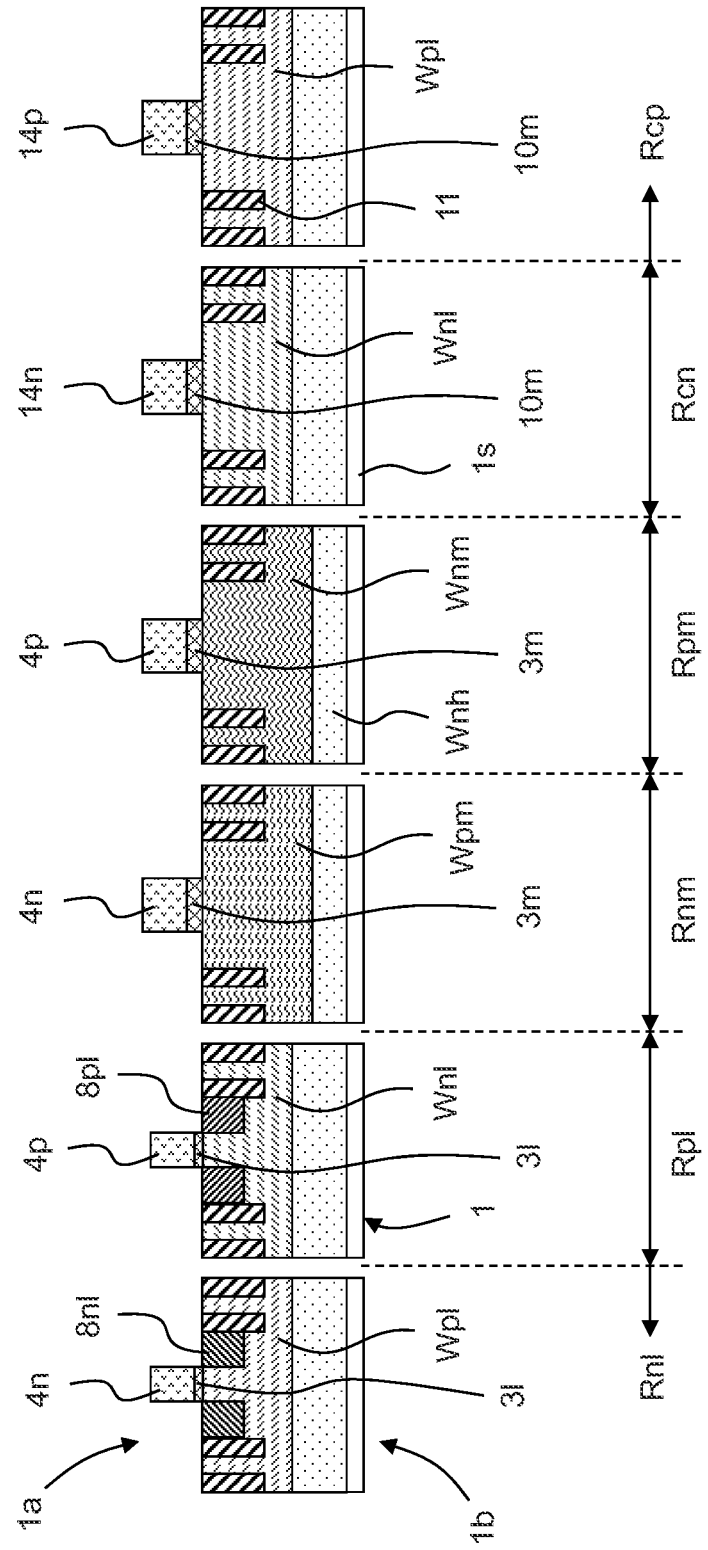
FIG. 22 is a cross-sectional view of each main portion device in a manufacturing process (low withstanding voltage source drain extension region introduction step) for explaining an example of the main process in the method of manufacturing the semiconductor integrated circuit device according to an embodiment of this application.
Figure 23:
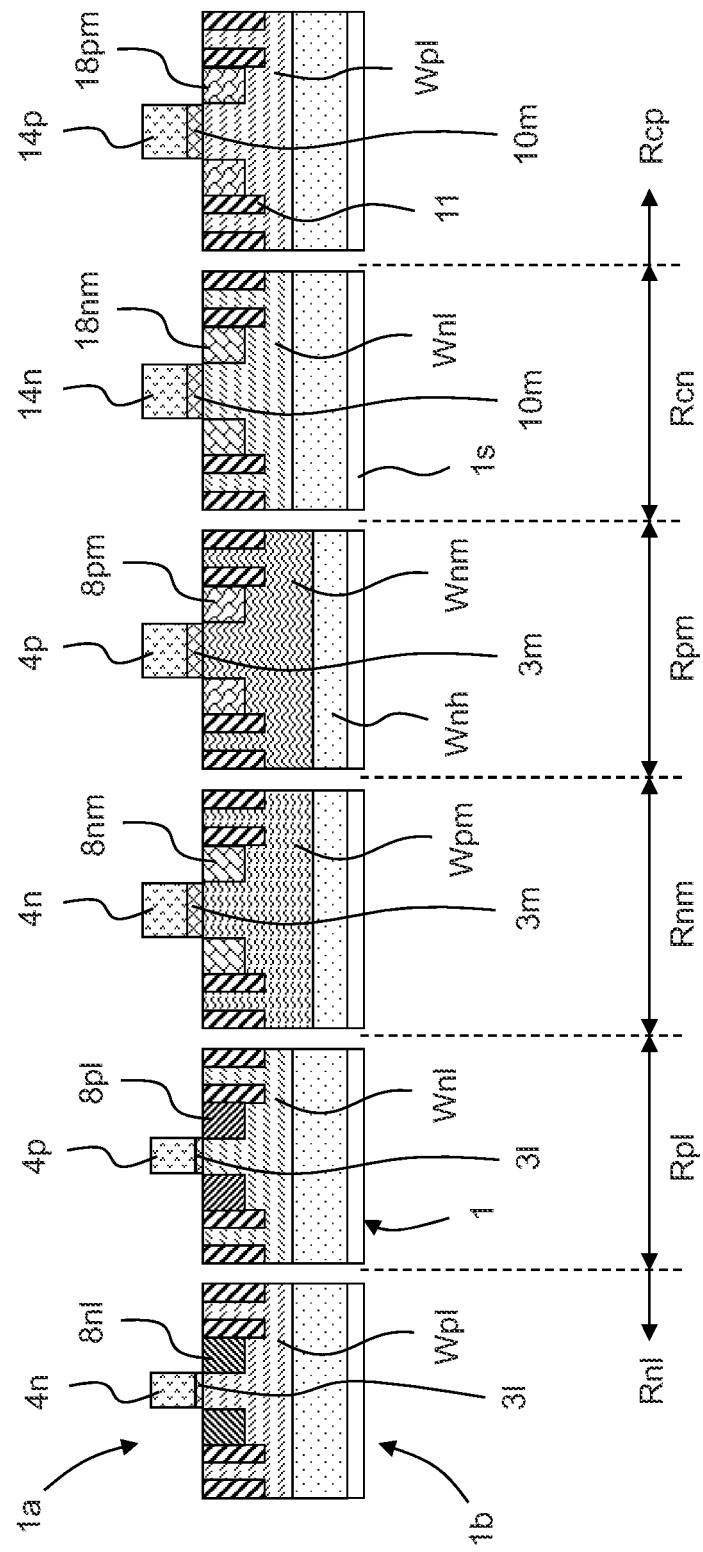
FIG. 23 is a cross-sectional view of each main portion device in a manufacturing process (medium withstanding voltage source drain extension region introduction step) for explaining an example of the main process in the method of manufacturing the semiconductor integrated circuit device according to an embodiment of this application.
Figure 24:
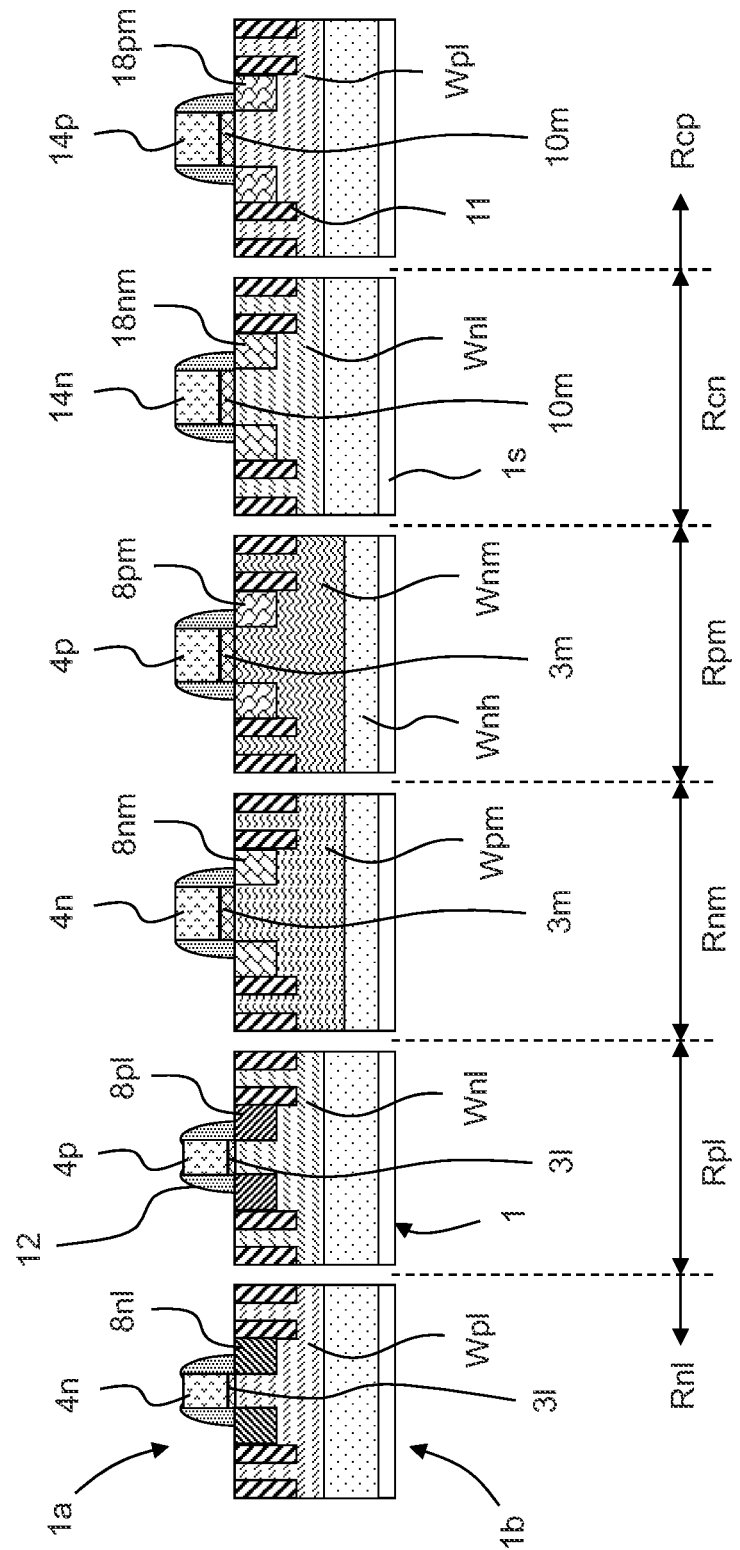
FIG. 24 is a cross-sectional view of each main portion device in a manufacturing process (sidewall spacer insulating film forming step) for explaining an example of the main process in the method of manufacturing the semiconductor integrated circuit device according to an embodiment of this application.
Figure 25:
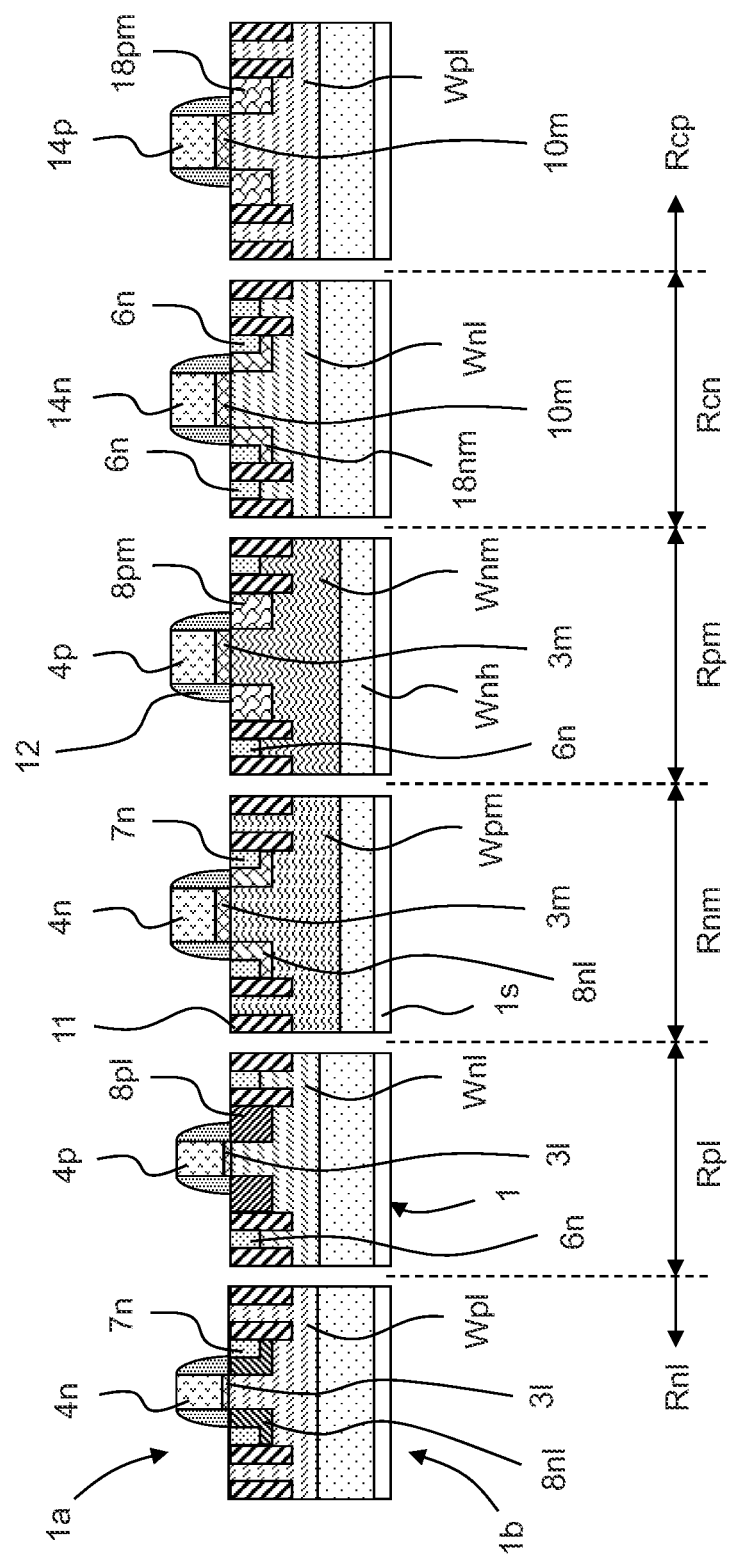
FIG. 25 is a cross-sectional view of each main portion device in a manufacturing process ($N^+$-type source drain region introduction step) for explaining an example of the main process in the method of manufacturing the semiconductor integrated circuit device according to an embodiment of this application.
Figure 26:
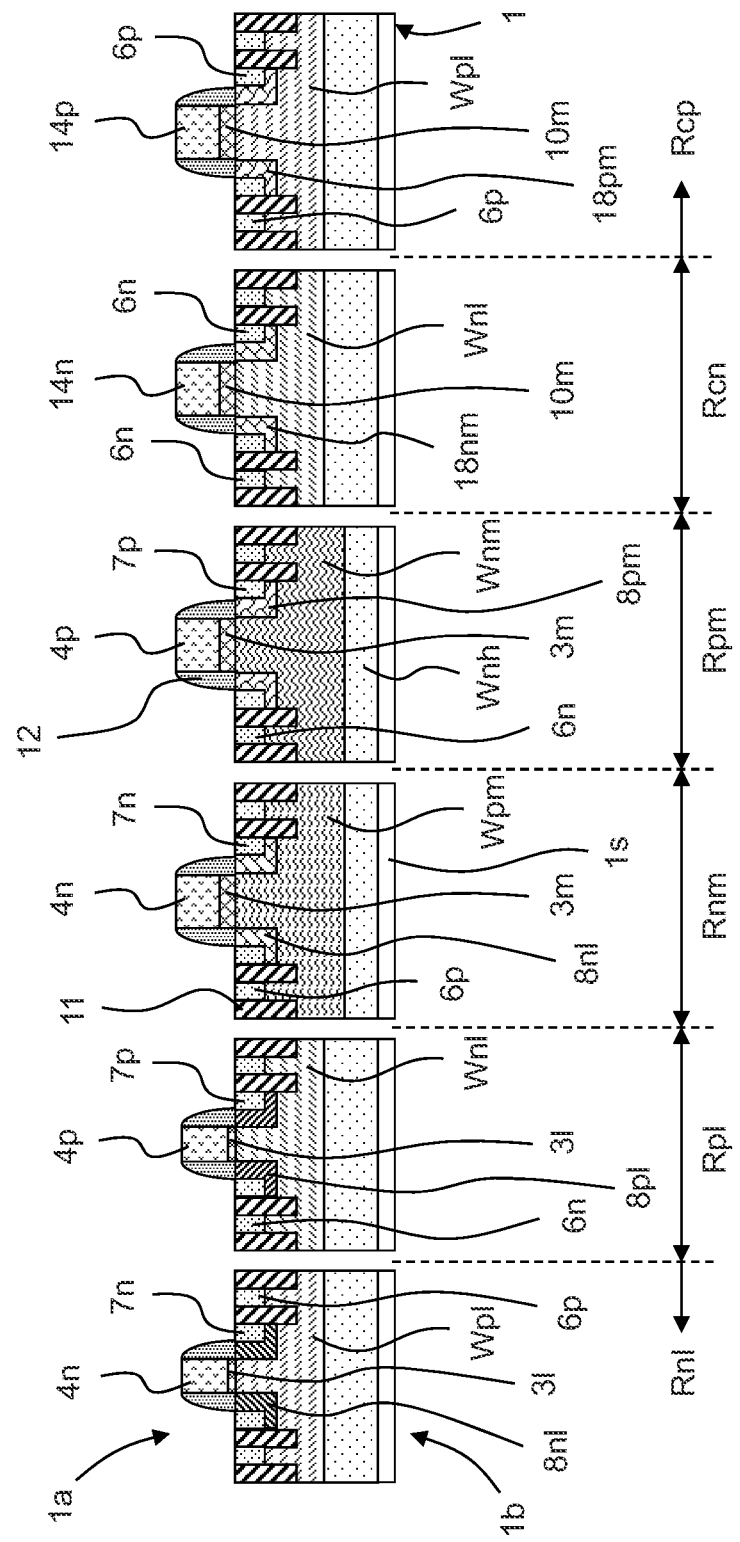
FIG. 26 is a cross-sectional view of each main portion device in a manufacturing process ($P^+$-type source drain region introduction step) for explaining an example of the main process in the method of manufacturing the semiconductor integrated circuit device according to the embodiment of this application.
Figure 27:
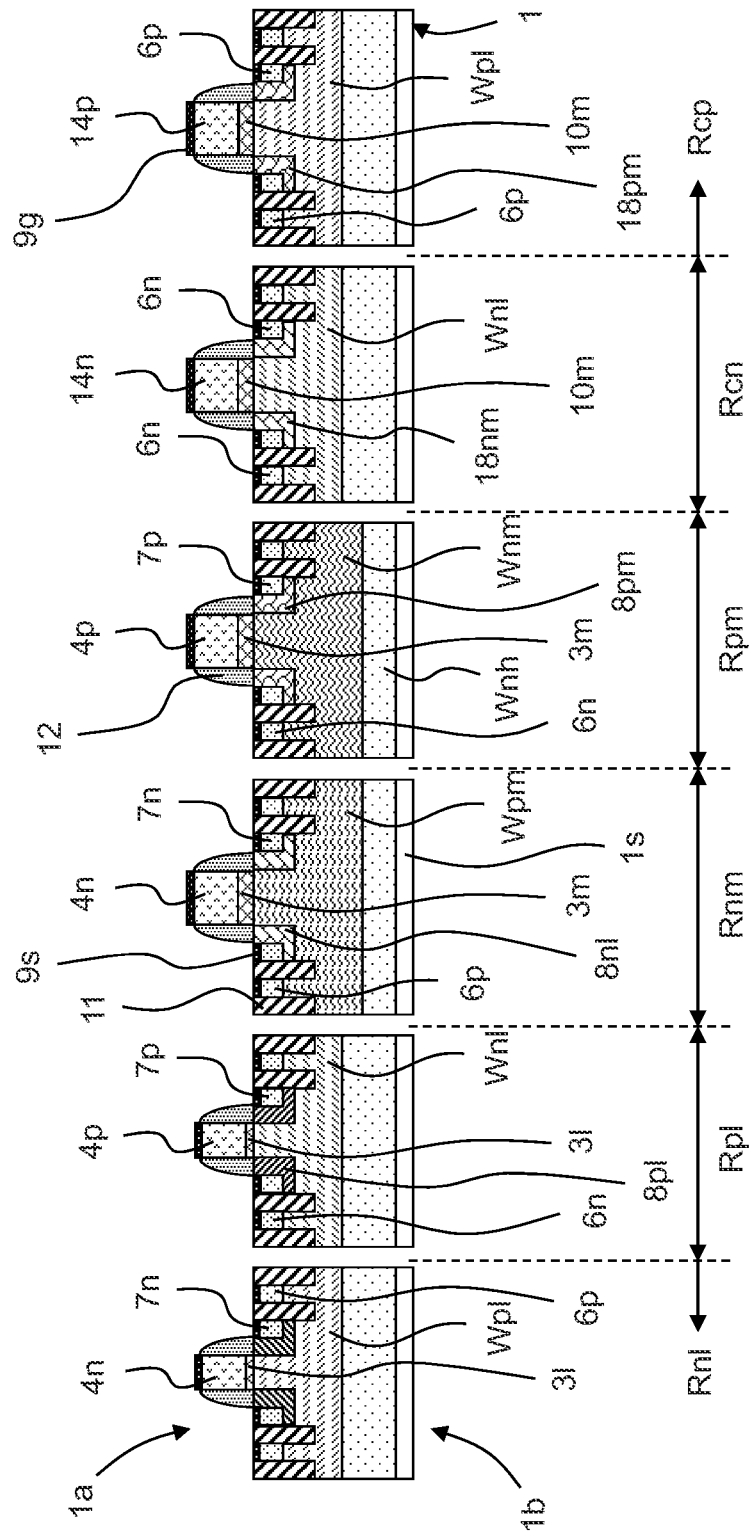
FIG. 27 is a cross-sectional view of each main portion device in a manufacturing process (silicide film forming step) for explaining an example of the main process in the method of manufacturing the semiconductor integrated circuit device according to an embodiment of this application.

FIG. 12 is a cross-sectional view of each main portion device in a manufacturing process (N-type high withstanding voltage well region introduction step) for explaining an example of the main process in the method of manufacturing the semiconductor integrated circuit device according to the embodiment of this application. FIG. 13 is a cross-sectional view of each main portion device in a manufacturing process (N-type medium withstanding voltage well region introduction step) for explaining an example of the main process in the method of manufacturing the semiconductor integrated circuit device according to an embodiment of this application. FIG. 14 is a cross-sectional view of each main portion device in a manufacturing process (element isolation region forming step) for explaining an example of the main process in the method of manufacturing the semiconductor integrated circuit device according to an embodiment of this application. FIG. 15 is a cross-sectional view of each main portion device in a manufacturing process (P-type medium withstanding voltage well region introduction step) for explaining an example of the main process in the method of manufacturing the semiconductor integrated circuit device according to an embodiment of this application. FIG. 16 is a cross-sectional view of each main portion device in a manufacturing process (P-type low withstanding voltage well region introduction step) for explaining an example of the main process in the method of manufacturing the semiconductor integrated circuit device according to an embodiment of this application. FIG. 17 is a cross-sectional view of each main portion device in a manufacturing process (N-type low withstanding voltage well region introduction step) for explaining an example of the main process in the method of manufacturing the semiconductor integrated circuit device according to an embodiment of this application. FIG. 18 is a cross-sectional view of each main portion device in a manufacturing process (gate insulating film forming step) for explaining an example of the main process in the method of manufacturing the semiconductor integrated circuit device according to an embodiment of this application. FIG. 19 is a cross-sectional view of each main portion device in a manufacturing process (polysilicon film forming step) for explaining an example of the main process in the method of manufacturing the semiconductor integrated circuit device according to an embodiment of this application. FIG. 20 is a cross-sectional view of each main portion device in a manufacturing process (polysilicon film doping step) for explaining an example of the main process in the method of manufacturing the semiconductor integrated circuit device according to an embodiment of this application. FIG. 21 is a cross-sectional view of each main portion device in a manufacturing process (gate electrode processing step) for explaining an example of the main process in the method of manufacturing the semiconductor integrated circuit device according to an embodiment of this application. FIG. 22 is a cross-sectional view of each main portion device in a manufacturing process (low withstanding voltage source drain extension region introduction step) for explaining an example of the main process in the method of manufacturing the semiconductor integrated circuit device according to an embodiment of this application. FIG. 23 is a cross-sectional view of each main portion device in a manufacturing process (medium withstanding voltage source drain extension region introduction step) for explaining an example of the main process in the method of manufacturing the semiconductor integrated circuit device according to an embodiment of this application. FIG. 24 is a cross-sectional view of each main portion device in a manufacturing process (sidewall spacer insulating film forming step) for explaining an example of the main process in the method of manufacturing the semiconductor integrated circuit device according to an embodiment of this application. FIG. 25 is a cross-sectional view of each main portion device in a manufacturing process (step of introducing an N+-type source drain region and the like) for explaining an example of the main process in the method of manufacturing the semiconductor integrated circuit device according to an embodiment of this application. FIG. 26 is a cross-sectional view of each main portion device in a manufacturing process (step of introducing a P+-type source drain region and the like) for explaining an example of the main process in the method of manufacturing the semiconductor integrated circuit device according to an embodiment of this application. FIG. 27 is a cross-sectional view of each main portion device in a manufacturing process (silicide film forming step) for explaining an example of the main process in the method of manufacturing the semiconductor integrated circuit device according to an embodiment of this application. With reference to these diagrams, an example of the main process in the method of manufacturing the semiconductor integrated circuit device according to the embodiment of this application will be described.

First, for example, a P-type single-crystal silicon substrate 1 (semiconductor wafer) is prepared (refer to FIG. 12). As the size of the semiconductor wafer 1, for example, 300 Φ is preferable in terms of mass production. However, 450 Φ, 200 Φ, and the like may be applied as desired. As the semiconductor wafer 1, not only the P-type single-crystal silicon wafer but also an epitaxial wafer, an SOI wafer, and a wafer in which a semiconductor layer is formed on an insulating substrate may be used. In addition, the conduction type is not limited to the P type, and may be the N-type and other types. As semiconductor materials, not only silicon but also composite semiconductors containing silicon (SiGe, SiC, and the like) and semiconductors containing no silicon (Ge, GaAs, GaN, other mixed crystal semiconductors, and the like) may be used. However, the silicon based semiconductor wafer has good compatibility with the CMIS process. In particular, the P-type single-crystal silicon wafer (non-epitaxial wafer) is advantageous in terms of cost.

Then, as shown in FIG. 12, the N-type high withstanding voltage well region Wnh is formed on the top surface 1a (first main surface) of the wafer 1 (1s) by performing, for example, ion implantation of N-type impurities from the top surface 1a (first main surface) side of the wafer 1 (1s) using the resist pattern (resist film) patterned by normal lithography as a mask. As the conditions of ion implantation, for example, "ion type: phosphorus, implantation angle: vertical or almost vertical, implantation energy: about 2 MeV, and dose: about $4 \times 10^{12}/cm^2$" can be preferably exemplified. In this case, regions that form the N-type high withstanding voltage well region Wnh are, for example, the N-type medium withstanding voltage MIS capacitor forming region Rcn, the P-type medium withstanding voltage MIS capacitor forming region Rcp, the N-channel type low withstanding voltage MISFET forming region Rnl, the N-channel type medium withstanding voltage MISFET forming region Rnm, the P-channel type low withstanding voltage MISFET forming region Rpl, the P-channel type medium withstanding voltage MISFET forming region Rpm, and the like in FIG. 12. The N-type high withstanding voltage well region Wnh shown in FIG. 2 and the like is simultaneously formed. Then, the resist film is removed by asking, for example, and activation annealing of impurities is performed as desired. As a result, a plurality of N-type high withstanding voltage well regions Wnh are formed on the top surface 1a of the P-type silicon single-crystal substrate 1s (semiconductor substrate portion) of the P type single-crystal silicon wafer 1. In addition, the N-type high withstanding voltage well region Wnh is formed simultaneously with the N-type high withstanding voltage well region Wnh that becomes a base of the P-channel type high withstanding voltage MISFET forming region Rph, as shown in FIG. 11. In addition, as shown in FIG. 11, the P-type high withstanding voltage well region Wph that becomes a base of the N-channel type high withstanding voltage MISFET forming region Rnh is also introduced in tandem with the N-type high withstanding voltage well region Wnh using the same method.

Then, as shown in FIG. 13, the N-type medium withstanding voltage well region Wnm is formed on the top surface 1a of the wafer 1 (1s), such as the P-channel type medium withstanding voltage MISFET forming region Rpm, by performing ion implantation of N-type impurities from the top surface 1a side of the wafer 1 using the resist pattern (resist film) patterned by normal lithography as a mask, for example. As the conditions of ion implantation, for example, "ion type: phosphorus, implantation angle: vertical or almost vertical, implantation energy: about 360 keV, and dose: about $8 \times 10^{12}/cm^2$" can be preferably exemplified. Then, the resist film is removed by asking, for example, and activation annealing of impurities is performed as desired.

Although optional, in this example, the N-type high withstanding voltage source drain extension region 28n of the N-channel type high withstanding voltage MISFET forming region Rnh in FIG. 11 is introduced simultaneously with the introduction of the N-type medium withstanding voltage well region Wnm. That is, the N-type high withstanding voltage source drain extension region 28n of the N-channel type high withstanding voltage MISFET forming region Rnh and the N-type medium withstanding voltage well region Wnm are formed in the same process.

Then, as shown in FIG. 14, an element isolation region, such as the STI (shallow trench isolation) region 11, is formed. At the same time, in this example, an element isolation region, such as the STI region 11, is optionally formed in the N-channel type high withstanding voltage MISFET forming region Rnh and the P-channel type high withstanding voltage MISFET forming region Rph in FIG. 11.

Then, as shown in FIG. 15, the P-type medium withstanding voltage well region Wpm is formed on the top surface 1a of the wafer 1, such as the N-channel type medium withstanding voltage MISFET forming region Rnm, by performing ion implantation of P-type impurities from the top surface 1a side of the wafer 1 using the resist pattern (resist film) patterned by normal lithography as a mask, for example. The conditions of ion implantation are as follows.

(1) First (order is not important; the same hereinbelow), "ion type: boron, implantation angle: vertical or almost vertical, implantation energy: about 200 keV, and dose: about $1 \times 10^{13}/cm^2$" can be exemplified as preferable conditions.

(2) Second, "ion type: boron, implantation angle: vertical or almost vertical, implantation energy: about 100 keV, and dose: about $2 \times 10^{12}/cm^2$" can be exemplified as preferable conditions.

(3) Third, "ion type: boron, implantation angle: vertical or almost vertical, implantation energy: about 50 keV, and dose: about $1.5 \times 10^{12}/cm^2$" can be exemplified as preferable conditions.

The specific impurity introduction procedure shown herein is just an example and can be changed as desired (the same hereinbelow). In addition, ion implantation for threshold voltage adjustment or the like may be performed as desired (the same hereinbelow). Then, the resist film that is removed by asking, for example.

Although optional, in this example, the P-type high withstanding voltage source drain extension region 28*p* of the P-channel type high withstanding voltage MISFET forming region Rph in FIG. 11 is introduced simultaneously with the introduction of the P-type medium withstanding voltage well region Wpm. That is, the P-type high withstanding voltage source drain extension region 28*p* of the P-channel type high withstanding voltage MISFET forming region Rph and the P-type medium withstanding voltage well region Wpm are formed in the same process.

Then, as shown in FIG. 16, the P-type low withstanding voltage well region Wpl is formed on the top surface 1*a* of the wafer 1, such as the N-channel type low withstanding voltage MISFET forming region Rnl, by performing ion implantation of P-type impurities from the top surface 1*a* side of the wafer 1 using the resist pattern (resist film) patterned by normal lithography as a mask, for example. At the same time, the same ion implantation is performed in the P-type medium withstanding voltage MIS capacitor forming region Rcp, and accordingly, the P-type low withstanding voltage well region Wpl is formed. The conditions of ion implantation are as follows.

(1) First, "ion type: boron, implantation angle: vertical or almost vertical, implantation energy: about 200 keV, and dose: about $1 \times 10^{12}/cm^2$" can be exemplified as preferable conditions.

(2) Second, "ion type: boron, implantation angle: vertical or almost vertical, implantation energy: about 100 keV, and dose: about $1 \times 10^{12}/cm^2$" can be exemplified as preferable conditions.

(3) Third, "ion type: boron, implantation angle: vertical or almost vertical, implantation energy: about 50 keV, and dose: about $2 \times 10^{12}/cm^2$" can be exemplified as preferable conditions.

Then, in this state, ion implantation for adjusting the threshold voltage of the N-channel type low withstanding voltage MISFET (Qnl) formed in the N-channel type low withstanding voltage MISFET forming region Rnl or the like is performed in the same manner as described above when desired (refer to FIG. 4). As the conditions of ion implantation, for example, "ion type: boron (P-type impurity), implantation angle: vertical or almost vertical, implantation energy: about 10 keV, and dose: about $1 \times 10^{13}/cm^2$" can be preferably exemplified. Thus, the P-type doped region for threshold voltage adjustment Dpq is formed (refer to FIG. 4). At the same time, the same ion implantation is performed in the P-type medium withstanding voltage MIS capacitor forming region Rcp, and accordingly, the capacitor P-type doped region Dpc is formed (refer to FIG. 10). Then, the resist film that is removed by asking, for example. Although applying the ion implantation for threshold value adjustment to the capacitor region is arbitrary, surface concentration can be further increased if the ion implantation for threshold value adjustment is applied to the capacitor region. This has an effect of further reducing the voltage dependence of a capacitor element.

Then, as shown in FIG. 17, the N-type low withstanding voltage well region Wnl is formed on the top surface 1*a* of the wafer 1, such as the P-channel type low withstanding voltage MISFET forming region Rpl, by performing ion implantation of N-type impurities from the top surface 1*a* side of the wafer 1 using the resist pattern (resist film) patterned by normal lithography as a mask, for example. At the same time, the same ion implantation is performed in the N-type medium withstanding voltage MIS capacitor forming region Rcn, and accordingly, the N-type low withstanding voltage well region Wnl is formed. The conditions of ion implantation are as follows.

(1) First, "ion type: phosphorus, implantation angle: vertical or almost vertical, implantation energy: about 600 keV, and dose: about $1 \times 10^{13}/cm^2$" can be exemplified as preferable conditions.

(2) Second, "ion type: phosphorus, implantation angle: vertical or almost vertical, implantation energy: about 300 keV, and dose: about $1 \times 10^{13}/cm^2$" can be exemplified as preferable conditions.

(3) Third, "ion type: phosphorus, implantation angle: vertical or almost vertical, implantation energy: about 200 keV, and dose: about $4 \times 10^{12}/cm^2$" can be exemplified as preferable conditions.

Then, in this state, ion implantation for adjusting the threshold voltage of the P-channel type low withstanding voltage MISFET (Qpl) formed in the P-channel type low withstanding voltage MISFET forming region Rpl or the like is performed in the same manner as described above when desired (refer to FIG. 5). As the conditions of ion implantation, for example, "ion type: arsenic (N-type impurity), implantation angle: vertical or almost vertical, implantation energy: about 40 keV, and dose: about $1 \times 10^{13}/cm^2$" can be preferably exemplified. Thus, the N-type doped region for threshold voltage adjustment Dnq is formed (refer to FIG. 5). At the same time, the same ion implantation is performed in the N-type medium withstanding voltage MIS capacitor forming region Rcn, and accordingly, the capacitor N-type doped region Dnc is formed (refer to FIG. 8). Then, the resist film is removed by asking, for example, and activation annealing of impurities is performed as desired. Although applying the ion implantation for threshold value adjustment to the capacitor region is arbitrary, surface concentration can be further increased if the ion implantation for threshold value adjustment is applied to the capacitor region. This has an effect of further reducing the voltage dependence of a capacitor element.

Then, as shown in FIG. 18, on the semiconductor surface of the N-channel type medium withstanding voltage MISFET forming region Rnm and the P-channel type medium withstanding voltage MISFET forming region Rpm on the top surface 1*a* side of the semiconductor wafer 1 (1*s*), the medium withstanding voltage gate insulating film 3*m* is formed by thermal oxidation, for example. At the same time, the medium withstanding voltage capacitor insulating film 10*m* (capacitor insulating film using a medium withstanding voltage gate insulating film) is formed on the semiconductor surface of the N-type medium withstanding voltage MIS capacitor forming region Rcn and the P-type medium withstanding voltage MIS capacitor forming region Rcp on the top surface 1*a* side of the semiconductor wafer 1 (1*s*). In addition, at the same time, the same thermal oxide film is formed on the semiconductor surface of the N-channel type low withstanding voltage MISFET forming region Rnl and the P-channel type low withstanding voltage MISFET forming region Rpl on the top surface 1*a* side of the semiconductor wafer 1 (1*s*). These are removed later. In this example, the silicon oxide film conversion thickness of the medium withstanding voltage gate insulating film 3*m* is larger than the silicon oxide film conversion thickness of the low withstanding voltage gate insulating film 31, and the silicon oxide film conversion thickness of the medium withstanding voltage gate insulating film 3*m* is smaller than the silicon oxide film conversion thickness of the high withstanding voltage gate insulating film 3*h*.

In addition, the high withstanding voltage gate insulating film 3*h* and the like shown in FIG. 11 can be formed by repeating the same film formation and etching before the formation of the medium withstanding voltage gate insulating film 3m, for example. In this case, the high withstanding voltage gate insulating film 3h is a thermal oxide film (other insulating films) in this example. However, the high withstanding voltage gate insulating film 3h may be a CVD oxide film (other CVD insulating films) or a composite insulating film of the thermal oxide film (other insulating films) and the CVD oxide film (other CVD insulating films).

Then, using the resist pattern (resist film) patterned by normal lithography as a mask, thermal oxide films of undesired portions (for example, the N-channel type low withstanding voltage MISFET forming region Rnl and the P-channel type low withstanding voltage MISFET forming region Rpl) are removed by wet etching using a hydrofluoric acid based etching solution, for example. Then, the resist film is removed by asking, for example.

Then, on the semiconductor surface of the N-channel type low withstanding voltage MISFET forming region Rnl and the P-channel type low withstanding voltage MISFET forming region Rpl on the top surface 1a side of the semiconductor wafer 1 (1s), the low withstanding voltage gate insulating film 3l is formed by thermal oxidation, for example. In this case, the thicknesses of other gate insulating films are slightly increased when thermal oxidation is applied. However, the influence can be almost neglected (when the influence cannot be neglected, the target film thickness is set in consideration of the increase).

Then, as shown in FIG. 19, a polysilicon film 4 is formed on the top surface 1a side of the semiconductor wafer 1 (1s) by chemical vapor deposition (CVD), for example. At the same time, in this example, the polysilicon film 4 is also formed in the N-channel type high withstanding voltage MISFET forming region Rnh and the P-channel type high withstanding voltage MISFET forming region Rph in FIG. 11, although optional.

Then, as shown in FIG. 20, a first portion of the polysilicon film 4 is formed as an N type by performing ion implantation of N-type impurities from the top surface 1a side of the wafer 1 using the resist pattern (resist film) patterned by normal lithography as a mask, for example. The first portion is a portion on the N-channel type low withstanding voltage MISFET forming region Rnl, a portion on the N-channel type medium withstanding voltage MISFET forming region Rnm, and a portion on the N-type medium withstanding voltage MIS capacitor forming region Rcn, for example. At the same time, in this example, the polysilicon film 4 of the N-channel type high withstanding voltage MISFET forming region Rnh is also formed as an N type, although optional. As the conditions of ion implantation, for example, "ion type: phosphorus, implantation angle: vertical or almost vertical, implantation energy: about 20 keV, and dose: about $4\times10^{15}/cm^2$" can be preferably exemplified. Then, the resist film is removed by asking, for example.

Then, a second portion of the polysilicon film 4 is formed as a P type by performing ion implantation of P-type impurities from the top surface 1a side of the wafer 1 using the resist pattern (resist film) patterned by normal lithography as a mask, for example. The second portion is a portion on the P-channel type low withstanding voltage MISFET forming region Rpl, a portion on the P-channel type medium withstanding voltage MISFET forming region Rpm, and a portion on the P-type medium withstanding voltage MIS capacitor forming region Rcp, for example. At the same time, in this example, the polysilicon film 4 of the P-channel type high withstanding voltage MISFET forming region Rph (refer to FIG. 11) is also formed as a P type, although optional. As the conditions of ion implantation, for example, "ion type: boron, implantation angle: vertical or almost vertical, implantation energy: about 6 keV, and dose: about $4\times10^{15}/cm^2$" can be preferably exemplified. Then, the resist film is removed by asking, for example.

Then, as shown in FIG. 21, the polysilicon film 4 and the like are processed by anisotropic dry etching using the resist pattern (resist film) patterned by normal lithography as a mask, for example. As a result, N-type poly-Si gate electrode 4n, the P-type poly-Si gate electrode 4p, the N-type poly-Si capacitor electrode 14n (off-board capacitor electrode), the P-type poly-Si capacitor electrode 14p (off-board capacitor electrode), and the like are formed. At the same time, in this example, the polysilicon film 4 of the N-channel type high withstanding voltage MISFET forming region Rnh and the P-channel type high withstanding voltage MISFET forming region Rph (refer to FIG. 11) is also processed, although optional.

Then, as shown in FIG. 22, the N-type low withstanding voltage source drain extension region 8nl is formed on the top surface 1a of the wafer 1 (1s) on both sides of the gate electrode of the N-channel type low withstanding voltage MISFET forming region Rnl by performing ion implantation of N-type impurities from the top surface 1a side of the wafer 1 using the resist pattern (resist film) patterned by normal lithography as a mask, for example. As the conditions of ion implantation, for example, "ion type: arsenic, implantation angle: vertical or almost vertical, implantation energy: about 3 keV, and dose: about $3\times10^{14}/cm^2$" can be preferably exemplified. Then, the resist film is removed by ashing, for example.

Then, the P-type low withstanding voltage source drain extension region 8pl is formed on the top surface 1a of the wafer 1 (1s) on both sides of the gate electrode of the P-channel type low withstanding voltage MISFET forming region Rpl by performing ion implantation of P-type impurities from the top surface 1a side of the wafer 1 using the resist pattern (resist film) patterned by normal lithography as a mask, for example. As the conditions of ion implantation, for example, "ion type: BF$_2$, implantation angle: vertical or almost vertical, implantation energy: about 5 keV, and dose: about $3\times10^{14}/cm^2$" can be preferably exemplified. Then, the resist film is removed by ashing, for example.

Then, as shown in FIG. 23, the N-type medium withstanding voltage source drain extension region 8nm is formed on the top surface 1a of the wafer 1 (1s) on both sides of the gate electrode of the N-channel type medium withstanding voltage MISFET forming region Rnm by performing ion implantation of N-type impurities from the top surface 1a side of the wafer 1 using the resist pattern (resist film) patterned by normal lithography as a mask, for example. At the same time, the N-type doped region around a capacitor electrode extraction portion 18nm is formed on the top surface 1a of the wafer 1 (1s) on both sides of the N-type poly-Si capacitor electrode 14n of the N-type medium withstanding voltage MIS capacitor forming region Rcn. As the conditions of ion implantation, for example, "ion type: phosphorus, implantation angle: about 30° (that is, inclined implantation that is inclined about 30° from the vertical direction), implantation energy: about 80 keV, and dose: about $2\times10^{13}/cm^2$" can be preferably exemplified. Since the inclined implantation corresponds to various orientations of devices, it is preferable to perform the inclined implantation, for example, four times from four directions rotated by 90° with respect to the rotation axis perpendicular to the main surface of the wafer. Then, the resist film is removed by asking, for example.

Then, the P-type medium withstanding voltage source drain extension region 8*pm* is formed on the top surface 1*a* of the wafer 1 (1*s*) on both sides of the gate electrode of the P-channel type medium withstanding voltage MISFET forming region Rpm by performing ion implantation of P-type impurities from the top surface 1*a* side of the wafer 1 using the resist pattern (resist film) patterned by normal lithography as a mask, for example. At the same time, the P-type doped region around a capacitor electrode extraction portion 18*pm* is formed on the top surface 1*a* of the wafer 1 (1*s*) on both sides of the P-type poly-Si capacitor electrode 14*p* of the P-type medium withstanding voltage MIS capacitor forming region Rcp. As the conditions of ion implantation, for example, "ion type: $BF_2$, implantation angle: vertical or almost vertical, implantation energy: about 30 keV, and dose: about $2 \times 10^{13}/cm^2$" can be preferably exemplified. Then, the resist film is removed by asking, for example.

Then, as shown in FIG. 24, a silicon oxide based insulating film (or a silicon nitride based insulating film) is formed on the top surface 1*a* side of the wafer 1 by CVD, for example, and the sidewall spacer insulating film 12 is formed by etchback based on anisotropic dry etching. At the same time, in this example, the sidewall spacer insulating film 12 is also formed around each gate electrode of the N-channel type high withstanding voltage MISFET forming region Rnh (refer to FIG. 11) and the P-channel type high withstanding voltage MISFET forming region Rph, although optional.

Then, as shown in FIG. 25, the $N^+$-type source drain region 7*n* is formed on the top surface 1*a* of the wafer 1 (1*s*) on both sides of the gate electrode of the N-channel type low withstanding voltage MISFET forming region Rnl by performing ion implantation of N-type impurities from the top surface 1*a* side of the wafer 1 using the resist pattern (resist film) patterned by normal lithography as a mask, for example. At the same time, the $N^+$-type source drain region 7*n* is formed on the top surface 1*a* of the wafer 1 (1*s*) on both sides of the gate electrode of the N-channel type medium withstanding voltage MISFET forming region Rnm. At the same time, the $N^+$-type contact region 6*n* (well contact region) of the P-channel type low withstanding voltage MISFET forming region Rpl, the $N^+$-type contact region 6*n* of the P-channel type medium withstanding voltage MISFET forming region Rpm, the $N^+$-type contact region 6*n* of the N-type medium withstanding voltage MIS capacitor forming region Rcn (well contact region and both sides of the N-type poly-Si capacitor electrode 14*n*), and the like are formed. At the same time, in this example, the $N^+$-type source drain region 7*n* of the N-channel type high withstanding voltage MISFET forming region Rnh (refer to FIG. 11) and the $N^+$-type contact region 6*n* of the P-channel type high withstanding voltage MISFET forming region Rph are introduced, although optional. As the conditions of ion implantation, for example, "ion type: arsenic, implantation angle: vertical or almost vertical, implantation energy: about 50 keV, and dose: about $4 \times 10^{15}/cm^2$" can be preferably exemplified. Then, the resist film is removed by asking, for example.

Then, as shown in FIG. 26, the $P^+$-type source drain region 7*p* is formed on the top surface 1*a* of the wafer 1 (1*s*) on both sides of the gate electrode of the P-channel type low withstanding voltage MISFET forming region Rpl by performing ion implantation of P-type impurities from the top surface 1*a* side of the wafer 1 using the resist pattern (resist film) patterned by normal lithography as a mask, for example. At the same time, the $P^+$-type source drain region 7*p* is formed on the top surface 1*a* of the wafer 1 (1*s*) on both sides of the gate electrode of the P-channel type medium withstanding voltage MISFET forming region Rpm. At the same time, the $P^+$-type contact region 6*p* (well contact region) of the N-channel type low withstanding voltage MISFET forming region Rnl, the $P^+$-type contact region 6*p* of the N-channel type medium withstanding voltage MISFET forming region Rnm, the $P^+$-type contact region 6*p* of the P-type medium withstanding voltage MIS capacitor forming region Rcp (well contact region and both sides of the P-type poly-Si capacitor electrode 14*p*), and the like are formed. At the same time, in this example, the $P^+$-type source drain region 7*p* of the P-channel type high withstanding voltage MISFET forming region Rph (refer to FIG. 11) and the $P^+$-type contact region 6*p* of the N-channel type high withstanding voltage MISFET forming region Rnh are introduced, although optional. As the conditions of ion implantation, for example, "ion type: $BF_2$, implantation angle: vertical or almost vertical, implantation energy: about 25 keV, and dose: about $3 \times 10^{15}/cm^2$" can be preferably exemplified. Then, the resist film is removed by asking, for example.

Then, as shown in FIG. 27, the silicide film on a gate 9*g* or the silicide film on a substrate or an off-board capacitor electrode 9*s* is formed by the salicide process or the like. As the material of the silicide film, cobalt silicide can be preferably presented as an example. As the material of the silicide film, nickel silicide, nickel platinum silicide, titanium silicides, and the like can also be used in addition to cobalt silicide. At the same time, in this example, the silicide film on a gate 9*g* and the silicide film on a substrate 9*s* of the N-channel type high withstanding voltage MISFET forming region Rnh (refer to FIG. 11) and the P-channel type high withstanding voltage MISFET forming region Rph are formed, although optional.

Then, for example, as shown in FIG. 9, the silicon nitride based etch-stop insulating film 21 and the silicon oxide based pre-metal insulating film 22 are formed on the top surface 1*a* side of the wafer 1 as desired. Then, a contact hole or the like is opened and is filled with the tungsten plug 23 or the like. Then, if desired, a multi-layer wiring is formed in a sequential manner. For example, the aluminum based metal first-layer wiring 25 is formed on the silicon oxide based pre-metal insulating film 22, and the first-layer wiring interlayer insulating film 24 is formed on the aluminum based metal first-layer wiring 25. Then, the wafer 1 is divided into individual chips 2 by dicing or the like after a wafer test and the like. Then, Chip On Glass (COG) mounting, Tape Carrier Package (TCP) mounting, Chip On Flex (COF) mounting, or the like is performed as desired.

3. Explanation of modifications of the main portion device structure in the semiconductor integrated circuit device according to the embodiment of this application (mainly FIGS. 28 to 30)

Since examples to be described below are modifications of the examples described in the sections 1 and 2, the examples to be described below are almost the same except for some differences (modified portions). Therefore, explanation of the same portions will not be repeated in principle.

Figure 28:
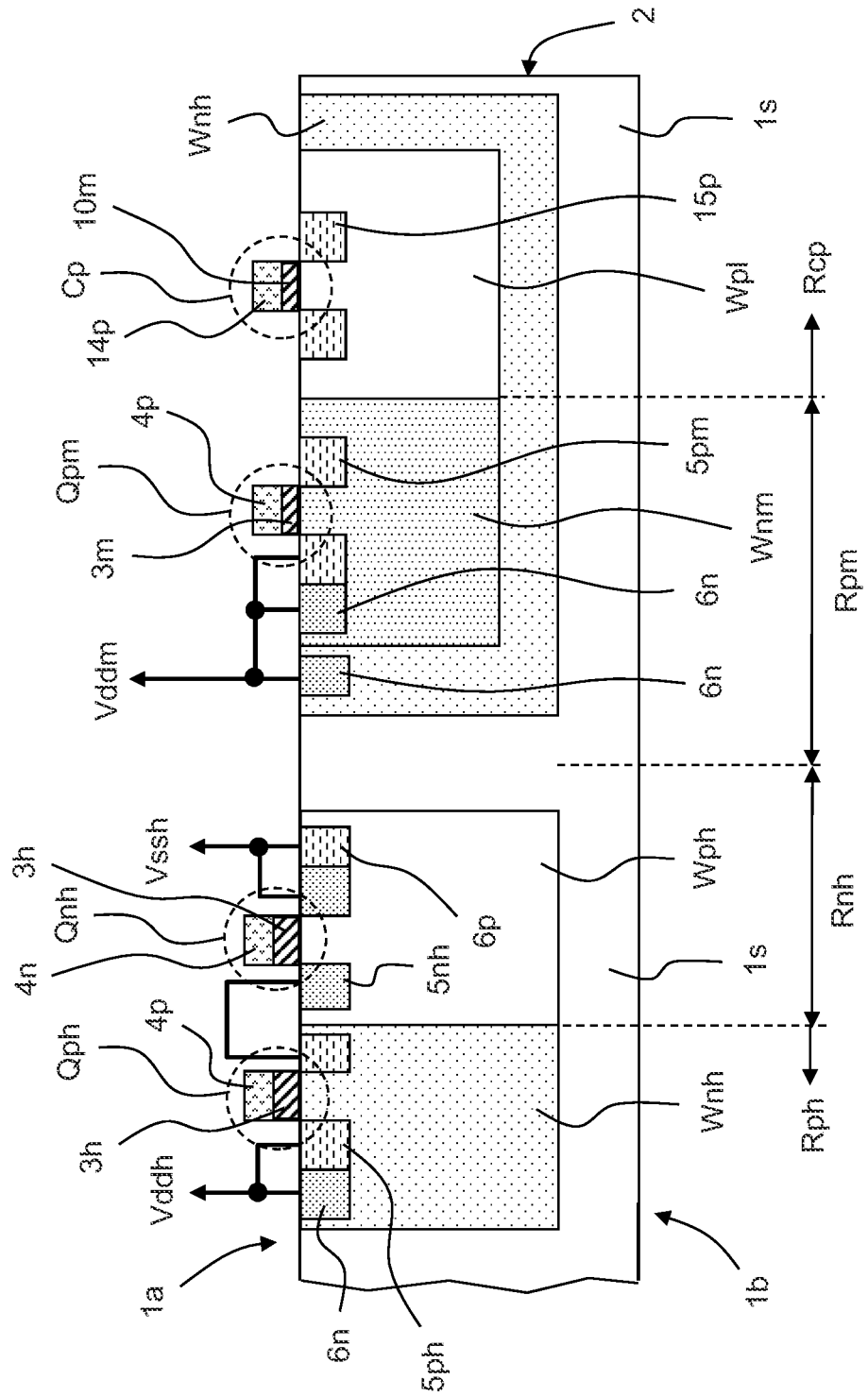
FIG. 28 is a schematic device cross-sectional view (medium withstanding voltage MISFET and medium withstanding voltage capacitor element) corresponding to FIG. 3 for explaining a modification 1 in which a medium withstanding voltage capacitor and a medium withstanding voltage MISFET are provided in the same N-type high withstanding voltage well region.
Figure 29:
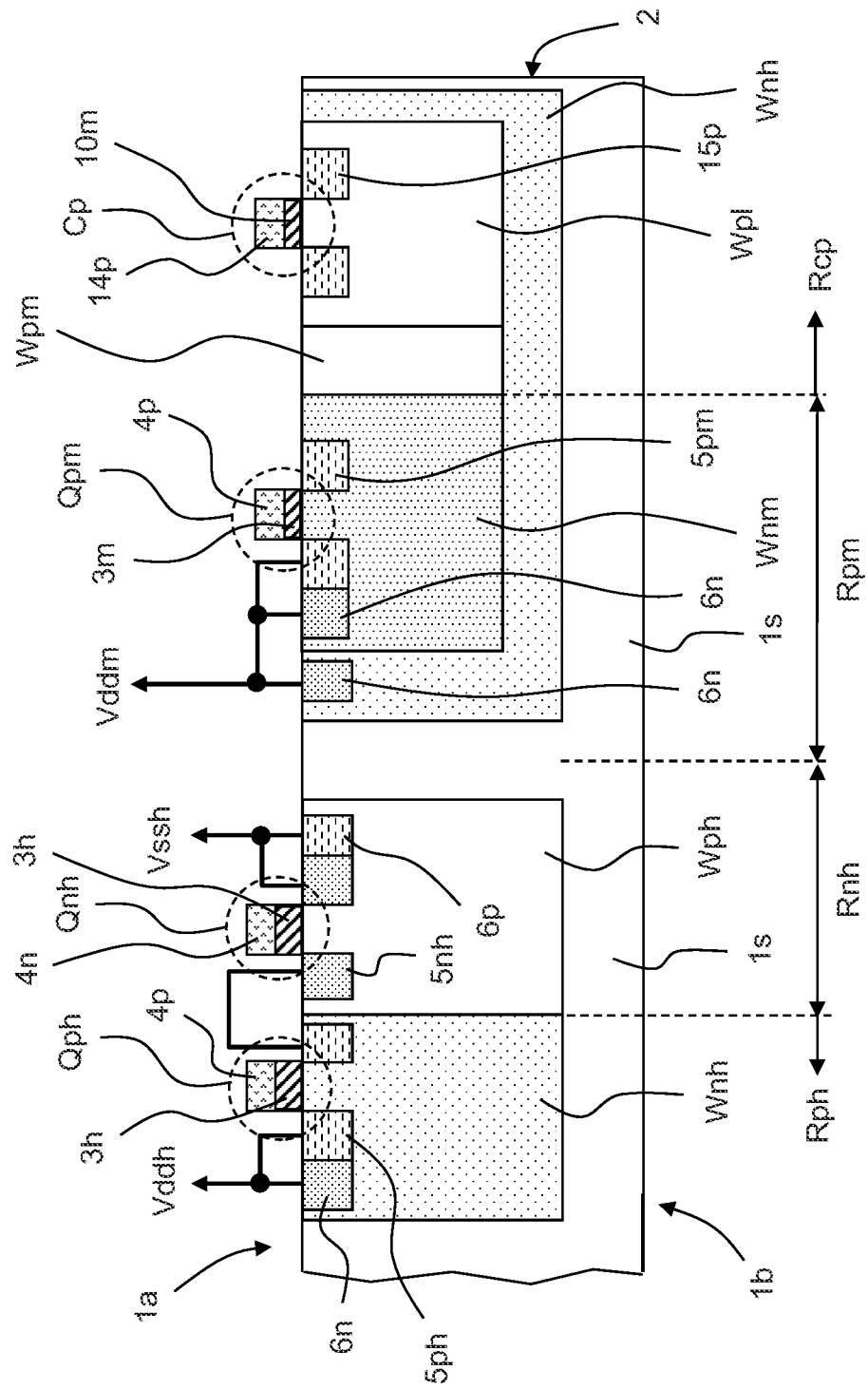
FIG. 29 is a schematic device cross-sectional view (medium withstanding voltage MISFET and medium withstanding voltage capacitor element) corresponding to FIG. 3 (FIG. 28) for explaining a modification 2 in which the securing of the withstanding voltage in a boundary of the medium withstanding voltage region is taken into consideration.
Figure 30:
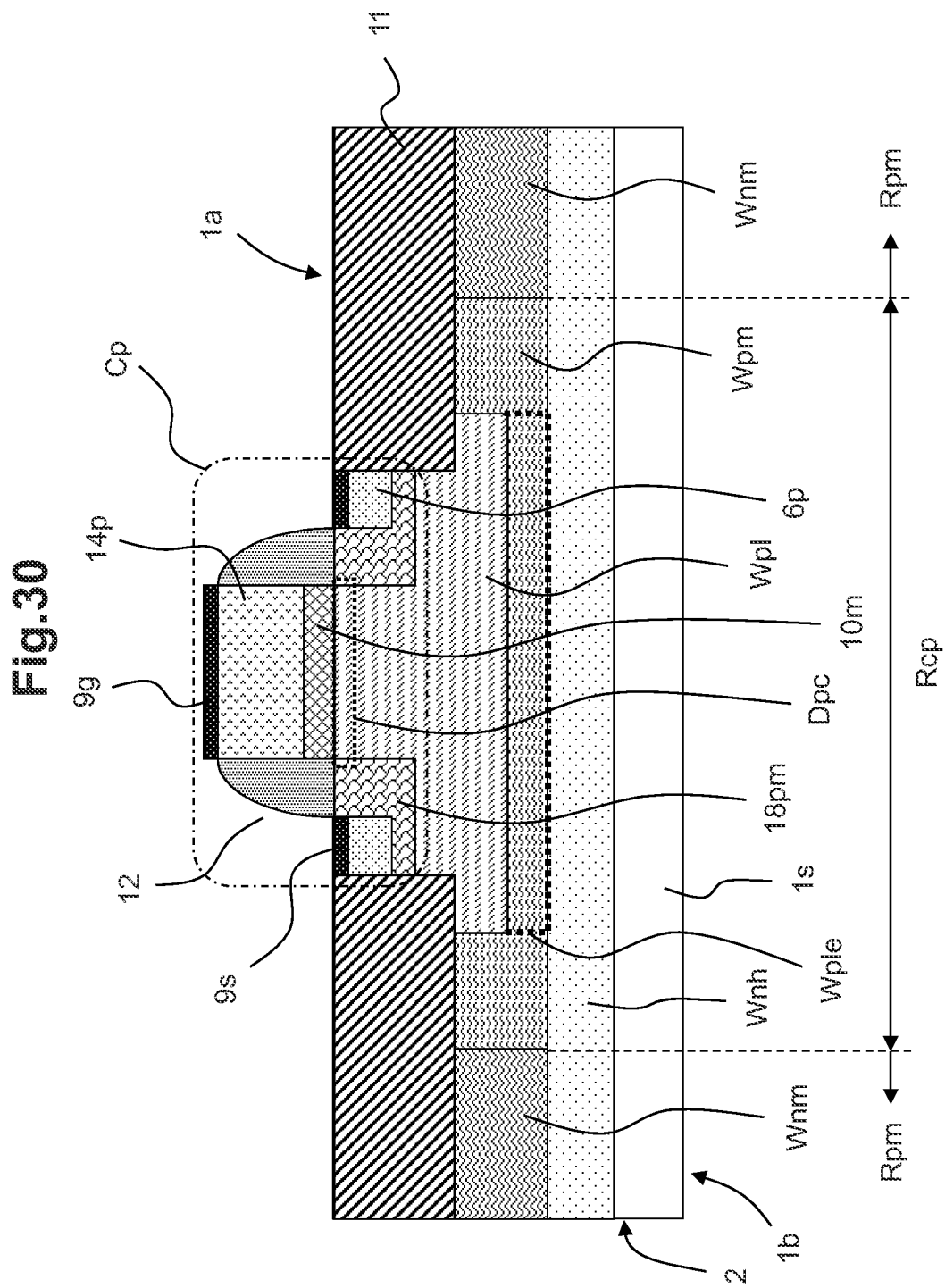
FIG. 30 is a more specific device cross-sectional view of a P-type medium withstanding voltage MIS capacitor and the periphery shown in FIG. 29.

FIG. 28 is a schematic device cross-sectional view (medium withstanding voltage MISFET and medium withstanding voltage capacitor element) corresponding to FIG. 3 for explaining modification 1 in which a medium withstanding voltage capacitor and a medium withstanding voltage MISFET are provided in the same N-type high withstanding voltage well region. FIG. 29 is a schematic device cross-sectional view (medium withstanding voltage MISFET and medium withstanding voltage capacitor element) corresponding to FIG. 3 (FIG. 28) for explaining modification 2 in which the securing of the withstanding voltage in a boundary of the medium withstanding voltage region is taken into consideration. FIG. 30 is a more specific device cross-sectional view of a P-type medium withstanding voltage MIS capacitor and the periphery shown in FIG. 29. With reference to these diagrams, modifications and the like of the main portion device structure in the semiconductor integrated circuit device according to the embodiment of this application will be described.

(1) Modification 1 in which a medium withstanding voltage capacitor and a medium withstanding voltage MISFET are provided in the same N-type high withstanding voltage well region (mainly FIG. 28)

The example shown in FIG. 28 is basically the same as the example shown in FIG. 3, but the difference is that the P-type medium withstanding voltage MIS capacitor Cp is formed in the N-type high withstanding voltage well region Wnh of the medium withstanding voltage region (P-channel type medium withstanding voltage MISFET forming region Rpm). That is, in this example, both the P-type low withstanding voltage well region Wpl for forming the P-type medium withstanding voltage MIS capacitor Cp and the N-type medium withstanding voltage well region Wnm for forming the P-channel type medium withstanding voltage MISFET (Qpm) are included in a planar manner in the N-type high withstanding voltage well region Wnh so as to be in contact with each other. In this manner, since the medium withstanding voltage capacitor element is normally used in the medium withstanding voltage circuit (for example, refer to sub-section (5-2-6) of section 4), the area efficiency of the medium withstanding voltage is improved. On the other hand, the concentration of the P-type low withstanding voltage well region Wpl is relatively high. Therefore, compared with a case where the P-type low withstanding voltage well region Wpl is formed as the P-type medium withstanding voltage well region Wpm, the withstanding voltage may be slightly reduced between the P-type low withstanding voltage well region Wpl and the N-type medium withstanding voltage well region Wnm depending on the situation. In such cases, measures and the like described in the following sub-section and the like are effective.

In FIG. 28, for the sake of illustration, the N-channel type medium withstanding voltage MISFET forming region Rnm in the N-type high withstanding voltage well region Wnh, which is shown in FIG. 3, is omitted. However, the N-channel type medium withstanding voltage MISFET forming region Rnm may be formed as in FIG. 3 so as to be electrically separated from the P-type medium withstanding voltage MIS capacitor forming region Rcp.

(2) Modification 2 in which the securing of the withstanding voltage in a boundary of the medium withstanding voltage region is taken into consideration (mainly FIGS. 29 and 30)

The example shown in FIG. 29 is basically the same as the example shown in FIG. 28 (FIG. 3), but the difference is that the P-type medium withstanding voltage well region Wpm having a lower concentration than the P-type low withstanding voltage well region Wpl is inserted between the P-type low withstanding voltage well region Wpl and the N-type medium withstanding voltage well region Wnm so that the P-type low withstanding voltage well region Wpl and the N-type medium withstanding voltage well region Wnm are not in contact with each other. In this manner, it is possible to secure the same withstanding voltage as when the P-type low withstanding voltage well region Wpl is formed as the P-type medium withstanding voltage well region Wpm. However, compared with the case shown in FIG. 28, the area efficiency is slightly reduced.

Next, FIG. 30 illustrates an example of the device cross-sectional structure in which the P-type medium withstanding voltage MIS capacitor Cp and the periphery in FIG. 29 are more specifically shown. The device cross-sectional structure shown in FIG. 30 is basically the same as that shown in FIG. 10. However, as described with reference to FIG. 29, the difference is that the P-type medium withstanding voltage well region Wpm having a lower concentration than the P-type low withstanding voltage well region Wpl is inserted between the P-type low withstanding voltage well region Wpl and the N-type medium withstanding voltage well region Wnm outside the P-type medium withstanding voltage MIS capacitor forming region Rcp. In this example, as shown in FIG. 30, the P-type medium withstanding voltage well region Wpm having a lower concentration than the P-type low withstanding voltage well region Wpl is provided between the P-type low withstanding voltage well region Wpl and the N-type medium withstanding voltage well region Wnm outside the P-type medium withstanding voltage MIS capacitor forming region Rcp so that the P-type low withstanding voltage well region Wpl is included in a planar manner. In this case, the depth of the P-type low withstanding voltage well region Wpl may be smaller than the depth of the P-type medium withstanding voltage well region Wpm. However, the depth of the P-type low withstanding voltage well region Wpl may be almost the same as the depth of the P-type medium withstanding voltage well region Wpm as a P-type low withstanding voltage well region Wple shown by the dotted line.

In the example shown in FIG. 30, electrode extraction on the substrate side of the P-type medium withstanding voltage MIS capacitor Cp is performed only from the P$^+$-type contact region 6p around the gate electrode although optional, so that the area occupied by the capacitor can be reduced. This is not limited to this example, and can also be applied to the examples shown in FIGS. 8 to 10 as it is.

4. Supplementary explanation and general consideration regarding the embodiments (including the modifications) (mainly FIGS. 31 and 32)

Figure 31:
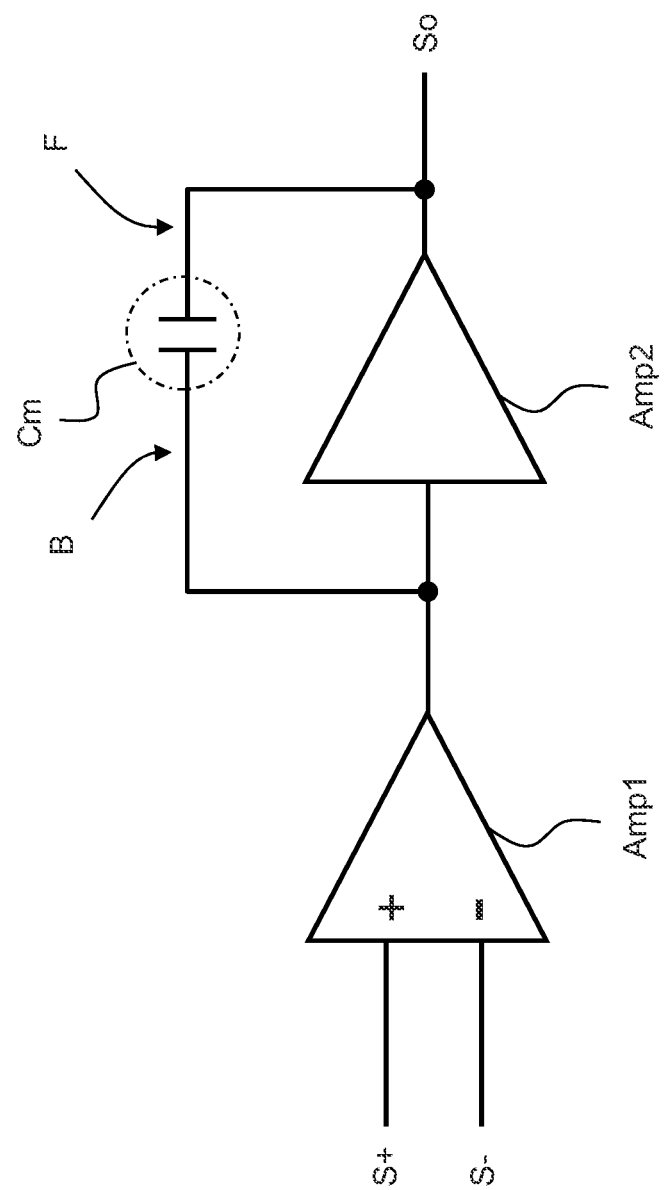
FIG. 31 is a circuit diagram showing an example of a specific application circuit of the capacitor element of the embodiment for supplementary explanation.

FIG. 31 is a circuit diagram showing an example of a specific application circuit of the capacitor element of the embodiments for supplementary explanation of the technical problem related to the above embodiment (including the modifications) (this is an example of the specific application circuit of the embodiments, and is a part of the embodiments). FIG. 32 is a schematic device cross-sectional view for explaining the outline of the semiconductor integrated circuit device according to the embodiment. With reference to FIGS. 31 and 32, supplementary explanation and general consideration regarding the embodiments (including the modifications) will be performed.

(1) Supplementary explanation and general consideration of the technical issues related to the above embodiments (including the modifications) (mainly FIG. 31)

As described previously, in IC chips for display device driving, such as an LCD driver IC chip, an operational amplifier (OP amp) circuit is widely used in input and output circuits, and a capacitor (capacitor with a fixed capacitance) in a medium withstanding voltage chip is used as a compensation capacitor.

FIG. 31 shows an example of a two-stage amplifier OP-amp circuit. As shown in FIG. 31, for example, differential input signals S+ and S− (input signal may be a single end signal) are input to a first amplification stage amplifier Amp1, and the output is amplified again by a second amplification stage amplifier Amp2. Then, the resulting signal from the second amplification stage amplifier Amp2 is output as an output signal So. In general, however, in order to ensure amplification characteristic improvement, operation stability, and the like, a part of the output signal So is fed back to the input side of the second amplification stage amplifier Amp2 through a negative feedback path. In this case, a capacitor element Cm is inserted between an output side node F and an input side node B of the negative feedback path.

As for this product area, cost competitiveness is very important. Therefore, it is effective to use the MIS capacitor with good area efficiency (for example, the N-type medium withstanding voltage MIS capacitor Cn or the P-type medium withstanding voltage MIS capacitor Cp described above), which has been described so far, as the capacitor element Cm, for example.

On the other hand, unlike a so-called varactor that is widely used in the VCO circuit and the like, a characteristic of as small a voltage dependence of the capacitor as possible is used. For this reason, various additional processes may be added to reduce the voltage dependence of the capacitor. For example, in the case of the N-type medium withstanding voltage MIS capacitor, N-type impurities are injected onto the surface of the N-type medium withstanding voltage well region through a unique process (for example, an N-type capacitor injection step).

However, it is not possible to avoid an abrupt increase in process cost with these measures (additional processes and the like are not eliminated).

In particular, when a display device driver chip, such as a liquid crystal driver chip, is taken into consideration, the system includes multiple power supplies, and accordingly, the process becomes inevitably repetitive. Therefore, adding additional processes for each of various devices may cause an abrupt increase in the number of steps.

(2) Explanation of the outline of the semiconductor integrated circuit device according to the embodiments (mainly FIG. 32)

Therefore, as shown in FIG. 32, in the semiconductor integrated circuit device according to the embodiments, the first N-type low withstanding voltage well region Wnl and the second N-type low withstanding voltage well region Wnl, which is formed simultaneously with the first N-type low withstanding voltage well region Wnl, are provided on the first main surface 1a of the semiconductor substrate 1s. Then, the P-channel type low withstanding voltage MISFET (Qpl) is provided in the surface region of the first N-type low withstanding voltage well region Wnl, and the N-type medium withstanding voltage MIS capacitor Cn is provided in the surface region of the second N-type low withstanding voltage well region Wnl.

In this manner, it is possible to use a MIS type capacitor element in a chip having good area efficiency and less voltage dependence without adding additional processes.

(3) Supplementary explanation regarding other applications

As specific forms of the capacitor element according to the embodiment (including the modifications) used in a circuit, not only the compensation capacitor but also a coupling capacitor having both terminals that are not fixed can be considered.

In addition, a bypass capacitor can be considered as an example of a capacitor in which one terminal is connected to the fixed potential.

(4) Supplementary explanation regarding the combination of the capacitor electrode of the capacitor element according to the embodiments (including the modifications) (refer mainly to FIGS. 5 and 8 and FIGS. 4 and 10)

As described with reference to FIGS. 5 and 8, in the N-type medium withstanding voltage MIS capacitor Cn, the capacitor N-type doped region Dnc is introduced into a so-called channel region (substrate capacitor electrode). This is because the P-channel type low withstanding voltage MISFET (Qpl) having a P-type gate electrode becomes a surface channel type MISFET, and accordingly, it is desirable to inject N-type impurities for threshold voltage adjustment into the channel region (substrate capacitor electrode), that is, the surface of the N-type low withstanding voltage well region Wnl in order to control the threshold voltage.

On the other hand, as described with reference to FIGS. 4 and 10, in the P-type medium withstanding voltage MIS capacitor Cp, the capacitor P-type doped region Dpc is introduced into a so-called channel region (substrate capacitor electrode). This is because the N-channel type low withstanding voltage MISFET (Qnl) having an N-type gate electrode becomes a surface channel type MISFET, and accordingly, it is desirable to inject P-type impurities for threshold voltage adjustment into the channel region (substrate capacitor electrode), that is, the surface of the P-type low withstanding voltage well region Wpl in order to control the threshold voltage.

(5) Supplementary explanation regarding various capacitor elements according to the embodiments (including the modifications) (refer mainly to FIGS. 8, 10, and 28 and the like together with FIGS. 29 to 31)

The various capacitor elements described above, that is, the N-type medium withstanding voltage MIS capacitor Cn and the P-type medium withstanding voltage MIS capacitor Cp can be used alone or in combination.

With reference to FIGS. 29 to 31, main features (including additional features) of the N-type medium withstanding voltage MIS capacitor Cn shown in FIG. 8 are listed as follows. Each of the main features and each of the additional features can be used alone or in combination (including cross combination). This is the same hereinbelow. That is, the main features (including the advantages and the like) of the N-type medium withstanding voltage MIS capacitor Cn shown in FIG. 8 are as follows.

(5-1-1) The substrate capacitor electrode is an N type, and the operation in the accumulation mode is possible assuming that the capacitor gate electrode side is a high potential side. Therefore, not only can the voltage dependence of the capacitor be reduced, but also applications to the case where the sign of the voltage between both terminals of the capacitor is changed can be made.

(5-1-2) Since the substrate capacitor electrode is an N-type low withstanding voltage well region having a relatively high concentration (well region corresponding to the P-channel type low withstanding voltage MISFET of the core region), operation in the stable accumulation mode is possible.

(5-1-3) Since the capacitor gate electrode is an N-type polysilicon film (including an electrode having an N-type polysilicon film), that is, an N-type capacitor gate electrode, it is possible to reduce the voltage dependence of the capacitor. When a both-N-type MIS capacitor (the same conduction type MIS capacitor) is used, the advantages of (5-1-1) and (5-1-2) can be obtained simultaneously.

(5-1-4) Since the capacitor N-type doped region Dnc introduced simultaneously with the N-type doped region for threshold voltage adjustment Dnq is provided in a so-called channel region (N-type semiconductor region immediately below the medium withstanding voltage capacitor insulating film), it is possible to reduce the voltage dependence of the capacitor without requiring additional processes. This is because the highest concentration is obtained in N-type channel implantation that can be used.

(5-1-5) Additionally, as shown in FIG. 30, since electrode extraction from the substrate capacitor electrode is performed only from the contact region around the gate electrode, it is possible to reduce the area occupied by the N-type MIS capacitor.

Similarly, with reference to FIGS. 29 to 31, main features (including additional features) of the P-type medium withstanding voltage MIS capacitor Cp shown in FIG. 10 are listed as follows. Each of the main features and each of the additional features can be used alone or in combination (including cross combination). This is the same hereinbelow. That is, the main features (including the advantages and the like) of the P-type medium withstanding voltage MIS capacitor Cp shown in FIG. 10 are as follows.

(5-2-1) The substrate capacitor electrode is a P type, and the operation in the accumulation mode is possible assuming that the capacitor gate electrode side is a low potential side. Therefore, not only can the voltage dependence of the capacitor be reduced, but also applications to the case where the sign of the voltage between both terminals of the capacitor is changed can be made.

(5-2-2) Since the substrate capacitor electrode is a P-type low withstanding voltage well region having a relatively high concentration (well region corresponding to the N-channel type low withstanding voltage MISFET of the core region), operation in the stable accumulation mode is possible.

(5-2-3) Since the capacitor gate electrode is a P-type polysilicon film (including an electrode having a P-type polysilicon film), that is, a P-type capacitor gate electrode, it is possible to reduce the voltage dependence of the capacitor. When a both-P-type MIS capacitor (the same conduction type MIS capacitor) is used, the advantages of (5-2-1) and (5-2-2) can be obtained simultaneously.

(5-2-4) Since the capacitor P-type doped region Dpc introduced simultaneously with the P-type doped region for threshold voltage adjustment Dpq is provided in a so-called channel region (P-type semiconductor region immediately below the medium withstanding voltage capacitor insulating film), it is possible to reduce the voltage dependence of the capacitor without requiring additional processes. This is because the highest concentration is obtained in P-type channel implantation that can be used.

(5-2-5) Additionally, as shown in FIG. 30, since electrode extraction from the substrate capacitor electrode is performed only from the contact region around the gate electrode, it is possible to reduce the area occupied by the P-type MIS capacitor.

(5-2-6) Other advantages can be obtained by providing the P-type medium withstanding voltage MIS capacitor Cp in the N-type high withstanding voltage well region, in which a medium withstanding voltage MISFET is housed, as shown in FIG. 28. For example, as shown in FIG. 31, when the medium withstanding voltage MISFET forms the second amplification stage amplifier Amp2 (or the first amplification stage amplifier Amp1) and the P-type medium withstanding voltage MIS capacitor Cp forms a phase compensation capacitor Cm, it is possible to reduce the layout area.

5. Summary

While the invention has been specifically described based on the embodiments, the invention is not limited thereto and various changes can be made within the range not departing from the subject matter.

For example, in the above embodiments, the multi-layer wiring layer has been specifically described using the aluminum based non-embedded wiring as an example. However, for example, a copper based embedded wiring or other material based embedded wirings can also be undoubtedly used.

In the above embodiment, the LCD driver has been specifically described as a typical example. However, the invention is not limited to this, and the LCD driver, other device drivers, a CPU, a GPU, an MCU, other logic circuits, an analog circuit, and the like may be mounted.

In the above embodiments, the liquid crystal display device has been specifically described as a display device. However, the invention is not limited to this, and an organic ELD and other display devices may be used.

In the above embodiments, the explanation has been given on the assumption that the liquid crystal display is of an amorphous silicon (a-Si) type. However, it is possible to use a low-temperature poly-silicon (LIPS) type liquid crystal display device.

What is claimed is:

1. A semiconductor integrated circuit device, comprising:
(a) a semiconductor substrate having a first main surface;
(b) a first N-type low withstanding voltage well region formed on the first main surface of the semiconductor substrate;
(c) a P-channel type low withstanding voltage MISFET formed in a surface region of the first N-type low withstanding voltage well region;
(d) a second N-type low withstanding voltage well region formed on the first main surface of the semiconductor substrate simultaneously with the first N-type low withstanding voltage well region;
(e) an N-type medium withstanding voltage MIS capacitor that is provided in a surface region of the second N-type low withstanding voltage well region, has a higher withstanding voltage than the P-channel type low withstanding voltage MISFET, and has the second N-type low withstanding voltage well region as one capacitor electrode;
(f) a first N-type medium withstanding voltage well region formed on the first main surface of the semiconductor substrate; and,
(g) a P-channel type medium withstanding voltage MISFET formed in a surface region of the first N-type medium withstanding voltage well region,
wherein a medium withstanding voltage capacitor insulating film of the N-type medium withstanding voltage MIS capacitor has an equal thickness with a medium withstanding voltage gate insulating film of the P-channel type medium withstanding voltage MISFET, and is thicker than a low withstanding voltage gate insulating film of the P-channel type low withstanding voltage MISFET.

2. The semiconductor integrated circuit device according to claim 1,
wherein the other capacitor electrode of the N-type medium withstanding voltage MIS capacitor is an N-type polysilicon electrode.

3. The semiconductor integrated circuit device according to claim 2,
wherein the semiconductor substrate is a P-type silicon single-crystal substrate.

4. The semiconductor integrated circuit device according to claim 3, further comprising:
(h) a first P-type low withstanding voltage well region formed on the first main surface of the semiconductor substrate;
(i) an N-channel type low withstanding voltage MISFET formed in a surface region of the first P-type low withstanding voltage well region;
(j) a second P-type low withstanding voltage well region formed on the first main surface of the semiconductor substrate simultaneously with the first P-type low withstanding voltage well region; and (k) a P-type medium withstanding voltage MIS capacitor that is provided in a surface region of the second P-type low withstanding voltage well region, has a higher withstanding voltage than the N-channel type low withstanding voltage MISFET, and has the second P-type low withstanding voltage well region as one capacitor electrode.

5. The semiconductor integrated circuit device according to claim 4,
wherein the semiconductor integrated circuit device is for display device driving.

6. The semiconductor integrated circuit device according to claim 4,
wherein the semiconductor integrated circuit device is for liquid crystal display device driving.

7. The semiconductor integrated circuit device according to claim 6, further comprising:
(l) a first N-type high withstanding voltage well region that is formed on the first main surface of the semiconductor substrate so as to include the first P-type low withstanding voltage well region in a planer manner and is deeper than the first P-type low withstanding voltage well region; and
(m) a second N-type high withstanding voltage well region that is formed on the first main surface of the semiconductor substrate so as to include the second P-type low withstanding voltage well region in a planer manner, is deeper than the second P-type low withstanding voltage well region, and is formed simultaneously with the first N-type high withstanding voltage well region.

8. The semiconductor integrated circuit device according to claim 3, further comprising:
(n) an N-type doped region for threshold voltage adjustment formed in a channel region of the first N-type low withstanding voltage well region; and
(o) a capacitor N-type doped region that is formed in a region near a surface of the second N-type low withstanding voltage well region, which is located opposite the other capacitor electrode, simultaneously with the N-type doped region for threshold voltage adjustment.

9. The semiconductor integrated circuit device according to claim 3, further comprising:
(p) a third N-type high withstanding voltage well region that is formed on the first main surface of the semiconductor substrate simultaneously with the first N-type high withstanding voltage well region so as to be deeper than the second P-type low withstanding voltage well region;
(q) the second P-type low withstanding voltage well region formed on the first main surface of the semiconductor substrate so as to be included in the third N-type high withstanding voltage well region in a planar manner; and
(r) a P-type medium withstanding voltage MIS capacitor that is provided in a surface region of the second P-type low withstanding voltage well region, has a higher withstanding voltage than the P-channel type low withstanding voltage MISFET, and has the second P-type low withstanding voltage well region as one capacitor electrode,
wherein the first N-type medium withstanding voltage well region is formed on the first main surface of the semiconductor substrate so as to be included in the third N-type high withstanding voltage well region in a planar manner.

10. The semiconductor integrated circuit device according to claim 9, further comprising:
(s) a first P-type medium withstanding voltage well region that is provided on the first main surface of the semiconductor substrate and is provided between the first N-type medium withstanding voltage well region and the second P-type low withstanding voltage well region so as to be in contact with the first N-type medium withstanding voltage well region and the second P-type low withstanding voltage well region.

11. A semiconductor integrated circuit device, comprising:
(a) a semiconductor substrate having a first main surface;
(b) a first P-type low withstanding voltage well region formed on the first main surface of the semiconductor substrate;
(c) an N-channel type low withstanding voltage MISFET formed in a surface region of the first P-type low withstanding voltage well region;
(d) a second P-type low withstanding voltage well region formed on the first main surface of the semiconductor substrate simultaneously with the first P-type low withstanding voltage well region;
(e) a P-type medium withstanding voltage MIS capacitor that is provided in a surface region of the second P-type low withstanding voltage well region, has a higher withstanding voltage than the N-channel type low withstanding voltage MISFET, and has the second P-type low withstanding voltage well region as one capacitor electrode,
(f) a first P-type medium withstanding voltage well region formed on the first main surface of the semiconductor substrate; and,
(g) a N-channel type medium withstanding voltage MISFET formed in a surface region of the first P-type medium withstanding voltage well region,
wherein a medium withstanding voltage capacitor insulating film of the P-type medium withstanding voltage MIS capacitor has an equal thickness with a medium withstanding voltage gate insulating film of the N-channel type medium withstanding voltage MISFET, and is thicker than a low withstanding voltage gate insulating film of the N-channel type low withstanding voltage MISFET.

12. The semiconductor integrated circuit device according to claim 11,
wherein the other capacitor electrode of the P-type medium withstanding voltage MIS capacitor is a P-type polysilicon electrode.

13. The semiconductor integrated circuit device according to claim 12,
wherein the semiconductor substrate is a P-type silicon single-crystal substrate.

14. The semiconductor integrated circuit device according to claim 13, further comprising:
(h) a first N-type low withstanding voltage well region formed on the first main surface of the semiconductor substrate;
(i) a P-channel type low withstanding voltage MISFET formed in a surface region of the first N-type low withstanding voltage well region;
(j) a second N-type low withstanding voltage well region formed on the first main surface of the semiconductor substrate simultaneously with the first N-type low withstanding voltage well region; and
(k) an N-type medium withstanding voltage MIS capacitor that is provided in a surface region of the second N-type low withstanding voltage well region, has a higher withstanding voltage than the P-channel type low withstanding voltage MISFET, and has the second N-type low withstanding voltage well region as one capacitor electrode.

15. The semiconductor integrated circuit device according to claim 14,
    wherein the semiconductor integrated circuit device is for display device driving.

16. The semiconductor integrated circuit device according to claim 14,
    wherein the semiconductor integrated circuit device is for liquid crystal display device driving.

17. The semiconductor integrated circuit device according to claim 16, further comprising:
    (l) a first N-type high withstanding voltage well region that is formed on the first main surface of the semiconductor substrate so as to include the first P-type low withstanding voltage well region in a planer manner and is deeper than the first P-type low withstanding voltage well region; and
    (m) a second N-type high withstanding voltage well region that is formed on the first main surface of the semiconductor substrate so as to include the second P-type low withstanding voltage well region in a planer manner, is deeper than the second P-type low withstanding voltage well region, and is formed simultaneously with the first N-type high withstanding voltage well region.

18. The semiconductor integrated circuit device according to claim 13, further comprising:
    (n) a P-type doped region for threshold voltage adjustment formed in a channel region of the first P-type low withstanding voltage well region; and
    (o) a capacitor P-type doped region that is formed in a region near a surface of the second P-type low withstanding voltage well region, which is located opposite the other capacitor electrode, simultaneously with the P-type doped region for threshold voltage adjustment.

19. The semiconductor integrated circuit device according to claim 13, further comprising:
    (p) a third N-type high withstanding voltage well region that is formed on the first main surface of the semiconductor substrate simultaneously with the first N-type high withstanding voltage well region so as to be deeper than the second P-type low withstanding voltage well region;
    (q) the second P-type low withstanding voltage well region formed on the first main surface of the semiconductor substrate so as to be included in the third N-type high withstanding voltage well region in a planar manner; and
    (r) a P-type medium withstanding voltage MIS capacitor that is provided in a surface region of the second P-type low withstanding voltage well region, has a higher withstanding voltage than the P-channel type low withstanding voltage MISFET, and has the second P-type low withstanding voltage well region as one capacitor electrode,
    wherein the first P-type medium withstanding voltage well region is formed on the first main surface of the semiconductor substrate so as to be included in the third P-type high withstanding voltage well region in a planar manner.

20. The semiconductor integrated circuit device according to claim 19, further comprising:
    (s) a first P-type medium withstanding voltage well region that is provided on the first main surface of the semiconductor substrate and is provided between the first N-type medium withstanding voltage well region and the second P-type low withstanding voltage well region so as to be in contact with the first N-type medium withstanding voltage well region and the second P-type low withstanding voltage well region.

* * * * *